(12) United States Patent
Taguchi et al.

(10) Patent No.: US 6,707,325 B2
(45) Date of Patent: Mar. 16, 2004

(54) SEMICONDUCTOR INTEGRATED CIRCUIT WITH INPUT/OUTPUT INTERFACE ADAPTED FOR SMALL-AMPLITUDE OPERATION

(75) Inventors: Masao Taguchi, Kawasaki (JP); Satoshi Eto, Kawasaki (JP); Yoshihiro Takemae, Kawasaki (JP); Hiroshi Yoshioka, Kawasaki (JP); Makoto Koga, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/278,080

(22) Filed: Oct. 23, 2002

(65) Prior Publication Data

US 2003/0071663 A1 Apr. 17, 2003

Related U.S. Application Data

(62) Division of application No. 09/474,702, filed on Dec. 29, 1999, now Pat. No. 6,492,846, which is a division of application No. 08/718,045, filed on Sep. 13, 1996, now Pat. No. 6,034,555, which is a division of application No. 08/076,434, filed on Jun. 14, 1993, now Pat. No. 5,557,221.

(30) Foreign Application Priority Data

| Jun. 15, 1992 | (JP) | ............................................. | 4-154986 |
| Jun. 15, 1992 | (JP) | ............................................. | 4-154990 |
| Jul. 6, 1992 | (JP) | ............................................. | 4-178436 |
| Aug. 6, 1992 | (JP) | ............................................. | 4-210383 |
| Aug. 7, 1992 | (JP) | ............................................. | 4-211409 |
| Jan. 20, 1993 | (JP) | ............................................. | 5-007083 |
| May 14, 1993 | (JP) | ............................................. | 5-112793 |

(51) Int. Cl.$^7$ ............................................. H03K 3/00

(52) U.S. Cl. ............................... 327/112; 326/27; 326/87

(58) Field of Search ............................... 326/27, 30, 83, 326/86, 87; 327/107, 112, 384, 387, 388

(56) References Cited

U.S. PATENT DOCUMENTS

| 4,103,190 A | | 7/1978 | Beutler | 327/81 |
|---|---|---|---|---|
| 4,339,673 A | | 7/1982 | Perry | 326/16 |
| 4,571,547 A | | 2/1986 | Day | 327/69 |
| 4,985,646 A | | 1/1991 | Kunagai et al. | 326/27 |
| 5,019,728 A | | 5/1991 | Sanwo et al. | 326/86 |
| 5,097,152 A | * | 3/1992 | Kohda et al. | 326/80 |
| 5,111,080 A | | 5/1992 | Mizukami et al. | 326/30 |
| 5,336,947 A | | 8/1994 | Lehning | 327/18 |
| 5,378,936 A | | 1/1995 | Kokubo et al. | 327/77 |
| 5,418,536 A | | 5/1995 | Lisle et al. | 342/194 |
| 5,483,189 A | | 1/1996 | Cordini et al. | 327/333 |
| 5,528,172 A | | 6/1996 | Sundstrom | 326/80 |

FOREIGN PATENT DOCUMENTS

| EP | 0 105 685 | 4/1984 |
| EP | 0 366 991 | 9/1990 |
| EP | 0 482 336 | 4/1992 |

(List continued on next page.)

OTHER PUBLICATIONS

Patent Abstracts of Japan, vol. 011, No. 130; JP 61–274511.
Patent Abstracts of Japan, vol. 012, No. 357: JP 63–114319.
Patent Abstracts of Japan, vol. 013, No. 483; JP 01–191517.

(List continued on next page.)

*Primary Examiner*—Tuan T. Lam
(74) *Attorney, Agent, or Firm*—Arent Fox Kintner Plotkin & Kahn, PLLC

(57) ABSTRACT

A semiconductor integrated circuit includes a switch unit for controlling the supply of a power source voltage to a signal amplification circuit for receiving an input signal, and a control unit for selectively turning ON and OFF the switch unit in accordance with the amplitude or frequency of the input signal. By the constitution, it is possible to provide an input circuit or an output circuit capable of being applied to an input/output interface adapted for a small amplitude operation.

4 Claims, 74 Drawing Sheets

FOREIGN PATENT DOCUMENTS

| | | |
|---|---|---|
| JP | 56-142119 | 10/1981 |
| JP | 360075119 | 4/1985 |
| JP | 61-19227 | 1/1986 |
| JP | 61-112424 | 5/1986 |
| JP | 61-121033 | 7/1986 |
| JP | 62-178015 | 8/1987 |
| JP | 62-208715 | 9/1987 |
| JP | 63-018719 | 1/1988 |
| JP | 63-114319 | 5/1988 |
| JP | 01-160213 | 6/1989 |
| JP | 1-191517 | 8/1989 |
| JP | 2-147933 | 12/1990 |
| JP | 37424 | 1/1991 |
| JP | 4-3618 | 1/1992 |
| JP | 418810 | 1/1992 |
| JP | 04-049714 | 2/1992 |
| JP | 4156715 | 5/1992 |
| JP | 4-258020 | 9/1992 |

OTHER PUBLICATIONS

Patent Abstracts of Japan, 015, No. 479; JP 03–206711.
Patent Abstracts of Japan, vol. 010, No. 297; JP 61–11242.
Patent Abstracts of Japan, vol. 016, No. 447; JP 04–156715.
4–156715, Issued May 29, 1992, Abstract.
3–7424, Issued Jan. 1, 1991, Abstract.

* cited by examiner

Fig. 1
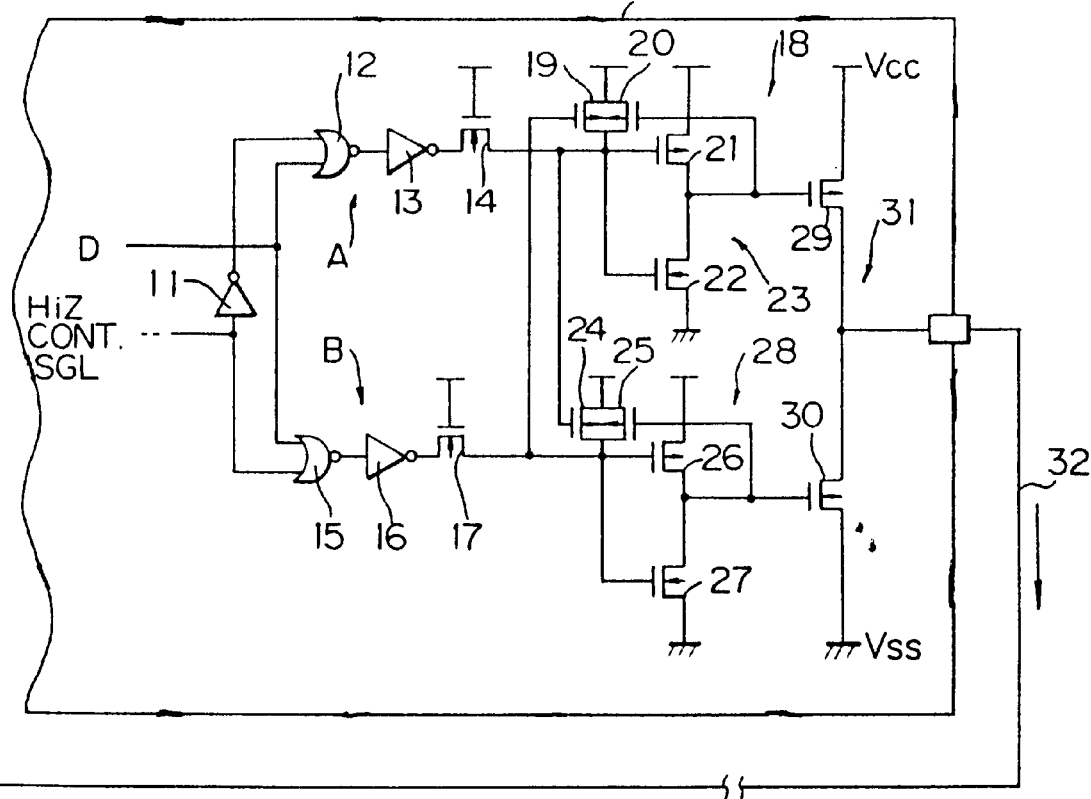
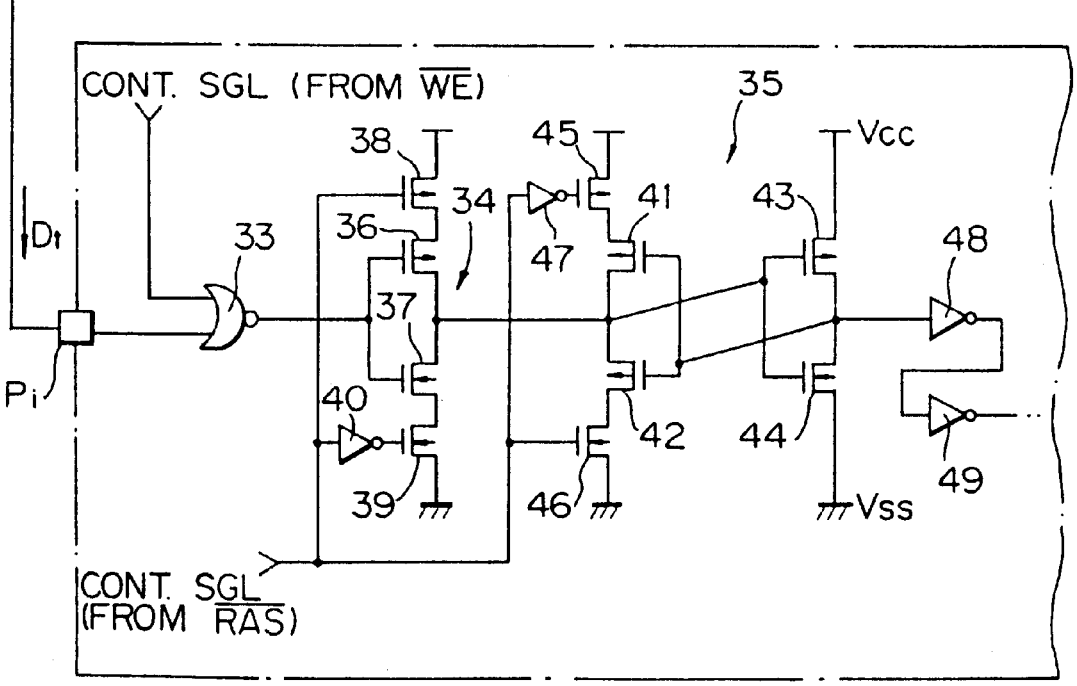

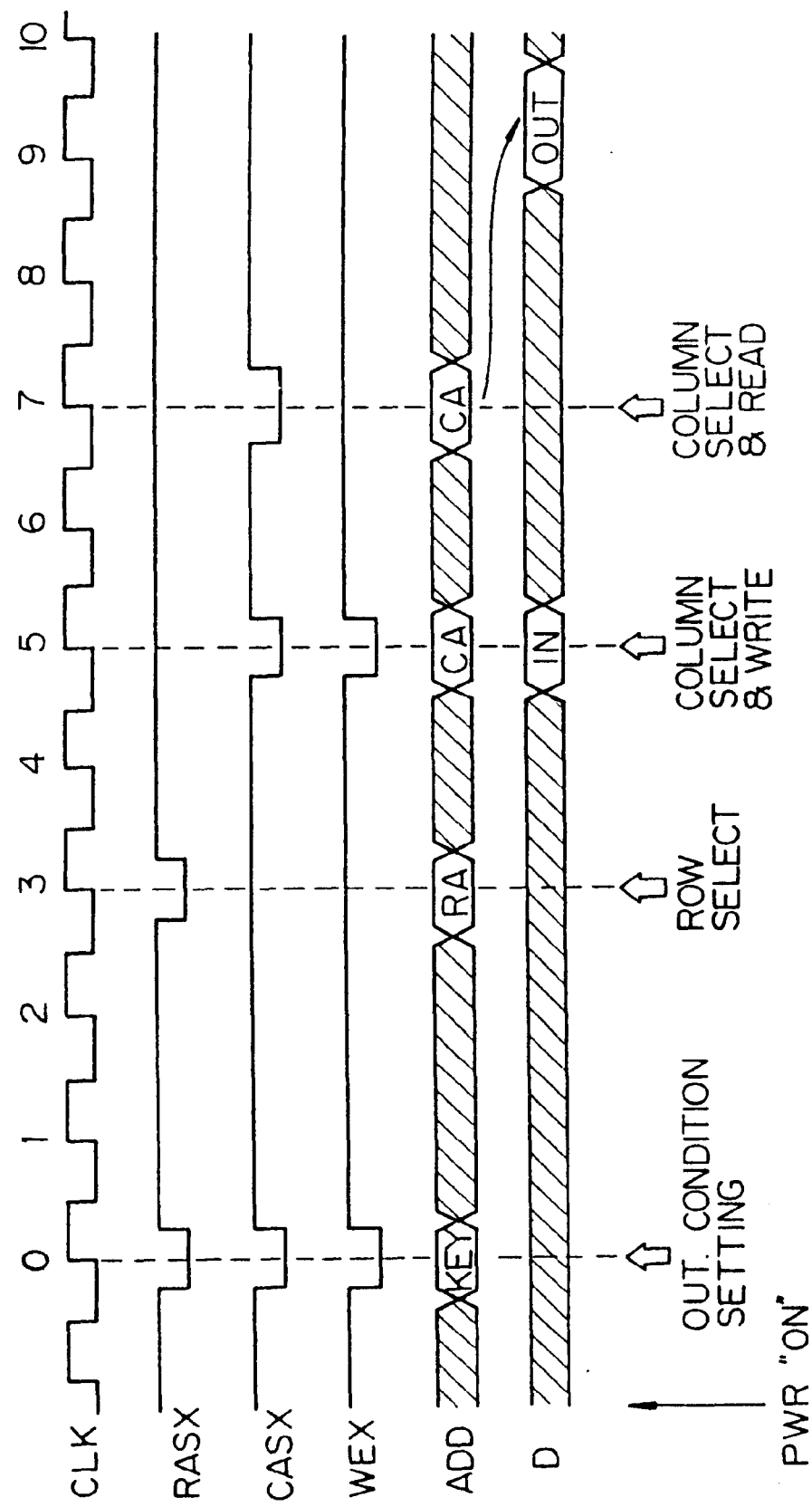

SEMICONDUCTOR INTEGRATED CIRCUIT WITH INPUT/OUTPUT INTERFACE ADAPTED FOR SMALL-AMPLITUDE OPERATION

This is a Division of application Ser. No. 09/474,702 filed Dec. 29, 1999, now U.S. Pat. No. 6,492,846, which in turn is a Divisional of application Ser. No. 08/718,045) filed Sep. 13, 1996, now U.S. Pat. No. 6,034,555 which in turn is a Divisional of parent application Ser. No. 08/076,434 filed Jun. 14, 1993 now U.S. Pat. No. 5,557,221. The disclosure of the prior applications is hereby incorporated by reference herein in its entirety.

BACKGROUND OF THE INVENTION

1. Field of the Invention

The present invention relates to a semiconductor integrated circuit (LSI). More particularly, the invention relates to a semiconductor integrated circuit equipped with an input circuit or an output circuit adapted to an interchip input/output interface on a board mounting a plurality of LSI chips, and particularly equipped with an input circuit that can be adapted to both the data that operate with high-frequency clocks (e.g., 50 MHz or higher) (hereinafter referred to as high-speed data) and the data that operate with low-frequency clocks (e.g., 50 MHz or lower)(hereinafter referred to as low-speed data) or equipped with an output circuit that outputs very small-amplitude signals of the CTT (center tapped termination) level or the GTL (gunning transceiver logic) level.

2. Description of the Related Art

So far, the TTL or CMOS level, or the LVTTL (interface specification for 3.3 volt power supply standardized in compliance with JEDEC) has generally been used as the input/output level of the LSIs. With respect to these levels, however, the device is much affected by the reflection of signals or by the crosstalk as the frequency of the transfer data exceeds 50 MHz, and it becomes difficult to normally transfer the data since the waveforms are distorted by ringing and the like. Attention therefore has been given to input/output interfaces (CTT, GTL, rambus channel, etc.) of small amplitudes that suppress the amplitude of the transfer data to be smaller than 1 volt (about ±300 to ±500 Mv). These input/output interfaces make it possible to transfer the data at speeds as high as 100 MHz or more, which is well greater than 50 MHz.

However, conventional semiconductor integrated circuits equipped with such input/output interfaces involve many problems, which will be explained later in detail in contrast with the preferred embodiments of the present invention.

SUMMARY OF THE INVENTION

A main object of the present invention is to provide a semiconductor integrated circuit equipped with an input circuit or an output circuit adapted for an input/output interface suitable for a small-amplitude operation.

A first object of the present invention is to provide a semiconductor integrated circuit equipped with an input circuit that can be adapted for both the high-speed transfer (importance is placed on the transfer speed) and the low-speed transfer (importance is placed on the electric power efficiency.)

A second object of the present invention is to provide a semiconductor integrated circuit which exhibits performance adapted for various modes and excellent compatibility, by using two sets of output transistors having optimum internal resistances depending upon the signal interfaces (CTT or GTL) of very small amplitude levels and the signal interfaces (CMOS or TTL) of large amplitudes.

A third object of the present invention is to provide a semiconductor integrated circuit which is immune to noise and can be well combined with a three-state type output circuit, by optimizing the judgement reference level of a differential amplifier circuit.

A fourth object of the present invention is to provide a semiconductor integrated circuit equipped with an output circuit having excellent compatibility which can be used for every one of CTT, TTL and GTL.

A fifth object of the present invention is to provide a semiconductor integrated circuit which can be used for both the signal interface having a large logic amplitude and the signal interface having a small logic amplitude.

A sixth object of the present invention is to provide a semiconductor integrated circuit equipped with an output circuit which can realize a high-speed operation and enhance the drivability of output transistors.

According to a first aspect of the present invention, there is provided a semiconductor integrated circuit comprising a switching means which controls the supply of power-source voltage to a signal amplifier circuit that receives input signals, and a control means which selectively turns said switching means on and off depending upon the amplitude or the frequency of said input signals.

According to a second aspect of the present invention, there is provided a semiconductor integrated circuit comprising: a pair of differential transistors which apply to one control electrode an input signal that changes with a first frequency or with a second frequency lower than said first frequency and apply to the other control electrode a reference voltage that corresponds nearly to an intermediate value of the logic amplitude of said input signal; a transistor of the low-potential side disposed between said pair of differential transistors and a power source of the low-potential side; a transistor of the high-potential side disposed between said differential transistors and an active load or between the active load and a power source of the high-potential side; a first control voltage-generating means for generating a control voltage which renders both said low-potential side transistor and said high-potential side transistor conductive when the frequency of said input signal is near said first frequency; and a second control voltage-generating means for generating a control voltage which renders either said low-potential side transistor or said high-potential side transistor conductive depending upon the logic state of said input signal when the frequency of said input signal is near said second frequency.

According to a third aspect of the present invention, there is provided a semiconductor integrated circuit comprising a comparator circuit which detects the magnitude of an input voltage with respect to a voltage that serves as a reference, and an input circuit in which first and second transistors that control the power source current to said comparator circuit are connected between first and second power sources and said comparator circuit, and an input signal fed to said comparator circuit is also fed to said first and second transistors.

According to a fourth aspect of the present invention, there is provided a semiconductor integrated circuit comprising: a pair of differential transistors which apply to one control electrode an input signal which has a first logic amplitude or a second logic amplitude greater than said first logic amplitude and apply to the other control electrode a reference voltage that corresponds nearly to an intermediate value of the logic amplitude of said input signal; a transistor of the low-potential side disposed between said pair of differential transistors and a power source of the low-potential side; a transistor of the high-potential side disposed between said differential transistors and an active load or between the active load and a power source of the high-potential side; and wherein said input signal is applied to the control electrodes of said low-potential side transistor and of said high-potential side transistor.

According to a fifth aspect of the present invention, there is provided a semiconductor integrated circuit comprising: a transmission line for transmitting input signals; a voltage source for generating a voltage that corresponds nearly to an intermediate value of the logic amplitude of said input signal; a terminal resistor which is connected between said transmission line and the voltage source via a predetermined switching means; and an on/off control means which turns said switching means on when the frequency of said input signal corresponds to said first frequency and turns said switching means off when the frequency of said input signal corresponds to said second frequency.

According to a sixth aspect of the present invention, there is provided a semiconductor integrated circuit comprising: a first PMOS transistor and a first NMOS transistor connected in series between a high-potential side power source and a low-potential side power source; a second PMOS transistor and a second NMOS transistor connected in series between said high-potential side power source and said low-potential side power source; and an on/off control means which selectively turns said four transistors on and off depending upon a signal logic from a circuit in the chip; wherein a point at which said first PMOS transistor and said first NMOS transistor are connected together and a point at which said second PMOS transistor and said second NMOS transistor are connected together, are both connected to a signal line outside the chip, and said signal line is connected to the high-potential side power source or to the low-potential side power source depending upon the selective on/off operations of said four transistors; said semiconductor integrated circuit further comprising a mode control means which permits said signal line to be driven by said first PMOS transistor or by said first NMOS transistor when a mode designation signal indicates a first transfer mode which is used by connecting a terminal resistor between said signal line and a predetermined constant voltage, and permits said signal line to be driven by said second PMOS transistor or by said second NMOS transistor when said mode designation signal indicates a second transfer mode that is used without connecting said terminal resistor; and wherein on-resistances of said first PMOS transistor and said first NMOS transistor are set based upon the signal amplitude on the signal line during said first transfer mode and the value of said terminal resistor, and on-resistances of said second PMOS transistor and said second NMOS transistor are set based upon the signal amplitude on the signal line during said second transfer mode.

According to a seventh aspect of the present invention, there is provided a semiconductor integrated circuit comprising differential transistors that output a signal corresponding to a difference between an input signal of a very small amplitude and a reference potential that corresponds to an intermediate amplitude of said signal, said differential transistors having different threshold values.

According to an eighth aspect of the present invention, there is provided a semiconductor integrated circuit equipped with an output circuit comprising: a PMOS transistor and an NMOS transistor connected in series between a high-potential side power source and a low-potential side power source; an output terminal drawn from a point at which said two transistors are connected together; a first means for push-pull operating said PMOS transistor and said NMOS transistor according to the logic of a signal that is to be output; and a second means for cutting said PMOS transistor off in response to a predetermined level designation signal.

According to a ninth aspect of the present invention, there is provided a semiconductor integrated circuit comprising: a differential gate which compares the potential of an input signal with a predetermined reference potential to discriminate the logic of said input signal; a selection means which selects either a first reference potential given from outside the chip or a second reference potential formed by a reference potential-generating means in the chip; and an instruction means which instructs said selection means to select said first reference potential when said first reference potential is given, and which instructs said selection means to select said second reference potential when said first reference potential is not given.

According to a tenth aspect of the present invention, there is provided a semiconductor integrated circuit comprising: a logic gate which compares an input signal with a predetermined input threshold value to discriminate the logic of said input signal; a differential gate which compares the potential of the input signal with a reference potential given from outside the chip to discriminate the logic of said input signal; a selection means which selects either the output of the logic gate or the output of the differential gate; and an instruction means which instructs said selection means to select the output of the differential gate when said reference potential is given, and which instructs said selection means to select the output of said logic gate when said reference potential is not given.

According to an eleventh aspect of the present invention, there is provided a semiconductor integrated circuit comprising: an output circuit which outputs a first output voltage that specifies an "H" level and a second output voltage that specifies an "L" level with respect to a predetermined reference voltage; and a control means which controls said first and second output voltages of under substantially no-load state to, respectively, possess predetermined voltage levels of absolute values which is smaller than the absolute value of the voltage which corresponds to the power-source voltage.

BRIEF DESCRIPTION OF THE DRAWINGS

Other objects and features of the present invention will be described hereinafter in detail by way of preferred embodiments with reference to the accompanying drawings, in which:

FIG. 1 is a diagram illustrating the constitution of an input/output circuit according to a first prior art;

FIG. 74 is a diagram of operation waveforms of the circuit of FIG. 73.

DESCRIPTION OF THE PREFERRED EMBODIMENTS

Figure 2:
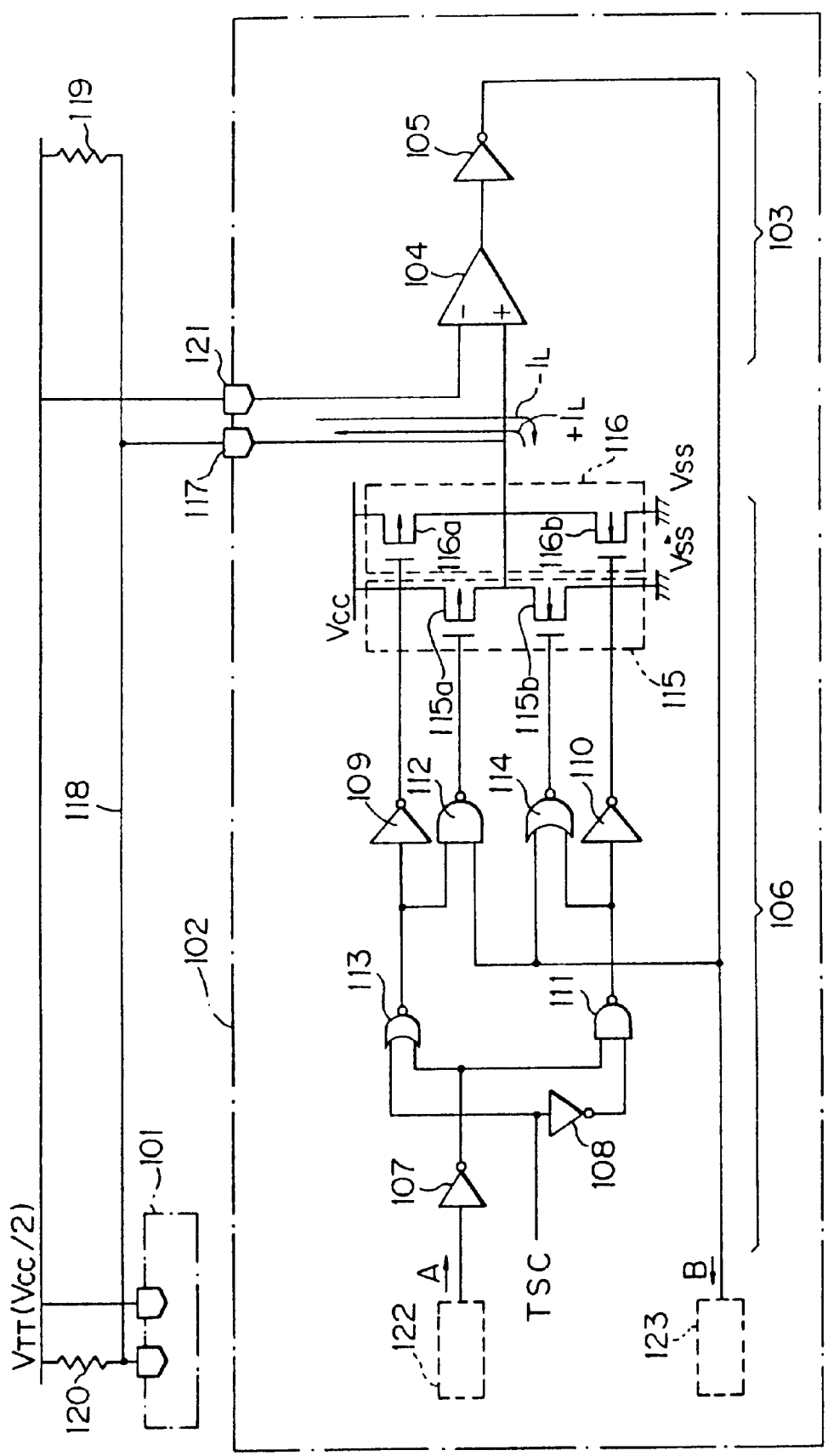
FIG. 2 is a diagram illustrating the constitution of a CTT circuit according to a second prior art.

First to Third Aspects of the Invention

First, for a better understanding of the preferred embodiments, the related prior art will be explained with reference to FIGS. 1 to 4.

FIG. 1 is a diagram illustrating the constitution of a conventional data transfer circuit. Here, although not specifically limited, described below is a semiconductor memory. In FIG. 1, reference numeral 1 denotes an LSI chip (hereinafter referred to as an output chip) of the side of outputting the data, and 2 denotes an LSI chip (hereinafter referred to as an input chip) of the side of inputting the data. Data D formed inside the output chip 1 is transferred to an output circuit 18 passing through an inverting passage A which consists of an inverter gate 11, a NOR gate 12, an inverter gate 13 and a transistor 14 and through a non-inverting passage B which consists of a NOR gate 15, an inverter gate 16 and a transistor 17. The output circuit 18 comprises an inverting drive unit 23 made up of transistors 19 to 22, a non-inverting drive unit 28 made up of transistors 24 to 27, and an output unit 31 made up of two transistors 29 and 30 that operate in a push-pull manner in response to the outputs from the above drive units, and opens the transistor 29 in the output unit 31 so that a data line 32 is driven with a potential $V_{cc}$ (e.g., +3.3V) when the data D has a logic "1", i.e., the H-logic, and opens the transistor 30 in the output unit 31 so that the data line 32 is driven with a potential $V_{ss}$ (e.g., +0V) when the data D has a logic "0", i.e., the L-logic.

Here, when an HiZ control signal is rendered to assume the L-logic, the two transistors 29 and 30 of the output unit 31 can be turned off together irrespective of the logic of the data D and, hence, the output can be opened to establish the high-impedance state. This is a function that is required when the data line 32 is to be used as a bus line.

A potential change on the data line 32, i.e., a transfer data Dt is taken in by the input chip 2 through an input terminal Pi and is transferred to a latch circuit 35 via a NOR gate 33 and a buffer circuit 34 when a predetermined control signal (e.g., a signal obtained from a write enable signal WE) has the L-logic. A buffer circuit 34 is constituted by a CMOS circuit made up of transistors 36 and 37, two transistors 38 and 39 which are turned on when a predetermined control signal (e.g., a signal obtained from a row address strobe signal RAS) has the L-logic and are turned off when the same signal has the H-logic, and an inverter gate 40. While the two transistors 38 and 39 are turned off, the latch circuit 35 is cut off from the input terminal Pi in order to prevent undesired inversion of latching caused by noise and the like.

The latch circuit 35 is constituted by a flip-flop in which four transistors 41 to 44 are connected in a crossing manner, two switching transistors 45 and 46, and an inverter gate 47, and works to set the L-logic (output=L) when the H-logic is input and works to set the H-logic (output=H) when the L-logic is input. The output of the latch circuit 35 is transmitted to each of the portions in the chip via, for example, inverter gates 48 and 49.

In the above-mentioned constitution, the logic amplitude of the transferred data Dt, i.e., the input/output level of the LSI chip is TTL (provided $V_{cc}$=+3.3V, and $V_{ss}$=0V), and the upper-limit frequency is around 50 MHz. In order to realize the high-speed transfer in excess of 50 MHz, it is recommended to employ, for example, the GTL system in which the output side has an open drain and $V_{OH}$ is pulled up with a resistor. In order to convert the signal of a small amplitude into an internal level (e.g., TTL or CMOS) of the input chip 2 at a high speed, a differential amplifier circuit should be provided in the initial input stage of the chip 2.

In the CTT and GTL, the signal line is terminated into a voltage lower than the power-source voltage, and a signal amplitude of smaller than 1V is produced across the terminal resistor by a drive current of the output buffer that flows into the terminal resistor. By bringing the value of the terminal resistor to be in agreement with the characteristic impedance of the signal line, the signal is prevented from being reflected and it is made possible to transfer the data at a high speed.

[CTT Interface]

In FIG. 2, reference numerals 101 and 102 denote chips on which are mounted transceivers of the same constitution. Constitution of the transceiver mounted on the chip 101 will now be described as a representative example. Reference numeral 103 denotes an input buffer which includes a differential amplifier 104 and an inverter gate 105, and reference numeral 106 denotes an output buffer which includes inverter gates 107 to 110, NAND gates 111 and 112, NOR gates 113 and 114, as well as two stages of CMOS output units 115 and 116. The CMOS unit 115 of the preceding stage has a P-channel MOS transistor (hereinafter referred to as a second PMOS transistor) 115a and an N-channel MOS transistor (hereinafter referred to as a second NMOS transistor) 115b which are connected in a push-pull manner between the high-potential side power source $V_{cc}$ (e.g., +3V) and the low-potential side power source $V_{ss}$ (0V). Similarly, the CMOS unit 116 of the succeeding stage has a P-channel MOS transistor (hereinafter referred to as a first PMOS transistor) 116a and an N-channel MOS transistor (hereinafter referred to as a first NMOS transistor) 116b which are connected in a push-pull manner between the $V_{cc}$ and the $V_{ss}$. Here, reference numeral 117 denotes an input/output terminal that is connected to a signal line 118 and to the ends on one side of the terminal resistors 119, 120, reference numeral 121 denotes a reference power-source terminal connected to the ends on the other side of the terminal resistors 119, 120 and to a pull-up power source $V_{TT}$ (+1.5V provided $V_{TT}=V_{cc}/2$, and $V_{cc}$ is +3V), reference numeral 122 denotes any internal circuit that forms a signal (conveniently denoted here by symbol A) which is to be output to the outside of the chip via the output buffer 106, reference numeral 123 denotes any internal circuit which receives an output signal (conveniently denoted by symbol B) from the input buffer 103, and symbol TSC denotes a tri-state control signal (tri-state designation mode under the H-level condition). In the above constitution, the level of the signal B is determined by a potential relationship between the inverted input (−) and the non-inverted input (+) of the differential amplifier 104. That is, since the potential of the inverted input (−) is $V_{TT}$=+1.5V, the signal B assumes the L-level when the potential of the non-inverted input (+) exceeds +1.5V and assumes the H-level when the potential of the non-inverted input (+) is smaller than +1.5V.

Now, when the signal A of the H-level is input (but the signal TSC has the L-level) under the condition where the signal B has the H-level, the outputs of the inverter gate 109, NAND gate 112, NOR gate 114 and inverter gate 110 all assume the L-level. Therefore, the PMOS transistors 115a and 116a in the two stages of CMOS units 115 and 116 are turned on, the NMOS transistors 115b and 116b are turned off, and a current $+I_L$ flows in a direction of $V_{cc}$→PMOS transistors 115a(116a)→terminal resistors 119, 120→$V_{TT}$.

Therefore, the signal B changes into the L-level at a moment when the potential of the non-inverted input (+) of the differential amplifier 104 becomes higher than the potential of the inverted input (−) by $I_L \times R_L$ ($R_L$ denotes a parallel resultant value of the terminal resistors 119 and 120, e.g., 25Ω).

When the signal A of the L-level is input (but the signal TSC has the L-level) under the condition where the signal B has the L-level, on the other hand, the outputs of the inverter gate 109, NAND gate 112, NOR gate 114 and inverter gate 110 all assume the H-level. Therefore, the PMOS transistors 115a and 116a in the two stages of CMOS units 115 and 116 are turned off, the NMOS transistors 115b and 116b are turned on, and a current $-I_L$ flows in a direction of $V_{TT}$→NMOS transistors 115b(116b)→$V_{ss}$.

Therefore, the signal B changes into the H-level at a moment when the potential of the non-inverted input (+) of the differential amplifier 104 becomes lower than the potential of the inverted input (−) by $I_L \times R_L$.

Here, the potential at the input/output terminal 117 changes along a curve of time constant determined by the capacitance of the signal line 118, etc., and hence the signal B changes after a time that corresponds to the above time constant has passed from the change in the level of the signal A.

Therefore, when the signal A changes from L into H, the drive current $+I_L$ flows through the two PMOS transistors 115a and 116a (or, in other words, through a low resistance) until the signal B changes into the L-level. After the signal B has changed into the L-level, the drive current $+I_L$ flows through the first PMOS transistor 116a only (or, in other words, through a high resistance). The same happens even when the signal A changes from H into L. That is, the drive current $-I_L$ flows through the two NMOS transistors 115b and 116b until the signal B changes into the H-level and, then, flows through the first NMOS transistor 116b only after the signal B has changed into the H-level.

It is therefore possible to flow a large drive current in the former half period of output change, to flow a small drive current in the latter half period, to quicken the change of the output signal, and to avoid the occurrence of ringing and overshooting in the output signals.

By producing the tri-state control signal TSC of the H-level, the outputs of the inverter gate 109 and NAND gate 112 can be fixed to the H-level, and the outputs of the NOR gate 114 and the inverter gate 110 can be fixed to the L-level irrespective of the states of the signals A and B, and the four MOS transistors 115a, 115b, 116a and 116b in the two stages of CMOS units 115 and 116 can be all turned off.

[CTT/GTL Interface]

Figure 3:
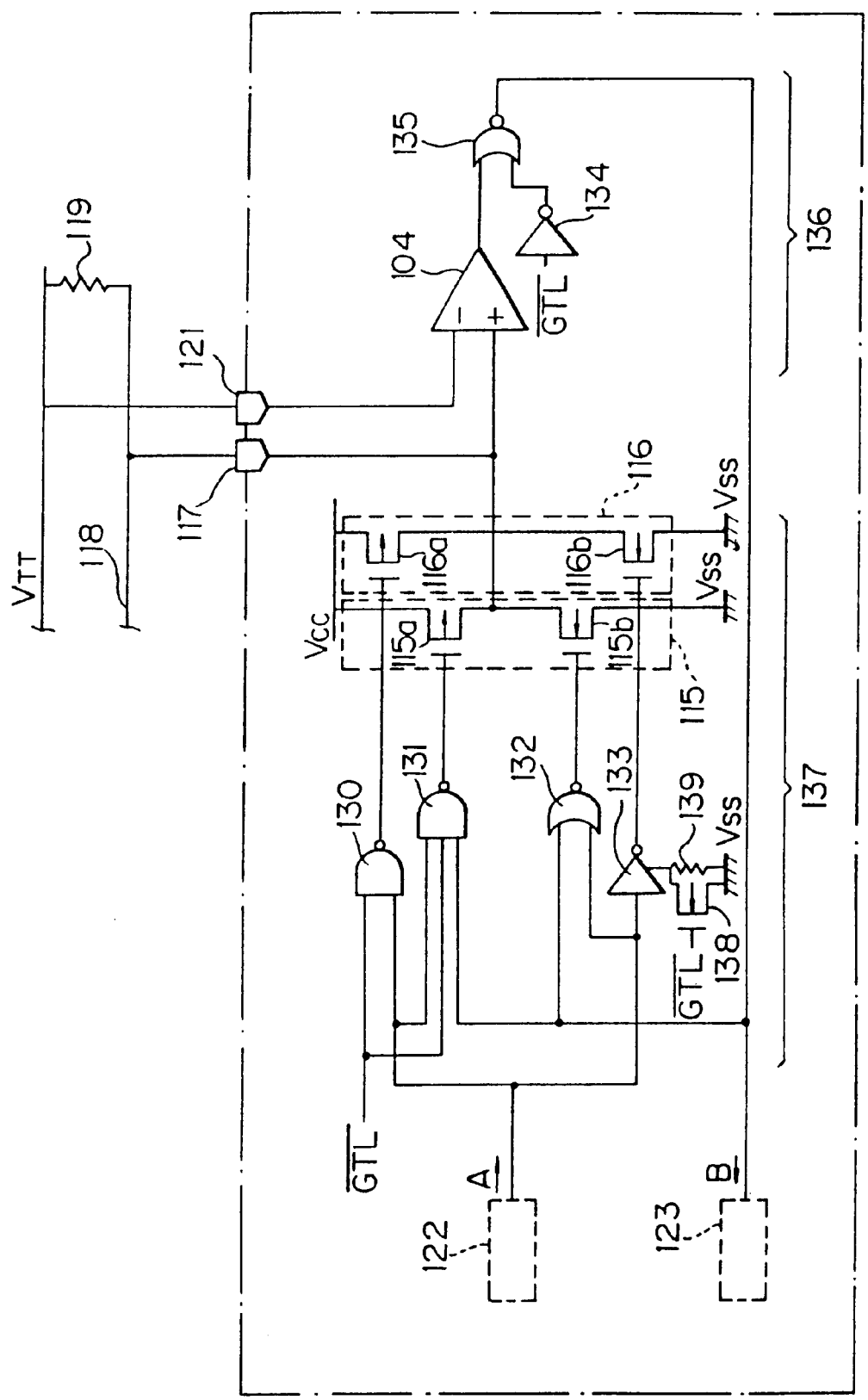
FIG. 3 is a diagram illustrating the constitution of a CTT/GTL circuit according to the second prior art.

FIG. 3 illustrates a chip mounting a transceiver for both CTT and GTL. Here, the circuit elements common to those of FIG. 2 are denoted by the same reference numerals. This transceiver operates with a CTT interface when the signal GTL is rendered to assume the H level and operates with a GTL interface when the signal GTL is rendered to assume the L level.

When the signal GTL H-level (CTT mode), the outputs of the AND gates 130, 131, NOR gate 132 and inverter gate 133 have a logic opposite to the signal A. When the signal A has the H-level, therefore, the PMOS transistors 115a and 116a are turned on and when the signal A has the L-level, the NMOS transistors 115b and 116b are turned on, and the input/output terminal 117 is driven with $V_{cc}$ or $V_{ss}$. Then, as the logic of the input/output terminal 117 is fixed to the H-level or the L-level, the logic of the signal B from the input buffer 136 which includes differential amplifier circuit 104, inverter gate 134 and NOR gate 135, becomes opposite to the logic of the input/output terminal 117, whereby the output logics of the AND gate 131 and the NOR gate 132 in the output buffer 137 are inverted causing the second PMOS transistor 115a or the second NMOS transistor 115b to be turned off.

When the signal GTL has the L-level (GTL mode), on the other hand, the output (i.e., signal B) of the NOR gate 135 of the input buffer 136 is fixed to the L-level, and the outputs of the AND gates 130 and 131 in the output buffer 137 are fixed to the H-level. Therefore, the NMOS transistors 115b and 116b only are turned on or off depending upon the state of the signal A, and the output buffer 137 operates with its drain open.

An NMOS transistor 138 and a resistor 139 added to the inverter gate 133 of the output buffer 137 are to retard the cut-off of the first NMOS transistor 116b in the GTL mode in order to avoid a sudden snap-off of the output signal.

The first prior art (FIG. 1) in which the pull-up resistor is connected to the data line 32 and the differential amplifier circuit is provided in the initial input stage of the chip 2, was effective for transferring the data at high speeds in excess of 50 MHz but was not suited for the applications where importance is given to the electric power efficiency rather than to the high-speed operation.

In the case of, for example, a note-type personal computer and EWS which are powered on a battery, efforts have been made to use the battery as long as possible by decreasing the speed of clocks of the CPU (i.e., by decreasing the frequency of the transferred data) resulting, however, in the wasteful consumption of electric power by the pull-up resistor and by the differential amplifier. Besides, since the numbers of pull-up resistors and differential amplifiers vary in proportion to the number of bits of the transferred data, the electric power as a whole is consumed to a degree which is no more negligible.

Figure 4:
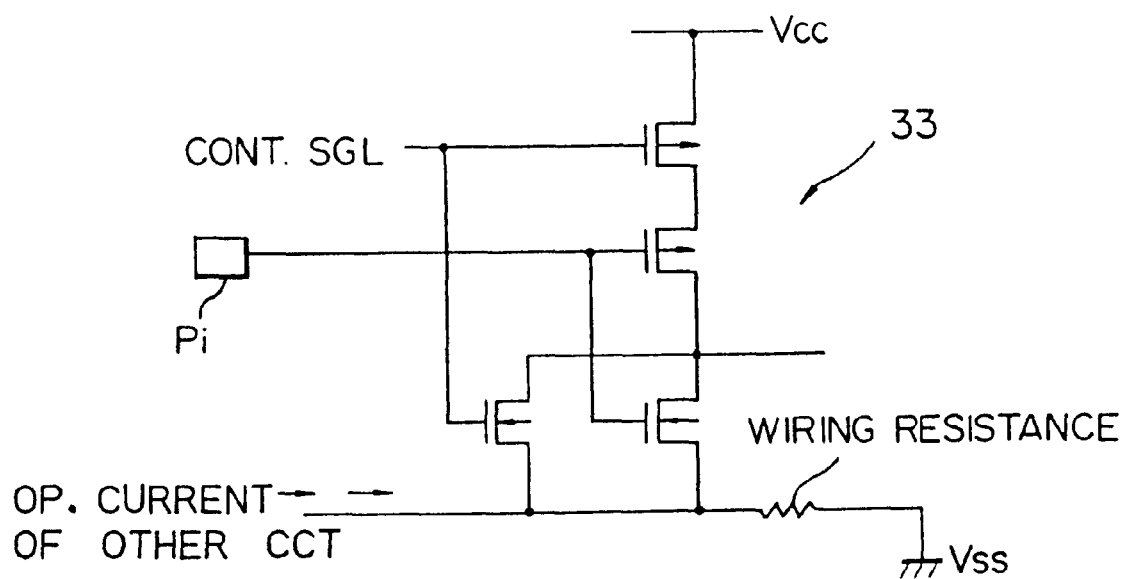
FIG. 4 is a diagram illustrating the constitution of a NOR gate which is arranged in the first stage in the input chip of FIG. 1.

According to the first prior art in which the transferred data are input to the NOR gate 33, furthermore, the "threshold value" of the NOR gate for discriminating the high or low level of the input voltage is subject to change being affected by the fabrication conditions or due to the ground potential that floats being caused by a current during the operation (see the constitution of NOR gate 33 in FIG. 4).

The second prior art (FIG. 2 or 3) could be adapted to the signal interface of a very small amplitude (several hundreds of mV) such as of CTT or GTL. When the second prior art was adapted to the signal interface (e.g., CMOS or TTL) of a large amplitude in excess of 1V, however, such problems aroused as large distortion in the output signal or delay in the change of the output signal.

By removing the terminal resistors 119 and 120 from FIG. 2 or 3, the logic amplitude on the signal line 118 can be increased nearly to the full amplitude of the power source so as to be used for the signal interface of large amplitude accompanied, however, by the following inconvenience.

If the logic amplitude on the signal line 118 is 0.4V, then the internal resistance (on resistance $R_{ON}$) of the first PMOS transistor 116a and the first NMOS transistor 116b that governs the CTT level or the GTL level can be found from the following equation (1), $$0.4/(1.5-0.4)=25/R_{ON} \quad (1)$$

where 1.5 represents the potential ($V_{cc}/2$) of $V_{TT}$ and 25 represents the parallel resultant value of the terminal resistors 119 and 120.

From the above equation (1), $R_{ON}$ becomes 68.75 ohms. In order to obtain this internal resistance, the sizes of the first PMOS transistor 116a and the first NMOS transistor 116b must be approximately so set that "gate length L=1 μm and gate width W=100 μm". However, this size is considerably smaller than the size of the general CMOS output transistors (e.g., L=100 μm, W=1000 μm), and the driving power is apparently insufficient when it is used as an output transistor of the CMOS level or the TTL level.

Since the driving power is so small, therefore, it is not possible to suppress the wave reflected by the inductance component of the signal line, and to eliminate distortion in the output signal. Accordingly, it is not allowed, either, to quickly charge or discharge a large capacitive load (about 100 PF) of the TTL level. Accordingly, the change of the output signal becomes loose, and changing time is lengthened.

In order to accomplish the aforementioned first object, the semiconductor integrated circuit of the present invention comprises a switching means which controls the supply of power-source voltage to a signal amplifier circuit that receives input signals, and a control means which selectively turns said switching means on and off depending upon the amplitude or the frequency of said input signals.

In order to accomplish the aforementioned first object, the semiconductor integrated circuit of the present invention comprises: a pair of differential transistors which apply to one control electrode an input signal that changes with a first frequency or with a second frequency lower than said first frequency and apply to the other control electrode a reference voltage that corresponds nearly to an intermediate value of the logic amplitude of said input signal; a transistor of the low-potential side disposed between said pair of differential transistors and a power source of the low-potential side; a transistor of the high-potential side disposed between said differential transistors and an active load or between the active load and a power source of the high-potential side; a first control voltage-generating means for generating a control voltage which renders both said low-potential side transistor and said high-potential side transistor conductive when the frequency of said input signal is near said first frequency; and a second control voltage-generating means for generating a control voltage which renders either said low-potential side transistor or said high-potential side transistor conductive depending upon the logic state of said input signal when the frequency of said input signal is near said second frequency.

In order to accomplish the aforementioned first object, the semiconductor integrated circuit of the present invention comprises: a pair of differential transistors which apply to one control electrode an input signal which has a first logic amplitude or a second logic amplitude greater than said first logic amplitude and apply to the other control electrode a reference voltage that corresponds nearly to an intermediate value of the logic amplitude of said input signal; a transistor of the low-potential side disposed between said pair of differential transistors and a power source of the low-potential side; a transistor of the high-potential side disposed between said differential transistors and an active load or between the active load and a power source of the high-potential side; and wherein said input signal is applied to the control electrodes of said low-potential side transistor and of said high-potential side transistor.

In order to accomplish the aforementioned first object, the data transfer circuit of the present invention comprises: a transmission line for transmitting input signals; a voltage source for generating a voltage that corresponds nearly to an intermediate value of the logic amplitude of said input signal; a terminal resistor which is connected between said transmission line and the voltage source via a predetermined switching means; and an on/off control means which turns said switching means on when the frequency of said input signal corresponds to said first frequency and turns said switching means off when the frequency of said input signal corresponds to said second frequency.

Figure 5:
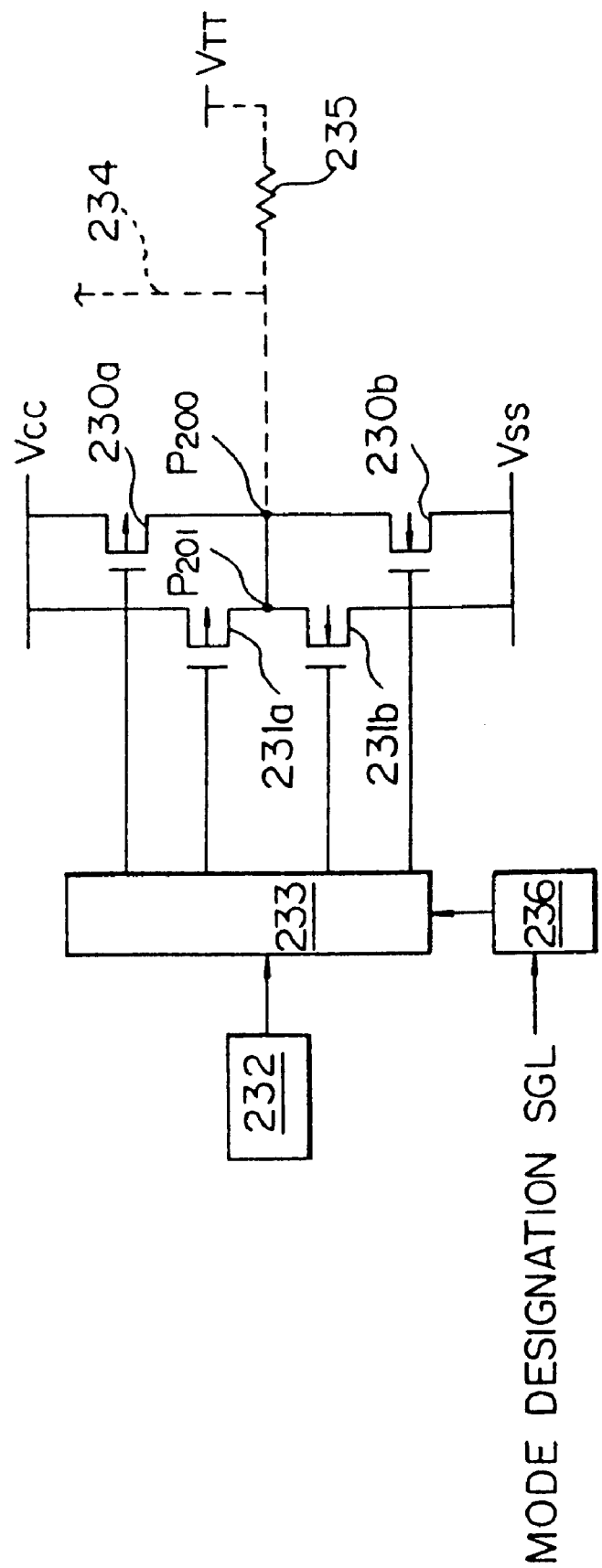
FIG. 5 is a diagram illustrating the principle and constitution of a first aspect of the present invention.

In order to accomplish the aforementioned second object, the semiconductor integrated circuit of the present invention comprises, as shown in a diagram of the principle thereof of FIG. 5: a first PMOS transistor 230a and a first NMOS transistor 230b connected in series between a high-potential side power source $V_{cc}$ and a low-potential side power source $V_{ss}$; a second PMOS transistor 231a and a second NMOS transistor 231b connected in series between said high-potential side power source $V_{cc}$ and said low-potential side power source $V_{ss}$; and an on/off control means 233 which selectively turns said four transistors 230a, 230b, 231a and 231b on and off depending upon a signal logic from a circuit 232 in the chip; wherein a point $P_{200}$ at which said first PMOS transistor 230a and said first NMOS transistor 230b are connected together and a point $P_{201}$ at which said second PMOS transistor 231a and said second NMOS transistor 231b are connected together, are both connected to a signal line 234 outside the chip, and said signal line 234 is connected to the high-potential side power source $V_{cc}$ or to the low-potential side power source $V_{ss}$ depending upon the selective on/off operations of said four transistors 230a, 230b, 231a and 231b; said semiconductor integrated circuit further comprising a mode control means 236 which permits said signal line 234 to be driven by said first PMOS transistor 230a or by said first NMOS transistor 230b when a mode designation signal CMOS indicates a first transfer mode which is used by connecting a terminal resistor 235 between said signal line 234 and a predetermined constant voltage $V_{TT}$, and permits said signal line 234 to be driven by said second PMOS transistor 231a or by said second NMOS transistor 231b when said mode designation signal CMOS indicates a second transfer mode that is used without connecting said terminal resistor 235; and wherein on-resistances of said first PMOS transistor 230a and said first NMOS transistor 230b are set based upon the signal amplitude on the signal line 234 during said first transfer mode and the value of said terminal resistor 235, and on-resistances of said second PMOS transistor 231a and said second NMOS transistor 231b are set based upon the signal amplitude on the signal line 234 during said second transfer mode.

In the present invention, when the input signal has the first frequency or has the first logic amplitude, the transistor of the low-potential side and the transistor of the high-potential side are both turned on at all times, and a differential amplification operation is carried out by a pair of differential transistors. When the input signal has the second frequency (which is lower than the first frequency) or has the second logic amplitude (which is greater than the first logic amplitude), either the transistor of the low-potential side or the transistor of the high-potential side is turned on depending on the logic state of the input signal, and the differential amplification operation is not carried out by the pair of differential transistors, and the input signal is taken in by the chip without amplified through the transistor of the low-potential side which is turned on or through the transistor of the high-potential side.

Thus, there is provided an input circuit which can be adapted to both the high-speed transfer mode and the low-power mode (data transfer mode of a low speed maintaining a large amplitude).

When the high-speed transfer mode is requested in the data transfer circuit of the present invention, the terminal resistor is connected and when the low-power mode is requested, the terminal resistor is cut off making it possible to avoid power loss by the terminal resistor during the low-power mode.

According to the present invention, furthermore, the same chip can be used either for the high-speed transfer mode or for the low-power mode. This is done simply by using or not using the terminal resistor. Therefore, the manufacturer needs not prepare different kinds of chips for high-speed use and low-power use; i.e., the chips can be cheaply supplied. The user, on the other hand, is permitted to use the same part (semiconductor integrated circuit to which the present invention is applied) either for high-speed purpose or low-power purpose depending upon the applications and is allowed to reduce the amount of stock. That is, the invention not only makes it possible to electrically connect or disconnect the terminal resistor but also contributes to decreasing the cost of the part.

Figure 6A:
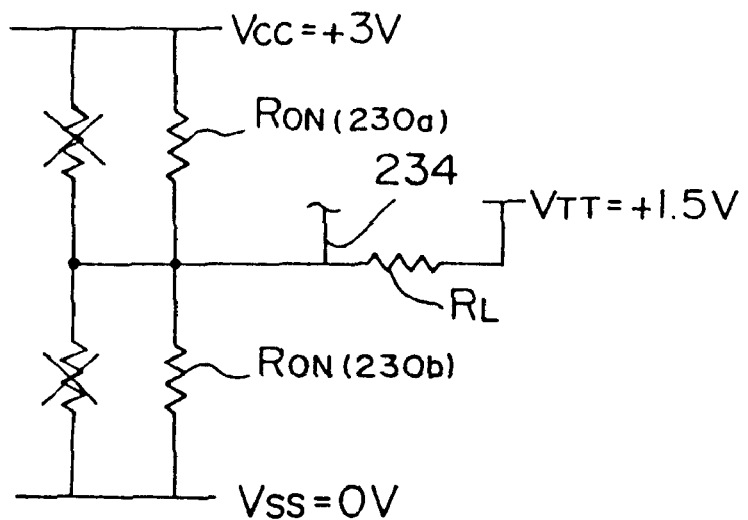
FIG. 6 is a diagram illustrating the operation of the first aspect of the present invention.
Figure 6B:
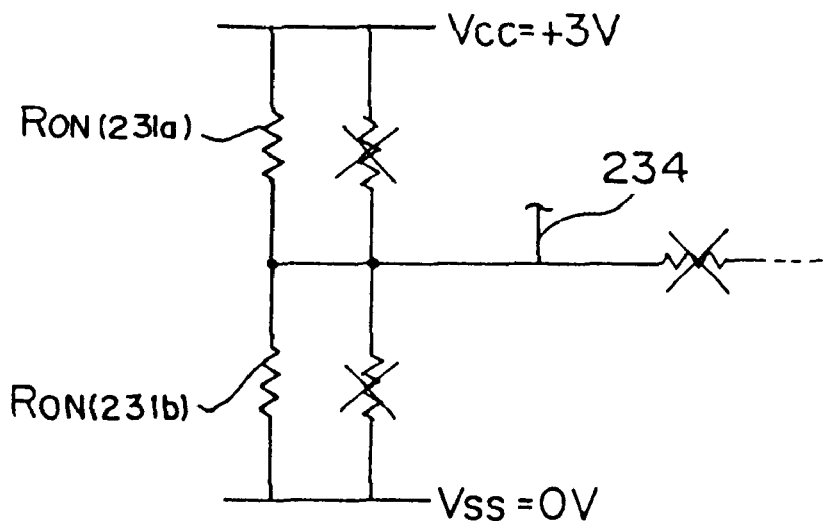

In FIG. 6, symbol $R_{ON}(230a)$ denotes on-resistance of the first PMOS transistor 230a, $R_{ON}(230b)$ denotes on-resistance of the first NMOS transistor 230b, $R_{ON}(231a)$ denotes on-resistance of the second PMOS transistor 231a, $R_{ON}(231b)$ denotes on-resistance of the second NMOS transistor 231b, and $R_L$ represents the terminal resistor 235. $R_{ON}(230a)$ and $R_{ON}(230b)$ are, respectively, about 70 [Ω] when the first PMOS transistor 230a and the first NMOS transistor 230b have a size of L=1 μm and W=200 μm, and $R_{ON}(231a)$ and $R_{ON}(231b)$ are, respectively, about 15 [Ω] when the second PMOS transistor 231a and the second NMOS transistor 231b have a size of L=1 μm and W=1000 μm.

Now, when used in the signal transfer mode (first transfer mode) of a very small amplitude, the terminal voltage $V_{TT}$ is set to 1.5V and $R_L$ is set to 25Ω. From the equation (1) mentioned earlier, therefore, a desired signal amplitude (e.g., 0.4V) of the transfer mode is obtained on the signal line 234 which is connected to $V_{cc}$ or $V_{ss}$ via $R_{ON}(230a)$ or $R_{ON}(230b)$.

When used in the signal transfer mode (second transfer mode) of a large amplitude, on the other hand, the signal 234 is connected to $V_{cc}$ or $V_{ss}$ via $R_{ON}(231a)$ or $R_{ON}(231b)$ which is comparable to that of a general CMOS output transistor. Therefore, a sufficiently large driving power is guaranteed to obtain a desired signal amplitude (e.g., about 3V) of the transfer mode on the signal line 234.

In the second transfer mode, it is desired that $R_{ON}(230a)$, $R_{ON}(231a)$, $R_{ON}(230b)$ and $R_{ON}(231b)$ are used in parallel. This enables the internal resistance to be further decreased and, hence, the driving power to be further increased.

FIGS. 7 to 19 are diagrams illustrating an input circuit and a data transfer circuit which includes the input circuit according to an embodiment of the present invention.

Figure 7A:
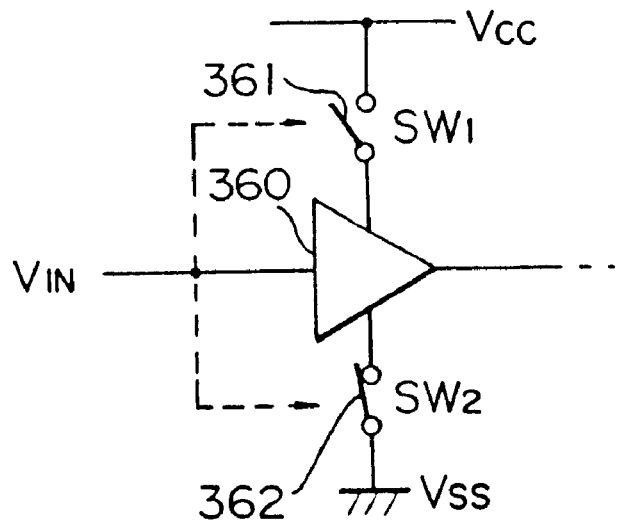
FIG. 7 is a diagram illustrating the principle and constitution of an embodiment of a second aspect of the present invention.
Figure 7B:
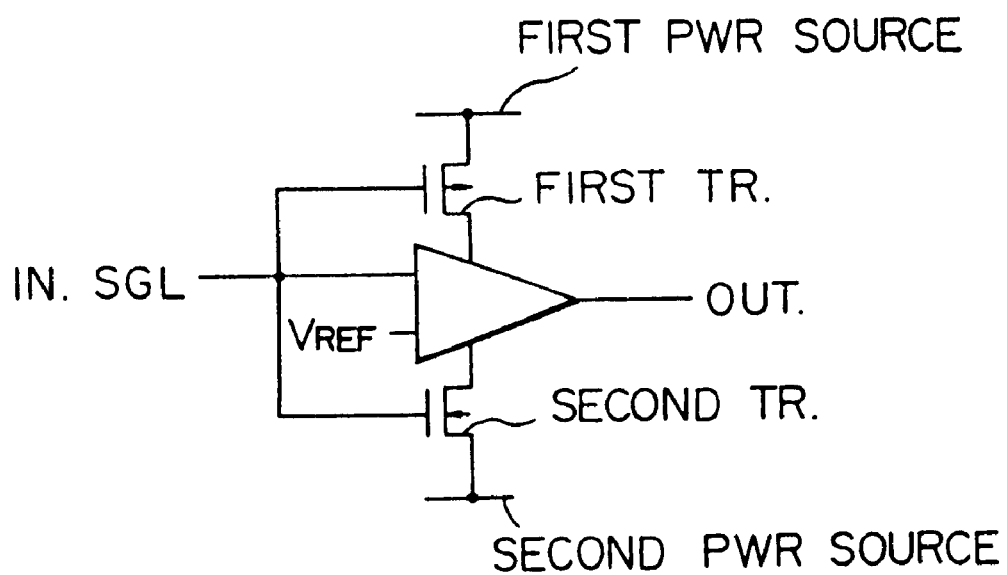

As shown in FIG. 7, the input circuit according to this embodiment includes a differential amplifier unit (AMP) 360 which outputs an input signal $V_{IN}$ after having amplified it and switching elements ($SW_1$, $SW_2$) 361 and 362 inserted in the power source feeding passage of the differential amplifier unit 360. The on/off operations of the switching elements 361 and 362 are controlled depending upon the frequency or the amplitude of the input signal $V_{IN}$.

Figure 8:
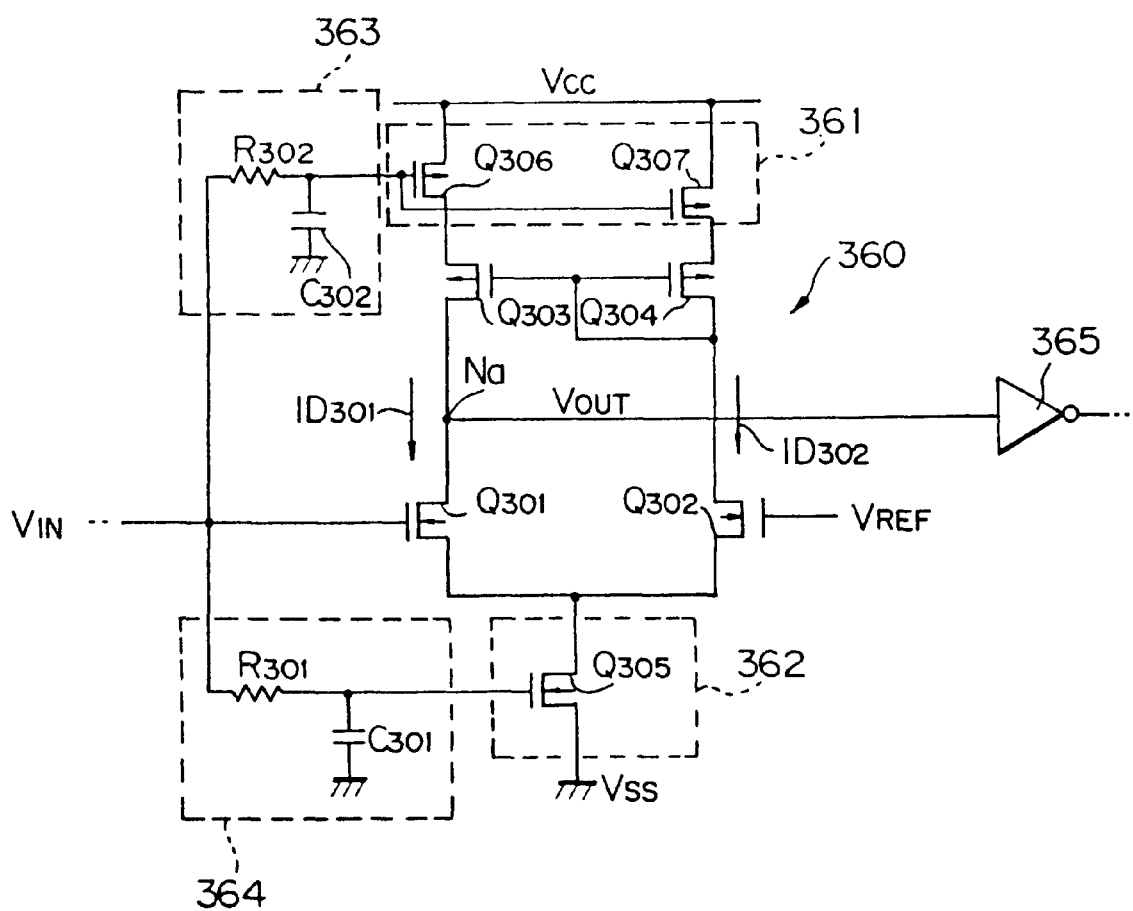
FIG. 8 is a diagram illustrating the constitution of an input circuit of the embodiment of the second aspect of the present invention.

FIG. 8 is a diagram illustrating the whole constitution of the input circuit that includes control circuits 363 and 364. The differential amplifier unit 360 comprises a transistor Q301 which receives the input signal $V_{IN}$ through the gate thereof, a transistor Q302 which receives through the gate thereof a reference voltage $V_{REF}$ that has nearly an intermediate potential (+1.65V) between the high-potential side power source $V_{cc}$ (+3.3V) and the low-potential side power source $V_{ss}$ (0V), transistors (active loads) Q303 and Q304 of a current mirror constitution connected to the drain side of the pair of differential transistors Q301 and Q302, as well as a low-potential side transistor Q305 that corresponds to the switching element 362 of FIG. 7 inserted between the low-potential side power source $V_{ss}$ and Q301, Q302, and high-potential side transistors Q306 and Q307 that correspond to the switching element 361 of FIG. 7 inserted between the high-potential side power source $V_{cc}$ and Q303, Q304. Here, reference numeral 365 denotes an inverter gate which inverts the logic of potential $V_{OUT}$ at a node Na between Q301 and Q303 and outputs it into the chip.

Drain currents ID301 and ID302 flowing into the differential transistors Q301 and Q302 are made constant through the low-potential side transistor Q305; i.e., when one current increases, the other current decreases. Furthermore, when the mirror ratio of Q303 to Q304 is set to be, for example, n:1 (n is any value inclusive of 1), there are established relationships ID301×n and ID302×1.

When $V_{IN}<V_{REF}$, there holds ID301×n<ID302×1, whereby the potential at Na is drawn toward the $V_{ss}$ side and the L-logic is output. When $V_{IN}>V_{REF}$, on the other hand, there holds ID301×n>ID302×1, whereby the potential at Na is drawn toward the $V_{cc}$ side and the H-logic is output. The logic amplitude of the output $V_{OUT}$ is given by the width of a potential change (nearly $V_{cc}-V_{ss}$) at Na, and an input level is maintained that is needed in the chip.

Here, the control circuit 363 that generates a gate voltage (control voltage) for the high-potential side transistors Q306 and Q307 works as the first and second control voltage-generating means described earlier. Similarly, the control circuit 364 that generates a gate voltage (control voltage) for the low-potential side transistor Q305 works as the first and second control voltage-generating means described earlier.

That is, the control circuit 363(364) constitutes a CR integration circuit using resistor R301 and capacitor C301 (resistor R302 and capacitor C302), and renders the impedance to the resistive as viewed from the $V_{IN}$ side when $V_{IN}$ has a frequency (first frequency) exceeding, for example, 50 MHz and renders the impedance to be capacitive when $V_{IN}$ has a frequency (second frequency) smaller than, for example, 50 MHz. The above relationship between the frequency and the impedance can be set by selecting the values of R301 and C301 (R302 and C302). The word resistive means that the real component of a complex number of the input impedance is sufficiently greater than the line impedance (usually, 50Ω). Concretely speaking, the word resistive stands for that the impedance appears to be greater than 500Ω at an operation frequency (100 MHz) in the CTT (center tapped termination) system.

For instance, if R301=R302=1 KΩ, C301=0.0112 PF and C302=0.065 PF, then the time constant of the control circuit of the high-potential side where problem arises in regard to follow-up performance on the TTL level, can be set to be 1 KΩ×0.065 PF×2=0.13 ns which is a sufficiently high response speed. These values of C301 and C302 can be obtained by utilizing the gate capacitances of Q305 to Q307 without the need of separately providing the capacitors. Moreover, the control circuit 363(364) is never limited to the aforementioned CR integration circuit. For instance, it may be an LC integration circuit which utilizes the L-component of the wiring and the gate capacitances of Q305 to Q307.

Figure 9:
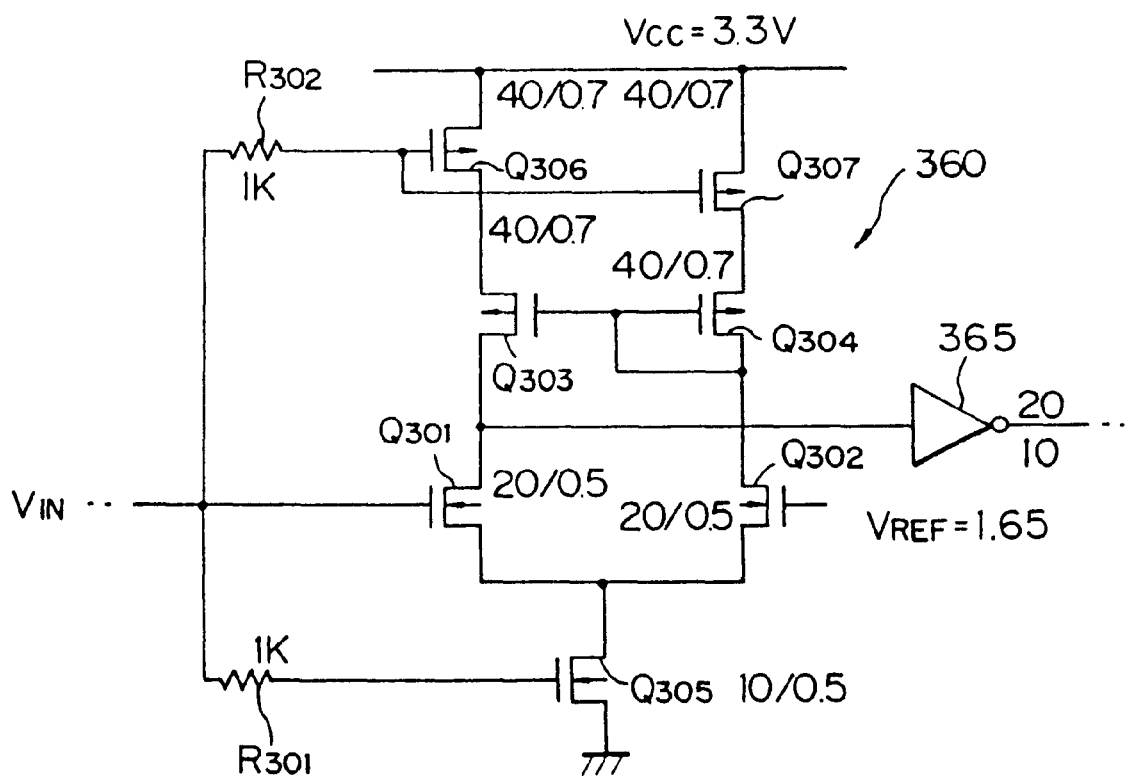
FIG. 9 is a diagram illustrating preferred transistor sizes in the input circuit of the embodiment of the second aspect of the present invention.

FIG. 9 is a diagram illustrating a preferred W/L of the transistors Q301 to Q307. In this example, Q301 and Q302 have the same size, and Q303 to Q307 have the same size. The mirror ratio of Q303 to Q304 is 1:1.

In this constitution, when $V_{IN}$ has a frequency (first frequency) greater than 50 MHz, the input impedance becomes resistive as viewed from $V_{IN}$, i.e., the input impedance of the low-potential side transistor Q305 and of the high-potential side transistors Q306 and Q308 inclusive of R301 and R302, becomes resistive. Therefore, these transistors Q305 to Q307 work as equivalent resistors having values slightly greater than the resistances of when their channels are turned on.

Figure 10:
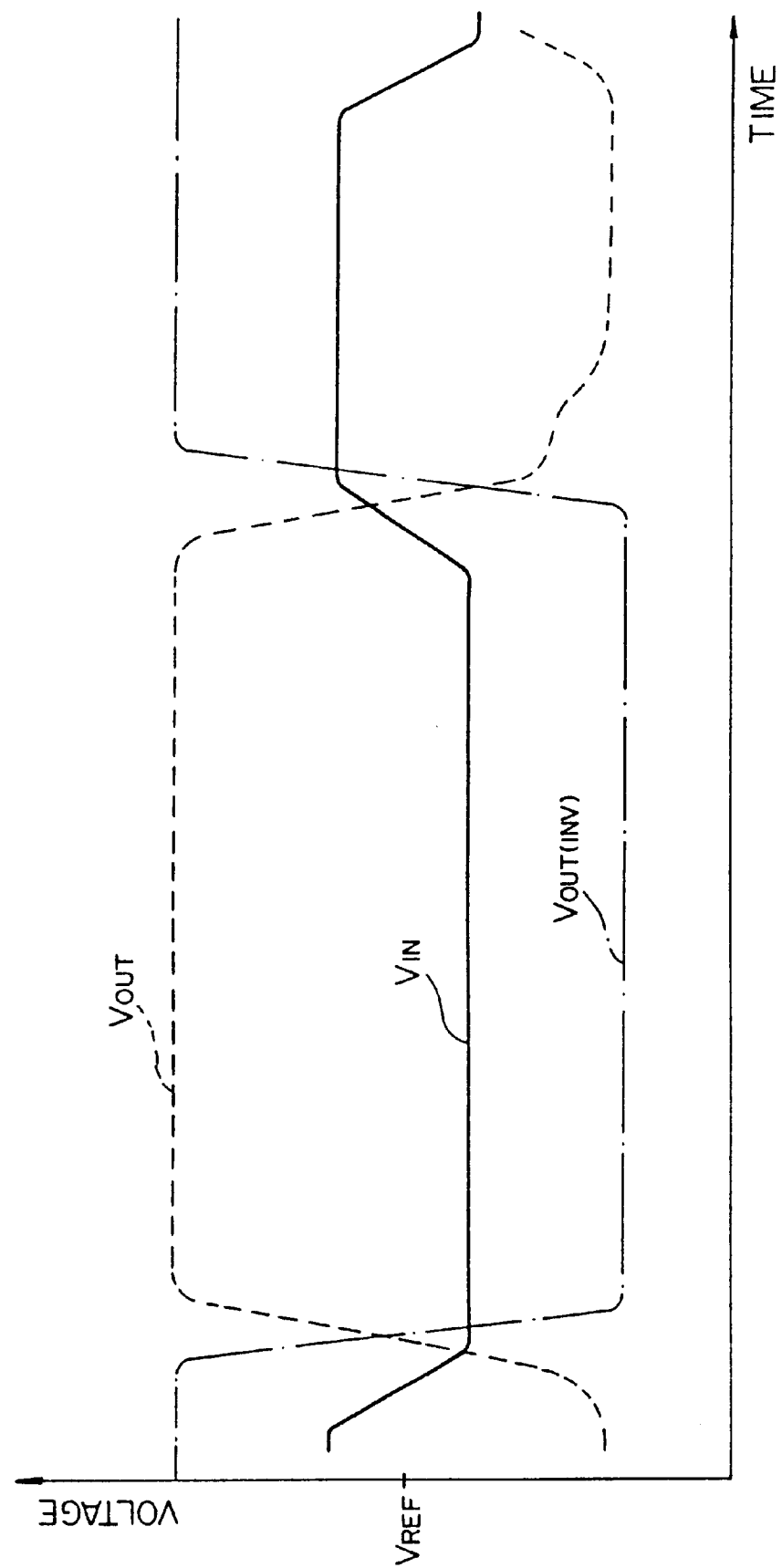
FIG. 10 is a diagram of waveforms of when a signal having a very small amplitude is input to the input circuit of the embodiment of the second aspect of the present invention.

Accordingly, the operation of the differential amplifier unit 360 is permitted, a potential $V_{OUT}$ corresponding to the difference between $V_{IN}$ and $V_{REF}$ is taken out from the drain of Q301, and a large-amplitude signal ($V_{OUT}$) of the TTL or CMOS level is obtained from the input signal ($V_{IN}$) of a very small amplitude as shown in FIG. 10. Here, $V_{OUT(INV)}$ is a $V_{OUT}$ which is inverted through the inverter gate 365.

When $V_{IN}$ has a frequency (second frequency) which is smaller than 50 MHz, the input impedance of the low-potential side transistor Q305 and the high-potential side transistors Q306, Q308 becomes capacitive as viewed from $V_{IN}$. That is, the presence of R301 and R302 can be neglected and, hence, either the Q305 side or the Q306 and Q307 side is turned on depending upon the logic of $V_{IN}$.

Therefore, the power source feeder passage to the differential amplifier unit 360 is interrupted, and the operation of the differential amplifier unit 360 is inhibited. This makes it possible to avoid the electric power from being wastefully consumed by the differential amplifier unit 360 during the low-speed data transfer operation (i.e., during the large-amplitude signal transfer operation).

Under the inhibited condition, when $V_{IN}$ has, for instance, the H-logic (H-logic of the TTL or CMOS level since $V_{IN}$ has the second frequency), Q305 is turned on, Q306 and Q307 are turned off, and the potential $V_{OUT}$ is pulled down to $V_{ss}$ via Q305 and Q301. Or, conversely, when $V_{IN}$ has the L-logic, Q305 is turned off, Q306 and Q307 are turned on, and the potential $V_{OUT}$ is pulled up to $V_{cc}$ via Q306, Q307 and Q301.

Figure 11:
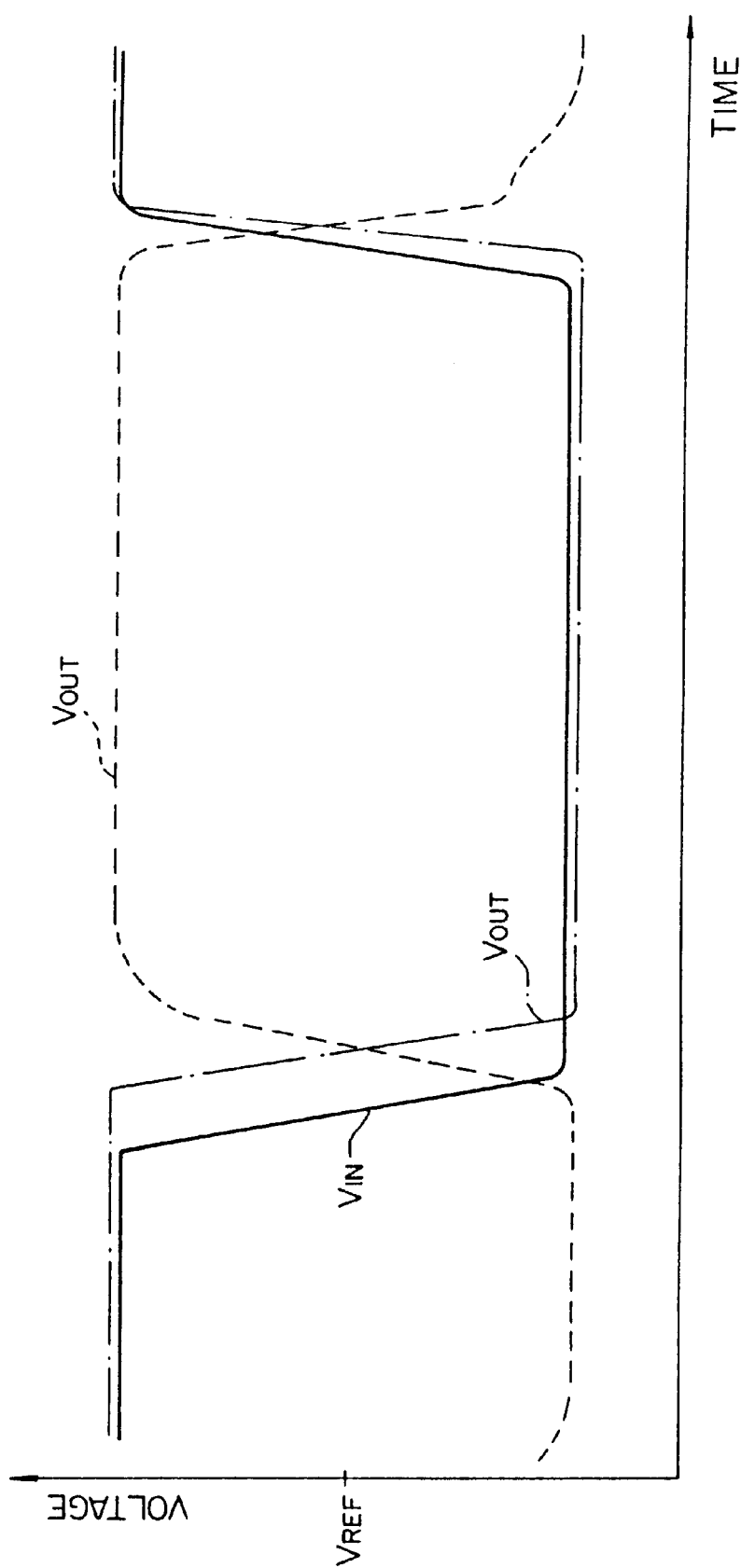
FIG. 11 is a diagram of waveforms of when a signal of a large amplitude is input to the input circuit of the embodiment of the second aspect of the present invention.

As shown in FIG. 11, therefore, from the input signal ($V_{IN}$) of the TTL or CMOS level (large amplitude) can be formed a large-amplitude signal ($V_{OUT}$) of an equivalent level which can then be taken in by the chip without any interruption.

By optimizing the threshold values of Q305, Q306 and Q307, the control circuits 363 and 364 in the above embodiment can be omitted.

Figure 12:
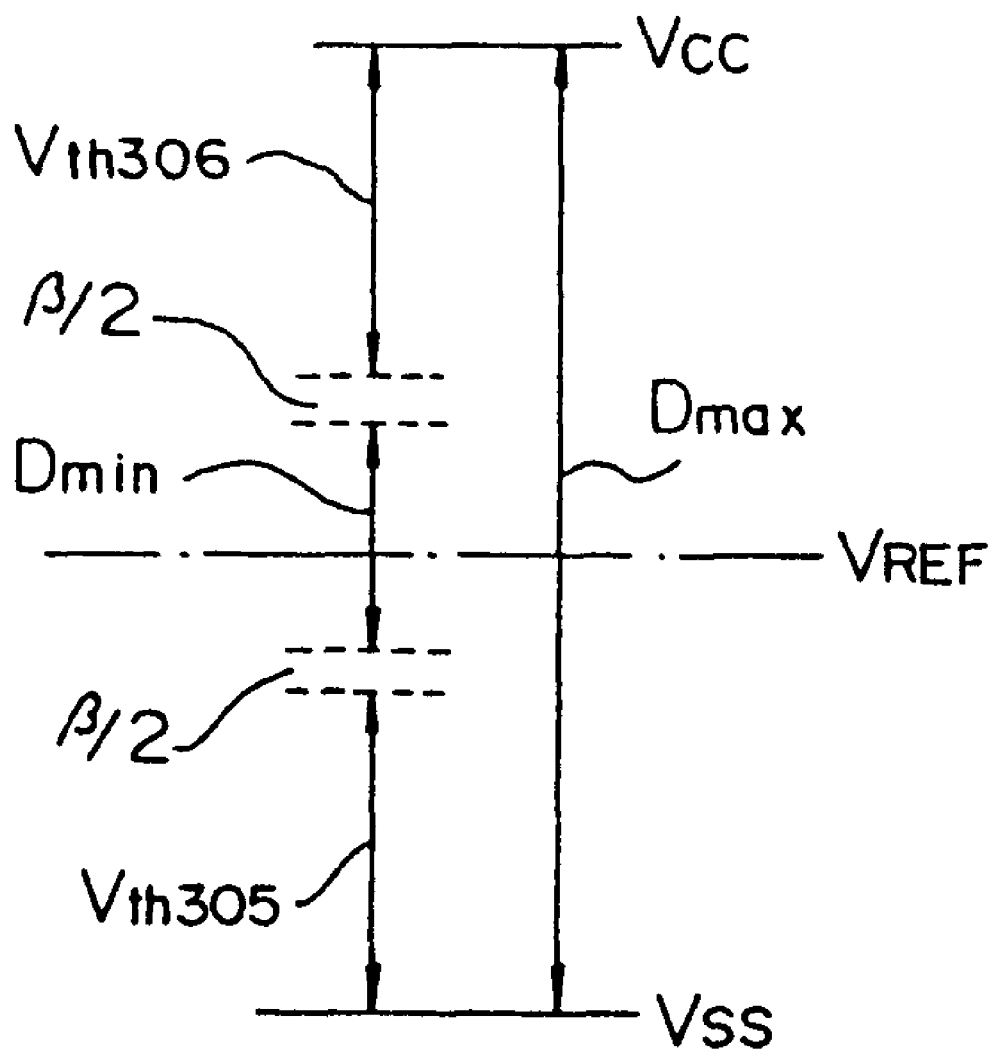
FIG. 12 is a diagram of threshold values Vth305 and Vth306 for the logic amplitude of the input signal in the embodiment of the second aspect of the present invention.

FIG. 12 is a diagram of a threshold value of Q305 (conveniently denoted by Vth305) and a threshold value of Q306 and Q307 (conveniently denoted by Vth306) for the logic amplitudes (very small amplitude Dmin and large amplitude Dmax) of the input signal $V_{IN}$.

If Vth305 and Vth306 are so designed as to establish the following relationship (2), $$Vth306 + Vth305 + Dmin + \beta = Dmax \quad (2)$$

where β denotes an operation margin, then, Q305, Q306 and Q307 are all turned on when $V_{IN}$ has a very small amplitude (high-speed data transfer) to permit the operation of the differential amplifier unit 360. When $V_{IN}$ has a large amplitude (low-speed data transfer), on the other hand, either the Q305 side or the Q306, Q307 side is turned on depending on the logic state of $V_{IN}$ in order to inhibit the operation of the differential amplifier unit 360.

Figure 13:
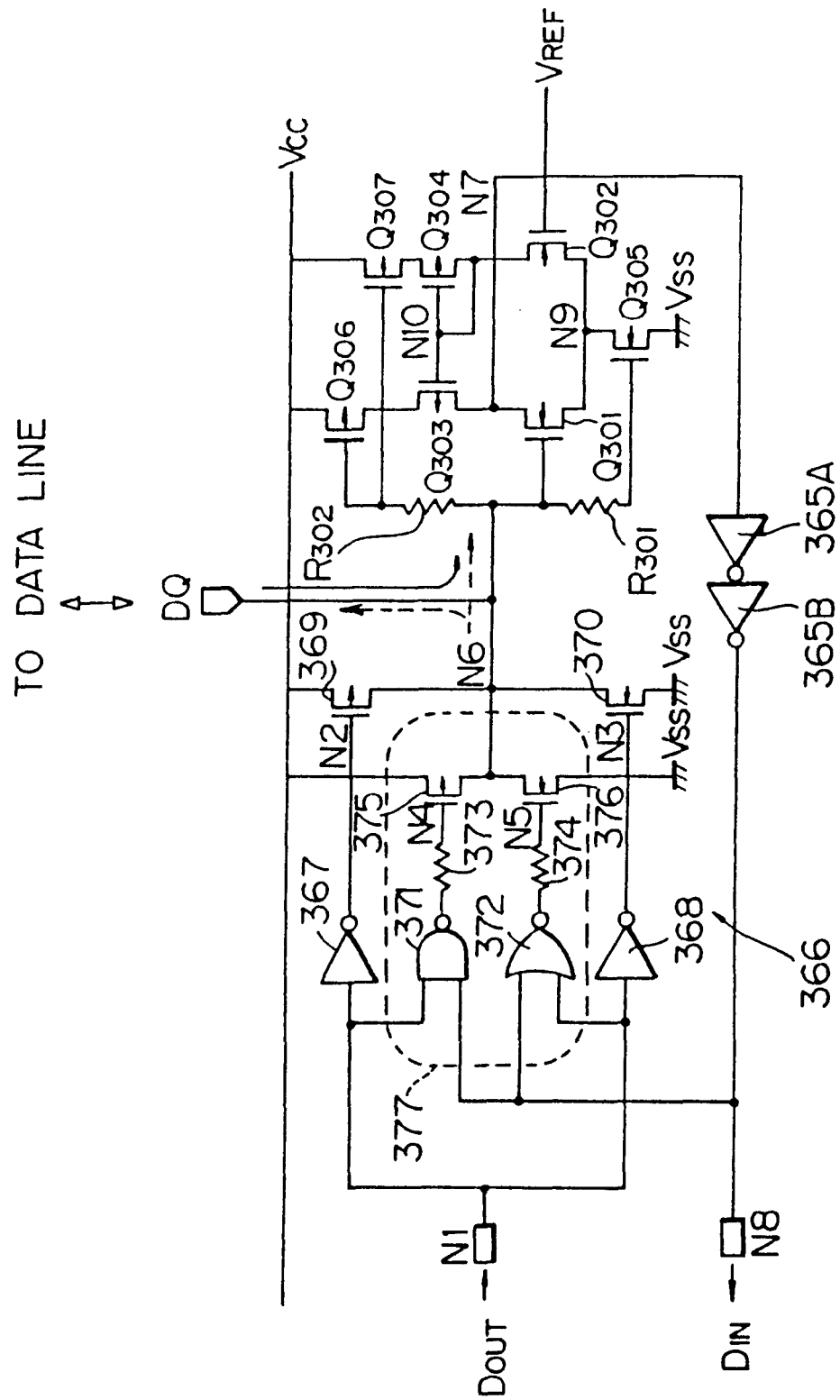
FIG. 13 is a diagram illustrating the constitution of an input/output circuit inclusive of the input circuit of the embodiment of the second aspect of the present invention.
Figure 14:
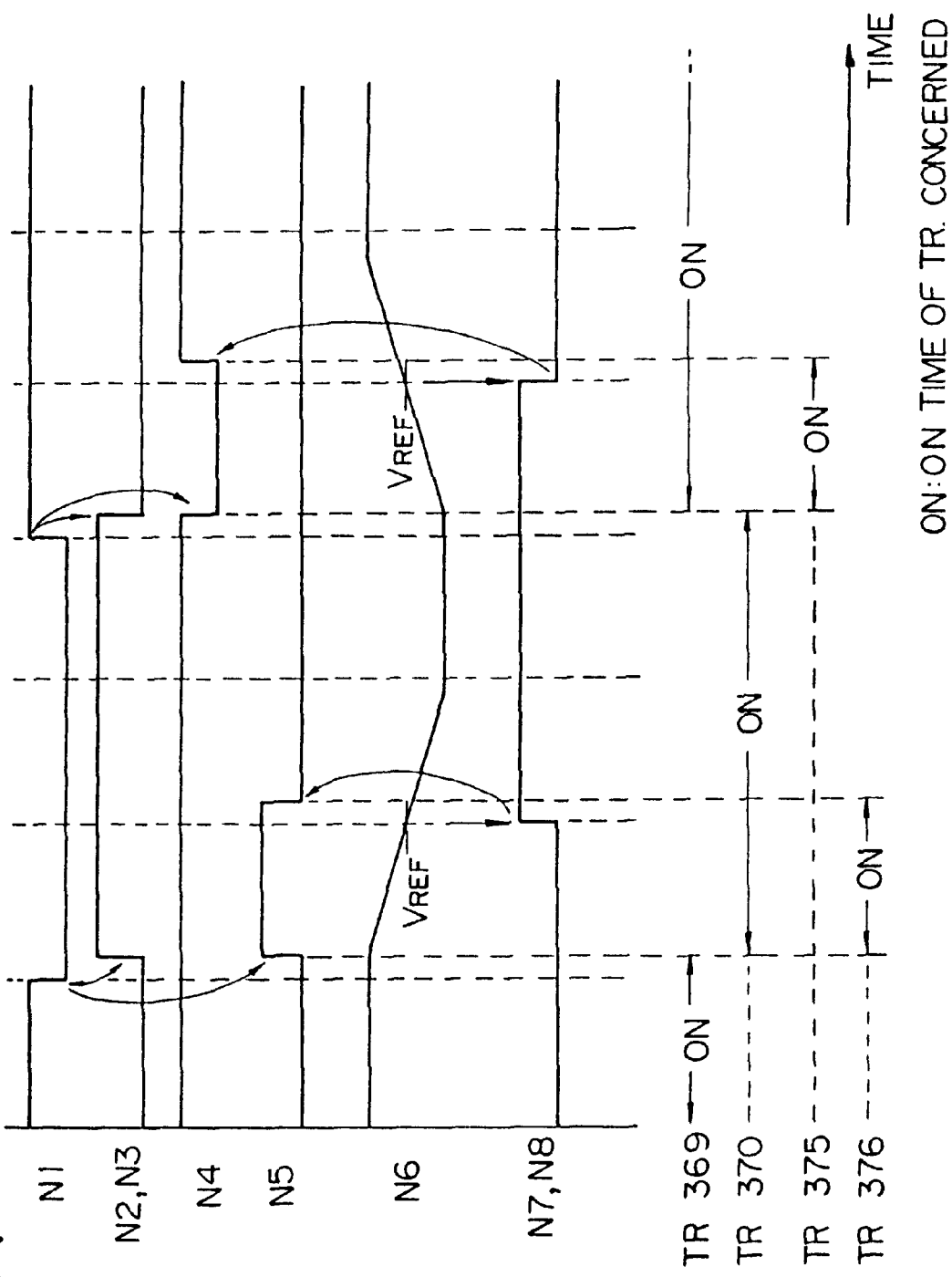
FIG. 14 is a diagram of operation waveforms of the input/output circuit of FIG. 13.

FIG. 13 is a diagram illustrating the constitution of an input/output circuit in the chip that includes the input circuit explained in the above embodiment. An output circuit 366 gives a signal $D_{OUT}$ from inside the chip to output transistors 369 and 370 of the push-pull constitution via two inverter gates 367 and 368, and further gives it to an accelerator circuit 377 which comprises an AND gate 371, a NOR gate 372, resistors 373 and 374, and transistors 375 and 376. Here, symbol N1 denotes an input node of the output circuit 366, N2 denotes a node of the gate of one output transistor 369, N3 denotes a node of the gate of the other output transistor 370, N4 denotes a node of the gate of one transistor 375 constituting the accelerator circuit 377, N5 denotes a node of the gate of the other transistor 376 constituting the accelerator circuit 377, N6 denotes an output node of the output circuit (which also is an input node of the input circuit), and N7 to N10 denote nodes of the input circuit.

If, now, $D_{OUT}$ changes from, for example, the H-logic to the L-logic, the nodes N2 and N3 change from the L-logic to the H-logic, and the one transistor 369 is turned off from the turned-on condition and the other output transistor 370 is, conversely, turned on from the turned-off condition.

Therefore, the level at the node N6 tends to be pulled down to $V_{ss}$ via the transistor 370. Here, a data line having a large capacitance is connected to an I/O terminal DQ of the chip, and the potential at the node N6 changes more slowly than a change of $D_{OUT}$. In terms of the time, however, this change is as short as of the order of nanoseconds, and the occurrence of ringing and the like cannot be suppressed.

According to the constitution of FIG. 13, the ringing can be eliminated relying upon the cooperation of the input circuit and the acceleration circuit 377. That is, in FIGS. 13 and 14, a change of drop at the node N6 is monitored by the input circuit, and the L-logic (level at the node N8) is kept produced from the input circuit until the L-logic of the TTL or CMOS level is fixed. The node N8 is also connected to the accelerator circuit 377 and, during this period, the transistor 376 of the low power source $V_{ss}$ side is turned on between the two transistors of the accelerator circuit 377. Therefore, the data line outside the chip connected to the I/O terminal DQ is double-driven by the two transistors 370 and 376, so that the potential drop at the node N6 is promoted. When the level at the node N6 is fixed to the L-logic (i.e., becomes smaller than $V_{REF}$) after the passage of a predetermined period of time, the H-logic is output from the input circuit, and the transistor 376 of the accelerator circuit 377 is turned off.

Therefore, the data line outside the chip connected to the I/O terminal DQ is single-driven by one output transistor 370; i.e., the potential change at the node N6 becomes mild, and waveform distortions such as ringing and the like are avoided.

Figure 15:
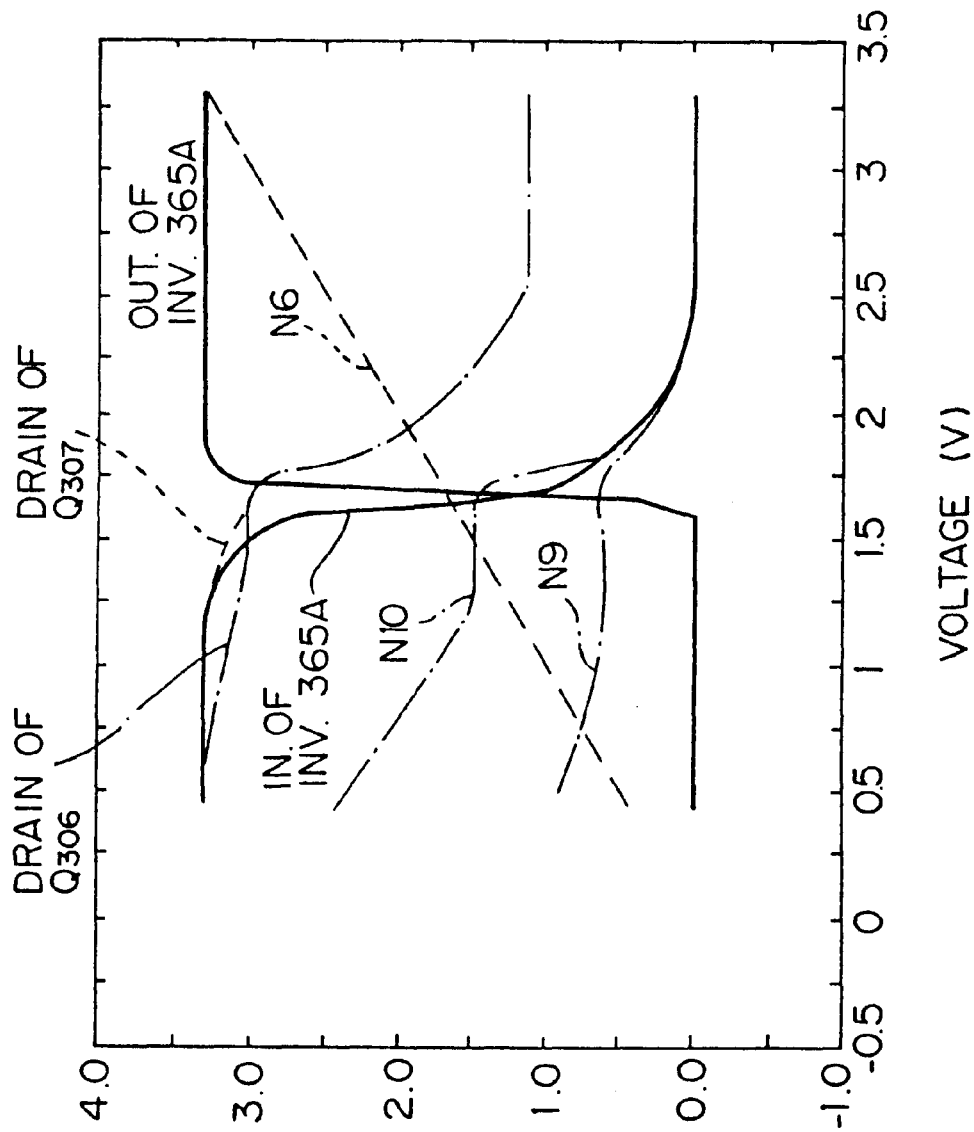
FIG. 15 is a diagram of operation waveforms of the input circuit included in the input/output circuit of FIG. 13.

FIG. 15 is a diagram of voltage waveforms at each portions of the input circuit. This waveform diagram shows the condition where the level at the node N6 changes from the L-logic into the H-logic at the second frequency. When the level at N6 is in the L-logic region, Q306 is turned on, and the H-logic corresponding to $V_{cc}$ is output via Q306 and Q303 (see input waveform of inverter 365A). When the level at the node N6 changes into the H-logic region, Q305 is then turned on, and the L-logic corresponding to $V_{ss}$ is output via Q305 and Q301. The logic amplitude at the node N6 and the amplitude of input waveform of the inverter 365A are both of the TTL level or the CMOS level.

Figure 16:
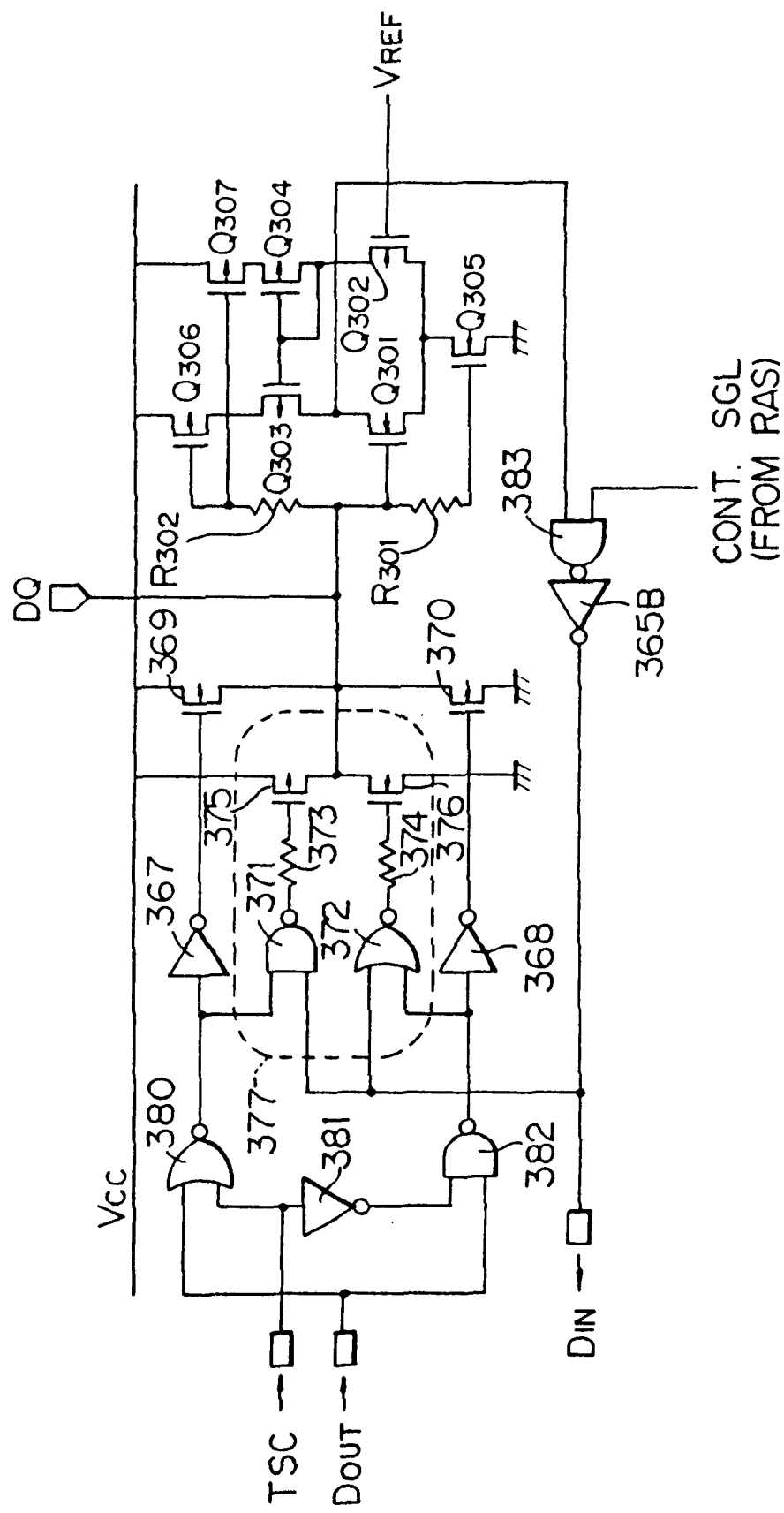
FIG. 16 is a diagram illustrating the constitution of a preferred improvement of the input/output circuit of FIG. 13.

Here, FIG. 13 may be improved as shown in FIG. 16. This improvement is provided with a NOR gate 380, an inverter gate 381 and a NAND gate 382 in order to restrict the data $D_{OUT}$ from being taken in by the output circuit in response to a predetermined control signal TSC (tri-state control), and is further provided with a NAND gate 383 which restricts the output from the input circuit in response to a predetermined control signal (e.g., signal formed by RAS). This improvement makes it possible to reliably avoid the generation of undesired input and output signals caused by noise and the like.

Figure 17:
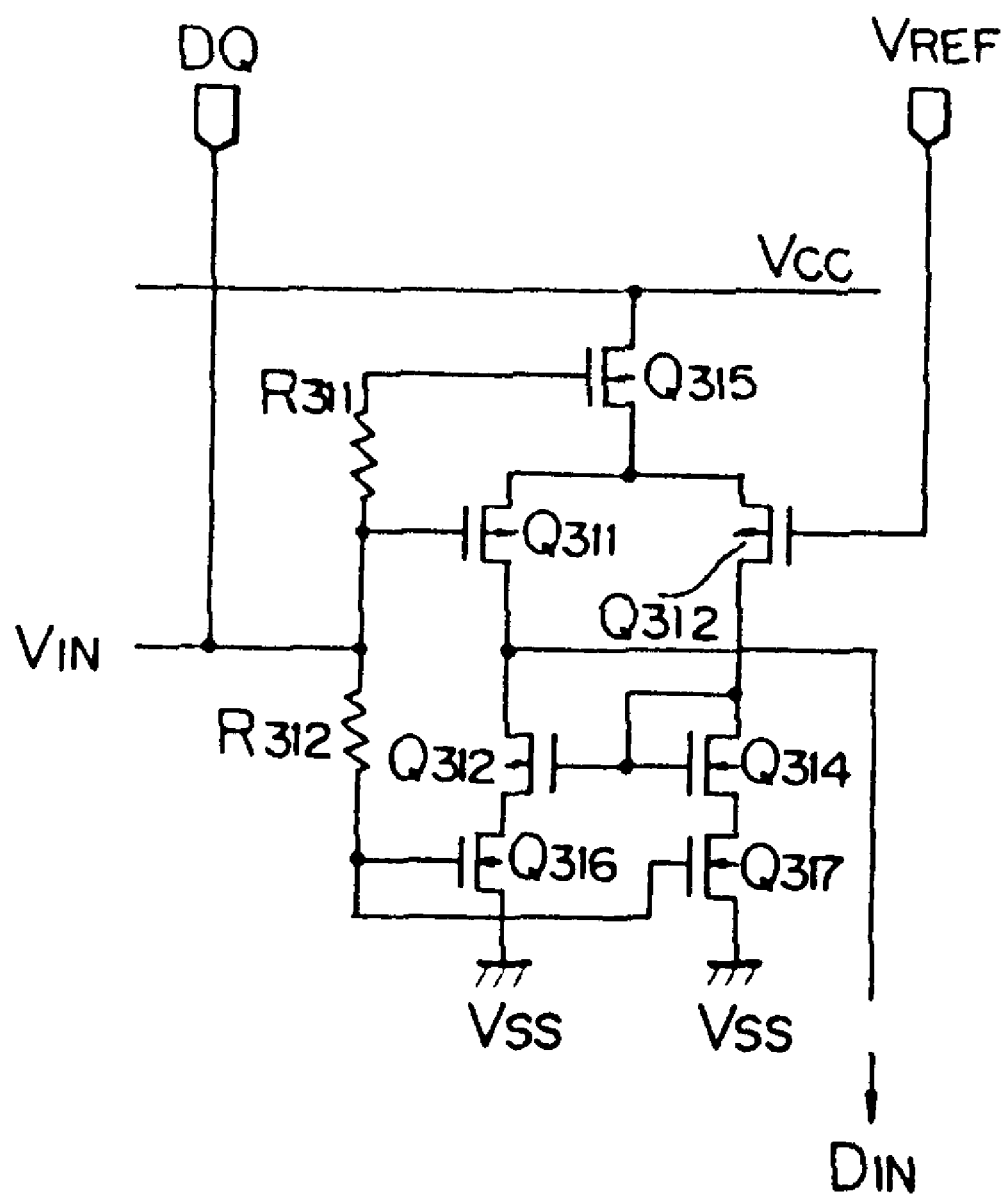
FIG. 17 is a diagram illustrating another constitution of a differential amplifier circuit included in the input/output circuit of FIG. 13 or 16.

Or, the types (P-channel type, N-channel type) of the transistors constituting the differential amplifier circuit included in the input/output circuit of FIG. 13 or 16 may be replaced as shown in FIG. 17, wherein symbols Q311, Q312 and Q315 denote P-channel type MOSFETs, symbols Q313, Q314, Q316 and Q317 denote N-channel type MOSFETs. This constitution makes it possible to obtain the same operation as that of the aforementioned embodiments, and further gives a merit in that the gain of the input differential amplifier stage drops little even when the reference voltage $V_{REF}$ is set to a relatively low voltage (e.g., about 0.8V) since a sufficiently large bias voltage is applied across the gate and the source.

Figure 18:
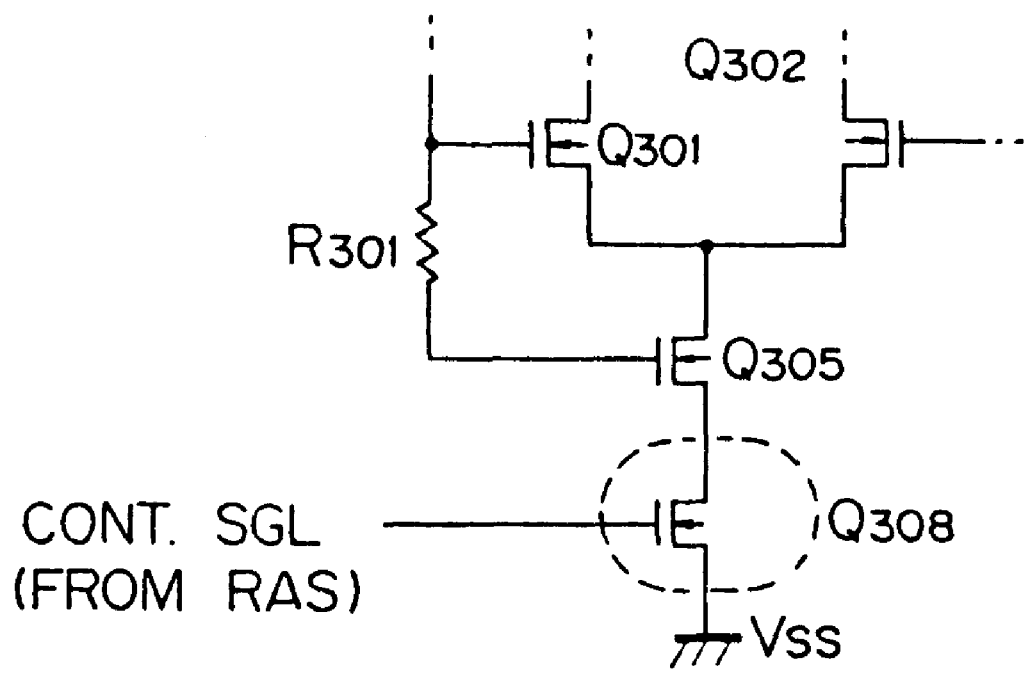
FIG. 18 is a diagram illustrating the constitution of another preferred improvement of the input/output circuit of FIG. 13.

Or, as shown in FIG. 18, a transistor Q308 may be inserted in series with the low-potential side transistor Q305 of the input circuit and may be turned on or off in response to a predetermined control signal (e.g., a signal prepared from RAS). This gives an advantage in that the power source for the input circuit can be cut off during the standby state to suppress the consumption of electric power in addition to avoiding the generation of undesired input signals due to noise and the like.

Figure 19:
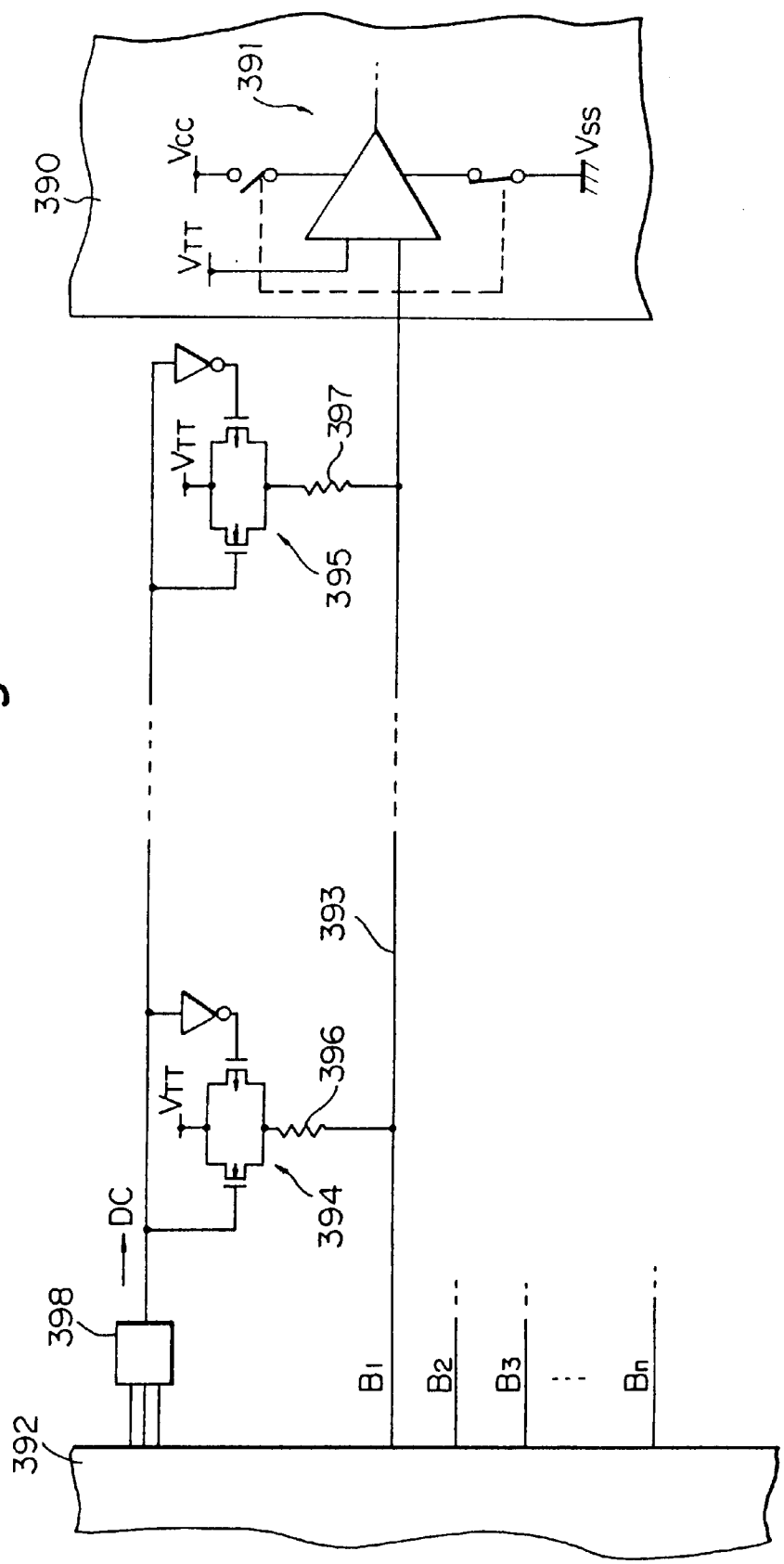
FIG. 19 is a diagram illustrating the constitution of a data transfer circuit which includes the input circuit of the embodiment of the second aspect of the present invention.

FIG. 19 is a diagram illustrating the constitution of a data transfer circuit that includes the aforementioned input circuit. In FIG. 19, reference numeral 390 denotes an LSI chip (e.g., DRAM) which includes an input circuit (see FIG. 7 or 8), and 392 denotes a CPU. Data (or which may be addresses) of bit B1 to bit Bn are input to or output from the CPU 392. The bits of the data are transferred to the LSI chip 390 and other chips via data lines (a data line 392 for the bit B1 is representatively shown here). Terminal resistors 396 and 397 are connected between the data lines 393 and a predetermined power source line $V_{TT}$ (power source line having an intermediate potential between $V_{cc}$ and $V_{ss}$, e.g., +1.65V) via CMOS switches (switching means) 394 and 395 which are turned on when a decoding signal DC from a decoder (on/off control means) 398 represents the high-speed transfer mode (transfer mode of a frequency greater than 50 MHz) and are turned off when the decoding signal DC represents the low-speed transfer mode (transfer mode of a frequency smaller than 50 MHz).

When the data of the first frequency of the aforementioned embodiment are to be transferred using this system, therefore, the amplitude can be decreased to be very small using the terminal resistors 396 and 397 to obtain a transfer waveform that is suited for high-speed transfer operation. When the data of the second frequency of the aforementioned embodiment are to be transferred, on the other hand, the terminal resistors 396 and 397 are removed to expand the amplitude, and the power loss due to the terminal resistors 396 and 397 is avoided to improve power efficiency. That is, since the constitution of the data transfer passage is suitably changed depending upon the instruction from the CPU that determines the frequency of the transferred data, it is allowed to realize a convenient and favorable data transfer circuit that can be used for both the application where importance is placed on the processing speed out and the application where importance is placed on the power efficiency.

Figure 20:
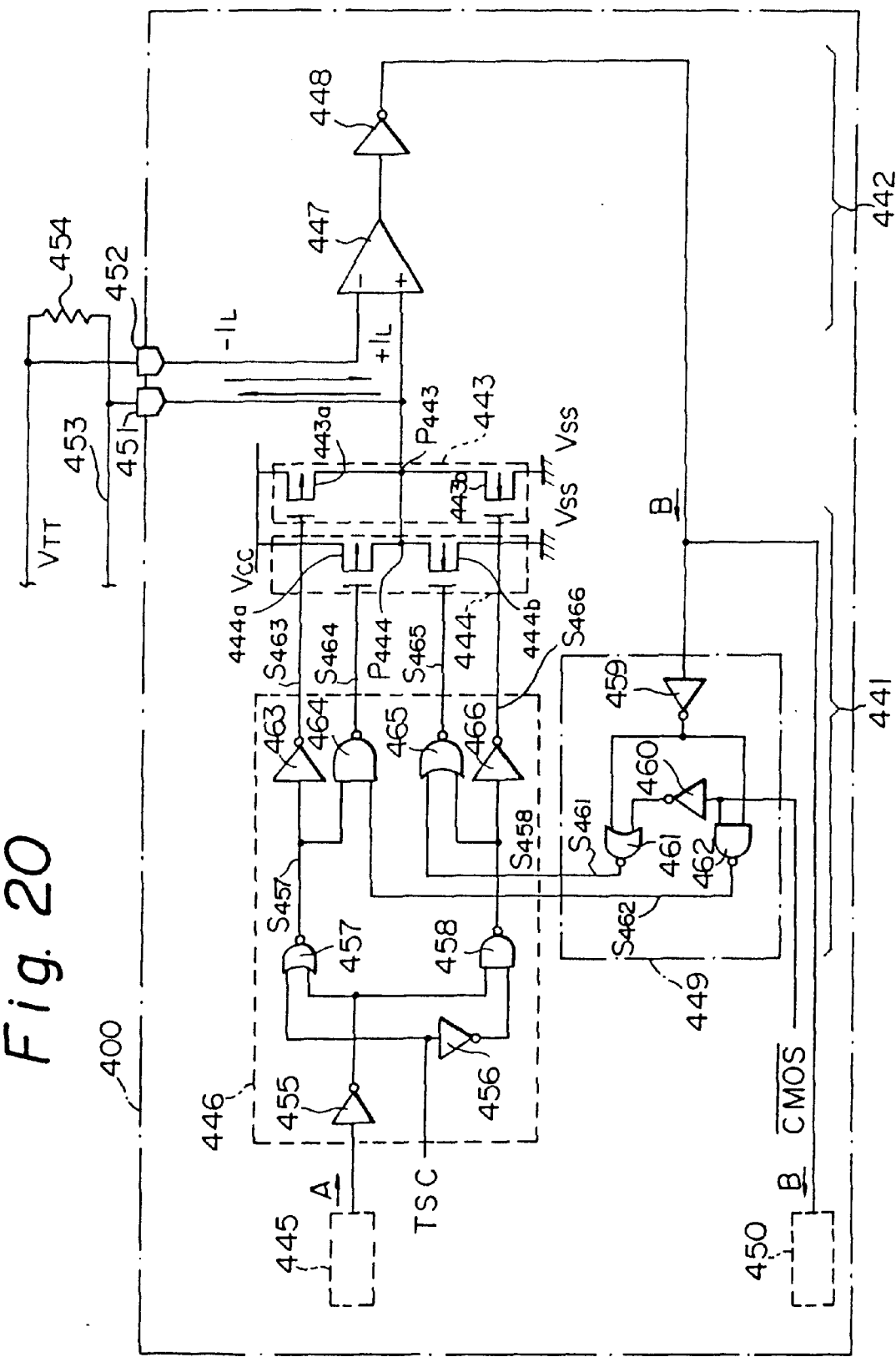
FIG. 20 is a diagram illustrating the constitution of a first embodiment of the first aspect of the present invention.
Figure 21:
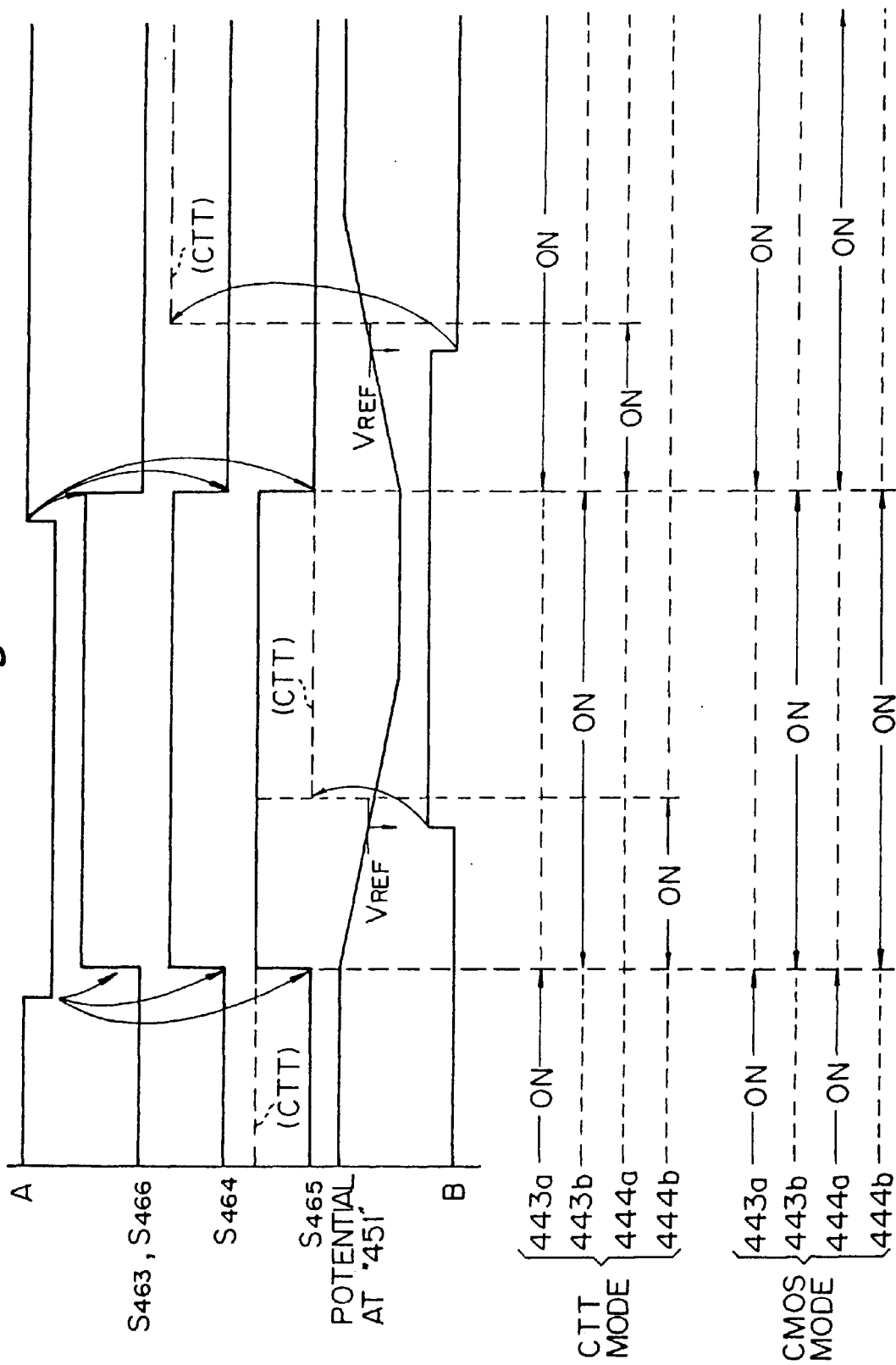
FIG. 21 is a time chart of the first embodiment of the first aspect of the present invention.
Figure 22:
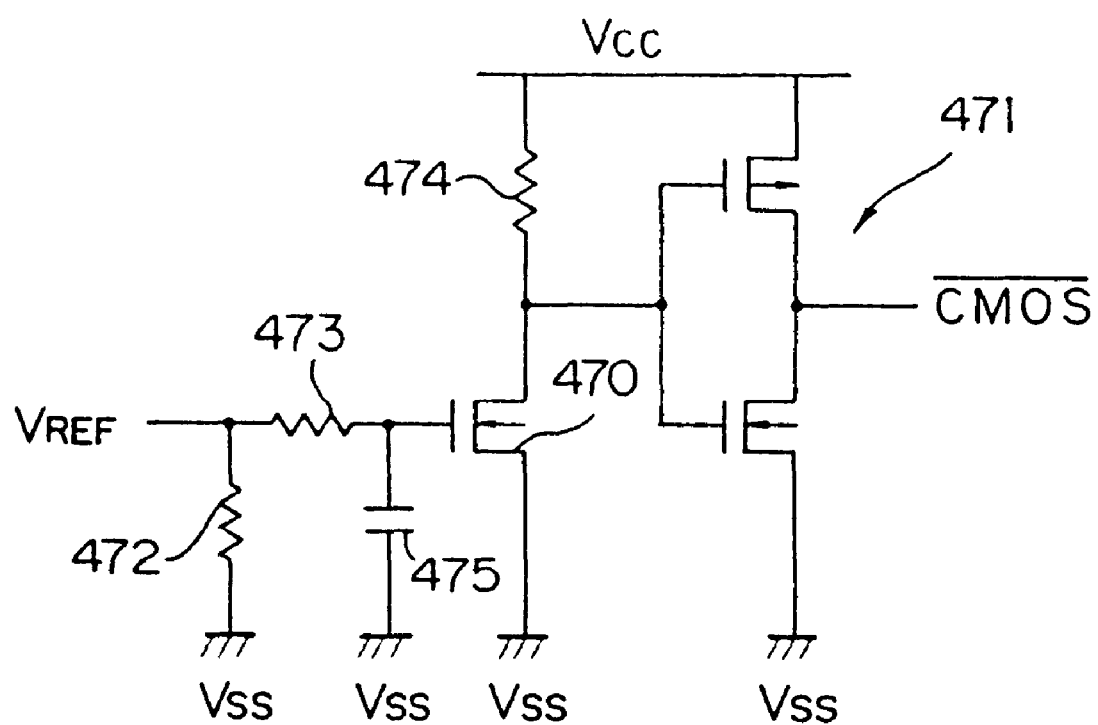
FIG. 22 is a diagram of a circuit for automatically forming a mode designation signal CMOS in the first aspect of the present invention.

FIGS. 20 to 22 are diagrams illustrating a first embodiment of a semiconductor integrated circuit according to the present invention, which can be used for both the CTT and the CMOS.

The constitution will be described, first. In FIG. 20, reference numeral 440 denotes a chip of the semiconductor integrated circuit on which is mounted a transceiver circuit made up of an output buffer 441 and an input buffer 442. The output buffer 441 comprises a first CMOS unit 443 consisting of a first PMOS transistor 443a and a first NMOS transistor 443b connected in series between the high-potential side power source $V_{cc}$ and the low-potential side power source $V_{ss}$, a second CMOS unit 444 consisting of a second PMOS transistor 444a and a second NMOS transistor 444b connected in series between $V_{cc}$ and $V_{ss}$, an on/off control means 446 which controls the on/off operation of these four MOS transistors 443a, 443b, 444a and 444b based on a signal (conveniently denoted by A) from a circuit 445 in the chip and a tri-state control signal (signal which, when it has the H-level, designates a high output impedance) TSC, and a mode control means 449 which switches the operation modes of said first CMOS unit 443 and said second CMOS unit 444 based on a predetermined mode designation signal (signal which, when it has the L-level, designates the CMOS transfer mode) $\overline{\text{CMOS}}$ and a signal (conveniently denoted by B) from the input buffer 442 that includes a differential amplifier unit 447 and an inverter gate 448. Reference numeral 450 denotes a circuit in the chip which receives a signal B from the input buffer 442, reference numeral 451 denotes an input/output terminal, and 452 denotes a reference voltage terminal. The input/output terminal 451 is connected to both a point P443 at which the first PMOS transistor 443a and the first NMOS transistor 443b are connected together and a point 444 at which the second PMOS transistor 444a and the second NMOS transistor 444b are connected together, and is further connected to a signal line 453 on the outside of the chip 440. When the chip 440 is used in the transfer mode (first transfer mode) of the CTT level, the input/output terminal 451 is served, via the terminal resistor 454 (the resistance is 25Ω with two terminal resistors), with the predetermined constant voltage $V_{TT}$ ($V_{TT}=V_{cc}/2$, i.e., +1.5V when $V_{cc}$ is +3V) which is further applied to the reference voltage terminal 452.

[CTT Operation]

In the above constitution, the level of the signal B is determined by a potential relation between the inverted input (−) and the non-inverted input (+) of the differential amplifier unit 447. That is, since the potential of the inverted input (−) is $V_{TT}$=+1.5V, the output (signal B) of the inverter gate 448 assumes the L-level when the potential of the non-inverted input (+) exceeds +1.5V or, in other words, when the logic at the input/output terminal 451 is fixed to the H-level, and the signal B assumes the H-level when the potential becomes smaller than +1.5V or, in other words, when the logic at the input/output terminal 451 is fixed to the L-level.

If now the signal A changes from the L-level into the H-level (but the signal TSC remains at the L-level), the output of the inverter gate 455 in the on/off control means 446 assumes the L-level and the output of the inverter gate 456 assumes the H-level. Therefore, the output S457 of the NOR gate 457 and the output S458 of the AND gate 458 both assume the H-level. Immediately after the signal A has changed from L into H, the signal B has the H-level (since the input/output terminal 451 has the L-level) and, besides, the signal CMOS has the H-level during the CTT operation. Therefore, outputs of the inverter gates 459 and 460 in the mode control means 449 both assume the L-level. Accordingly, the NOR gate 461 and the NAND gate 462 simply operate as inverter gates and their outputs S461 and S462 both assume the H-level like the signal B.

Accordingly, the output S463 of the inverter gate 463 in the on/off control means 446, the output S464 of the NAND gate 464, the output S465 of the NOR gate 465, and the output S466 of the inverter gate 466 all assume the L-level. Therefore, the first PMOS transistor 443a and the second PMOS transistor 444a in the two stages of CMOS units 443 and 444 are both turned on, and the first NMOS transistor 443b and the second NMOS transistor 444b in the CMOS units 443 and 444 are both turned off, permitting a current +$I_L$ to flow in the direction of "$V_{cc}$→first PMOS transistor 443a and second PMOS transistor 444a→terminal resistor 454→$V_{TT}$". As the signal B is inverted into the L-level at a moment when the potential of the non-inverted input (+) of the differential amplifier unit 447 becomes higher than the potential of the inverted input (−) by $I_L \times R_L$ ($R_L$ denotes the value of the terminal resistor 454, e.g., 25Ω), i.e., at a moment when the logic (H-level of CTT) is fixed at the input/output terminal 451, than, both the two outputs S461 and S462 from the mode control means 449 change into the L-level, and the output S464 of the AND gate 464 in the on/off control means 446 assumes the H-level. After the logic of the input/output terminal 451 is fixed, therefor, the drive current +$I_L$ is supplied by the first PMOS transistor 443a only.

As the signal A changes from the H-level into the L-level (but the signal TSC remains at the L-level), on the other hand, the output of the inverter gate 455 of the on/off control means 446 assumes the H-level, and both the output S457 of the NOR gate 457 and the output S458 of the AND gate 458 assume the L-level. Immediately after the signal A has changed from H into L, the signal B has the L-level. Therefore, the output of the inverter gate 459 of the mode control means 449 assumes the H-level, and both the output S461 of the NOR gate 461 and the output S462 of the NAND gate 462 assume the L-level.

Therefore, the output S463 of the inverter gate 463 in the on/off control means 446, the output S464 of the NAND gate 464, the output S465 of the NOR gate 465, and the output S466 of the inverter gate 466 all assume the H-level. Contrary to the above-mentioned case, therefore, the first PMOS transistor 443a and the second PMOS transistor 444a in the CMOS units 443 and 444 are both turned off, and the first NMOS transistor 443b and the second NMOS transistor 444b in the CMOS units 443 and 444 are both turned on, permitting the current −$I_L$ to flow in the direction of "$V_{TT}$→terminal resistor 454→first NMOS transistor 443b and second NMOS transistor 444b→$V_{ss}$". As the signal B is inverted into the H-level at a moment when the potential of the non-inverted input (+) of the differential amplifier unit 447 becomes lower than the potential of the inverted input (−) by $I_L \times R_L$, i.e., at a moment when the logic (L-level of CTT) is fixed at input/output terminal 451, then both the two outputs S461 and S462 from the mode control means 449 change into the H-level, and the output S465 of the NOR gate 465 in the on/off control means 446 assumes the L-level. After the logic of the input/output terminal 451 is fixed, therefore, the drive current −$I_L$ is supplied by the first NMOS transistor 443b only.

[CMOS Operation]

If the mode designation signal CMOS bar (hereinafter, bar is omitted) is set to the L-level, it is allowed to use the semiconductor integrated circuit 440 on the CMOS level. In this case, the terminal resistor 454 is removed from between the signal line 453 and $V_{TT}$.

As the signal CMOS is set to the L-level, the output S461 of the mode control means 449 is fixed to the L-level and the output S462 is fixed to the H-level irrespective of the logic of the signal B. Accordingly, NAND gate 464 and the NOR gate 465 in the on/off control means 446 simply work as inverter gates and, hence, the two stages of CMOS units 443 and 444 perform on/off operations in parallel in response to the logic of the signal A.

When the signal A changes, for example, from the L-level into the H-level (but the signal TSC remains at the L-level), the four outputs (S463, S464, S465, and S466) of the on/off control means 446 all assume the L-level since S457 and S458 both have the H-level, and the first PMOS transistor 443a and the second PMOS transistor 444a in the two stages of CMOS units 443 and 444 are both turned on. The period in which these two PMOS transistors 443a and 444a are turned on is in agreement with the period in which the signal A assumes the H-level.

During the period in which the signal A has the H-level, therefore, the output terminal 451 is double-driven by the two PMOS transistors 443a and 444a. The same holds even when the signal A has changed into the L-level. In this case, the first NMOS transistor 443b and the second NMOS transistor 444b in the two stages of CMOS units 443 and 444 are both turned on.

During the period in which the signal A has the L-level, therefore, the output terminal 451 is double-driven by the two NMOS transistors 443b and 444b.

FIG. 21 is a time chart for comparing the CTT mode with the CMOS mode. In the CTT mode, the logics of the signals S464, S465, S463 and S466 are in agreement immediately after the signal A has changed until the logic of the signal B is inverted.

In the CTT mode, therefore, the two PMOS transistors 443a and 444a or the two NMOS transistors 443b and 444b are turned on in parallel only during a period of immediately after the signal A has changed until the logic of the signal B is inverted. After this period, the first PMOS transistor 443a only or the first NMOS transistor 444a only is turned on. The amplitude of the signal appearing at the output terminal 451

(i.e., on the signal line 453) is determined by the resistance $R_{ON}$ of the first PMOS transistor 443a or the first NMOS transistor 444a of when it is turned on, the resistance $R_L$ of the terminal resistor 454 and the terminal voltage $V_{TT}$. When, for instance, the signal amplitude is 0.4V, $V_{TT}$ is 1.5V, and $R_L$ is 25Ω, then $R_{ON}$ becomes 68.75Ω from the above equation (1). To satisfy this value $R_{ON}$, the size of the first PMOS transistor 443a or the first NMOS transistor 444a should be set to be about "L=1 μm and W=200 μm".

In the CMOS mode, on the other hand, the logics of the signals S464, S465, S463 and S466 are always in agreement and, besides, the terminal resistor 454 is removed. Accordingly, the amplitude of the signal appearing at the output terminal 451 is determined by the resistances of the two parallel PMOS transistors 443a, 444a or the two parallel NMOS transistors 443b, 444b of when they are turned on. By setting the on-resistance of the first PMOS transistor 443a and the first NMOS transistor 443b to be about 68.75Ω and by setting the on-resistance of the second PMOS transistor 444a and the second NMOS transistor 444b to be as small as possible, therefore, it is allowed to sufficiently decrease the parallel on-resistance and hence to maintain a driving power necessary for the CMOS level.

If the size of the second PMOS transistor 444a and the second NMOS transistor 444b is set to be nearly that of a general CMOS output transistor (e.g., L=1 μm, W=1000 μm), a sufficiently large driving power is obtained from the second PMOS transistor 444a and the second NMOS transistor 444b only, in principle. However, the present invention is in no way limited to the one in which the two MOS transistors are driven in parallel, but may be the one in which the internal resistances of the first PMOS transistor 443a and the first NMOS transistor 443b are set to values suited for the CTT level and the internal resistances of the second PMOS transistor 444a and the second NMOS transistor 444b are set to values suited for the MOS level, so that these two sets of MOS transistors can be used depending upon the CTT level and the CMOS level. The driving power can be further increased if the two sets of transistors are driven in parallel, as a matter of course. Therefore, it is quite natural to employ the above driving method for the CMOS mode.

It is desired that the mode designation signal CMOS is automatically formed by a circuit that is shown in FIG. 22. This circuit monitors the potential (reference potential $V_{REF}$) at the reference potential terminal 452 (see FIG. 20) of the chip 440, and turns the NMOS transistor 470 on so that the output (signal CMOS) of the CMOS inverter gate 471 assumes the H-level when the potential is higher than a threshold voltage of the NMOS transistor 470, i.e., when the terminal voltage $V_{TT}$ (=+1.5V) of CTT is applied to the reference voltage terminal 452, and further turns the NMOS transistor 470 off so that the output (signal CMOS) of the CMOS inverter gate 471 assumes the L-level when the reference voltage terminal 452 is in an open state or has the ground level, i.e., when the terminal voltage $V_{TT}$ of CTT is not applied thereto. Reference numerals 472 to 474 denote resistors, and 457 denote a capacitor. The resistor 472 works to apply the ground level to the gate of NMOS transistor 470 when the reference terminal 452 is opened, and the resistor 473 serves as a load element for the NMOS transistor 470. The resistor 472 and the capacitor 475 constitute an integration circuit which cuts the input noise and prevents erroneous operation of the NMOS transistor 470.

The above circuit enables the CTT mode or the CMOS mode to be used being automatically switched depending upon the potential of the reference voltage terminal 452, i.e., enables the semiconductor integrated circuit to be conveniently used.

Figure 23:
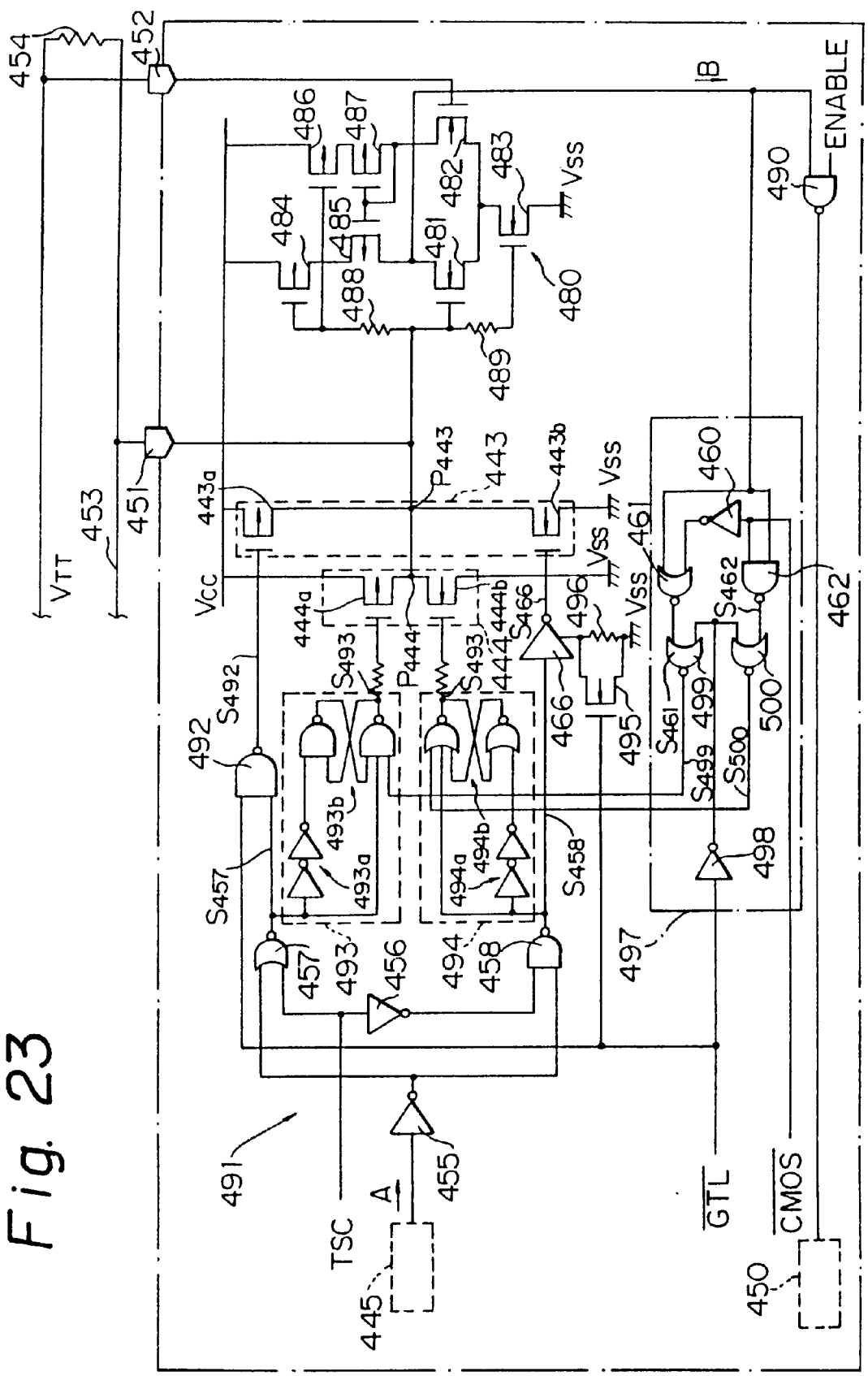
FIG. 23 is a diagram illustrating the constitution of a second embodiment of the first aspect of the present invention.
Figure 24:
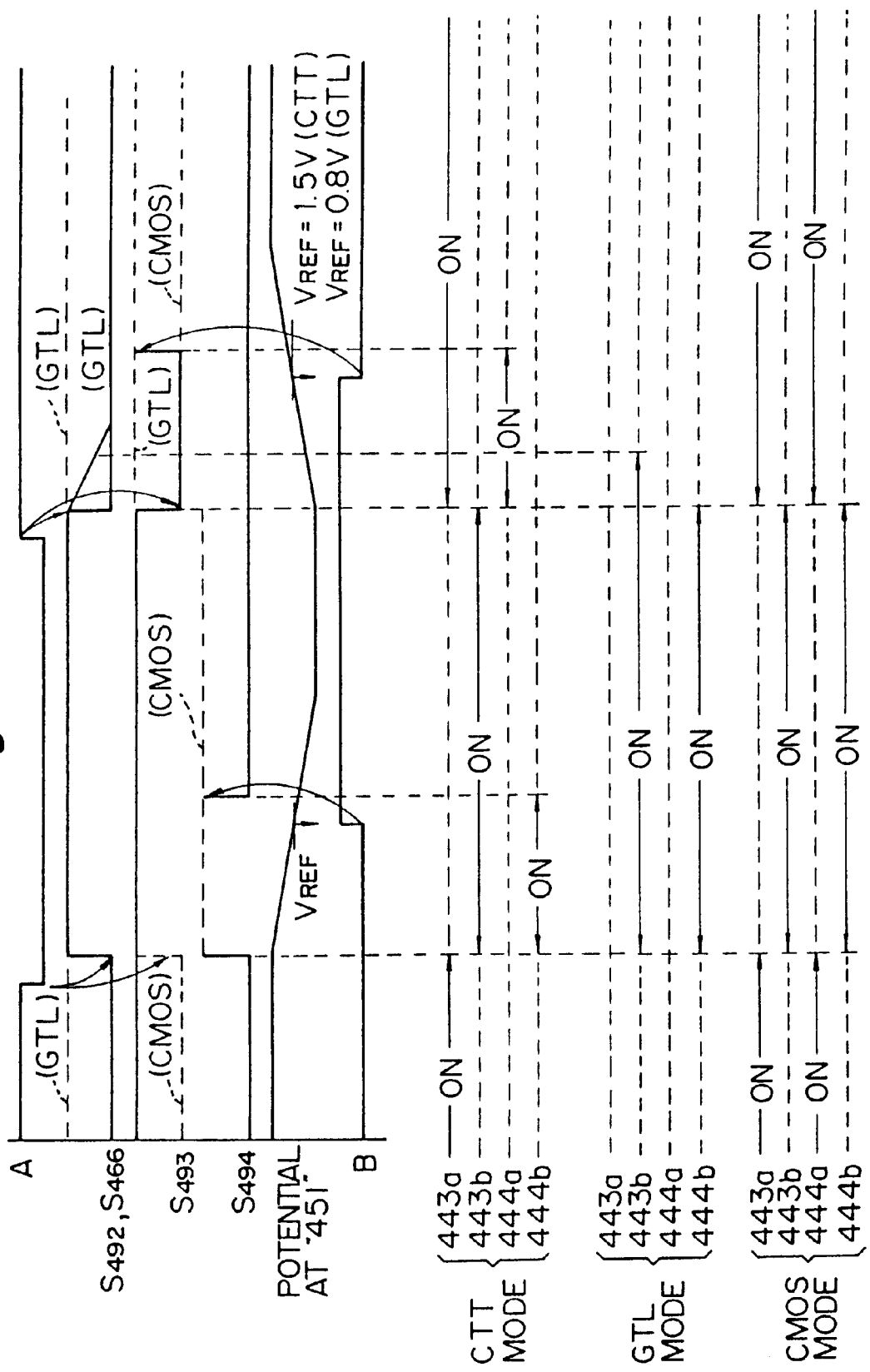
FIG. 24 is a time chart of the second embodiment of the first aspect of the present invention.

FIGS. 23 and 24 are diagrams illustrating the semiconductor integrated circuit according to a second embodiment of the present invention, i.e., the semiconductor integrated circuit that can be used even for the GTL in addition to the CTT and CMOS. The circuit elements common to those of the first embodiment are denoted by the same reference numerals.

The constitution will be described first. In FIG. 23, reference numeral 480 denotes a differential amplifier unit in which the gates of a pair of NMOS transistors 481 and 482 are connected to the input/output terminal 451 and to the reference voltage terminal 452, the sources of the same NMOS transistors 481 and 482 are connected to the low-potential side power source $V_{ss}$ via a constant-current transistor 483, and two PMOS transistors 484 and 485 (486 and 487) are connected between each of the drains of the NMOS transistors 481, 482 and the high-potential side power source $V_{cc}$. The gates of the PMOS transistors 484 and 486 are connected to the input/output terminal 451 via a resistor 488, and the gates of the PMOS transistors 485 and 487 are connected to the drain of the NMOS transistor 482. Furthermore, the gate of the constant-current transistor 483 is connected to the input/output terminal 451 via a resistor 489. In the thus constituted differential amplifier unit 480, a signal (signal B) that is dependent upon a potential relationship between the input/output terminal 451 and the reference voltage terminal 452 is taken out from the drain of the NMOS transistor 481. This signal B assumes the L-level when the potential at the input/output terminal 451 is higher (H-level) than the potential at the reference voltage terminal 452, and assumes the H-level when the potential at the input/output terminal 451 is lower (L-level) than the potential at the reference voltage terminal 452. The signal B is fed to a circuit 450 in the chip via a NAND gate 490 that is controlled by a signal Enable, but can be prevented from being fed to the circuit 450 in the chip during, for example, the standby mode by setting the signal Enable to the L-level.

Reference numeral 491 denotes an on/off control means which is different from the on/off control unit of the first embodiment with respect to using a NAND gate 492 for turning the first PMOS transistor 443a on and off and using so-called chattering-free circuits 493 and 494 for turning the second PMOS transistor 444a and the second NMOS transistor 444b on and off, and further with respect to providing the inverter gate 466 for turning the first NMOS transistor 443b on and off with an additional circuit which consists of an NMOS transistor 495 and a resistor 496. The NAND gate 492 simply works as an inverter gate if the predetermined mode designation signal BTL bar (hereinafter, bar is omitted) has the H-level. That is, the output S492 serves as an opposite logic to the output S457 of the NOR gate 457 in the preceding stage. As the mode designation signal GTL assumes the L-level (GTL mode), however, the output S492 is fixed to the H-level irrespective of the logic of the output S457.

During the period in which the mode designation signal GTL assumes the L-level, therefore, the first PMOS transistor 443a is fixed to the turned-off state. The chattering-free circuits 493 and 494 consist of multi-stage inverter gates 493a(494a) and flip-flops 493b(494b), and inhibit the reception of input for a period of time determined by the multi-stage inverter gates 493a(494a) in order to improve resistance against the noise. The chattering-free circuits 493 and 494 determine their output logic depending upon the logics of the output S457 of the NOR gate 457, output S458 of the NAND gate 458, and two outputs S499 and S500 (described later) of the mode control means 497. An NMOS transistor 495 and a resistor 496 added to the inverter gate 466 so work that, when the mode designation signal GTL has the L-level (GTL mode), the NMOS transistor 495 is turned off and the resistor 496 is inserted in the low-potential power source passage of the inverter gate 466 (i.e., in the gate discharge passage of the first NMOS transistor 443b), in order to retard the cut-off of the first NMOS transistor 443b and to avoid sudden snap-off of the output signal.

The mode control means 497 is different from the mode control means of the first embodiment with respect to removing the inverter gate 459 and adding an inverter gate 498 that inverts the logic of the mode designation signal GTL and two NOR gates 499 and 500. When the mode designation signal GTL has the H-level, the two NOR gates 499 and 500 simply work as inverter gates. When the mode designation signal GTL has the L-level (GTL mode), however, the outputs S499 and S500 of the two NOR gates 499 and 500 are forcibly fixed to the L-level. Here, the output S461 of the inverter gate 461 and the output S462 of the NAND gate 462 have a logic opposite to that of the signal B (becomes opposite to that of the first embodiment since the inverter gate 459 is removed) when the mode designation signal CMOS has the H-level, but are forcibly fixed to the L-level when the mode designation signal CMOS has the L-level.

Therefore, the logics of the outputs S499 and S500 taken out from the mode control means 497 are exclusively determined from the logics of the two mode designation signals GTL, CMOS and of the signal B as shown in Table 1 below.

TABLE 1

| Signal | | | Output | | |
|---|---|---|---|---|---|
| CMOS | GTL | B | S499 | S500 | Mode |
| H | H | H/L | H/L | H/L | CTT |
| L | H | — | H | L | CMOS |
| — | L | — | L | L | GTL |

Each of the modes will be described hereinafter.

[CTT Mode]

The CTT mode is established when both the two mode designation signals CMOS and GTL have the H-level.

Immediately after the signal A has changed from L into H, the signal B has the H-level, and the outputs S499 and S500 taken out from the mode control means 497 both have the H-level from Table 1 above.

Therefore, the output logic of the chattering-free circuits 493 and 494 of the on/off control means 491 becomes opposite to that of the signal A; i,e., since the signal A has the H-level, the outputs S493 and S494 assume the L-level. As a result, the four outputs (S492, S493, S494 and S466) of the on/off control means 491 all assume the L-level, whereby the first PMOS transistor 443a and the second PMOS transistor 444a are turned on, and the input/output terminal 451 is double-driven toward the $V_{cc}$ side. When the logic at the input/output terminal 451 is fixed to the H-level, the signal B is inverted into the L-level, and the outputs S499 and S500 taken out from the mode control means 497 both assume the L-level from Table 1.

After the logic at the input/output terminal 451 is fixed to the H-level, therefore, the output S493 of the chattering-free circuit 493 assumes the H-level, so that the second PMOS transistor 444a is turned off and the input/output terminal 451 is driven by the first PMOS transistor 443a only.

As the signal A changes from the H-level into the L-level, on the other hand, the signal B is still assuming the L-level immediately after the change. Therefore, the outputs S499 and S500 taken out from the mode control means 497 both assume the L-level from Table 1 above.

Therefore, the output S494 assumes the H-level since the output S463 of the chattering-free circuit 493 is fixed to the H-level, and the output S494 of the chattering-free circuit 494 has the logic opposite to that of the signal A which is assuming the L-level. As a result, the four outputs (S492, S493, S494, and S466) of the on/off control means 491 all assume the H-level, whereby the first NMOS transistor 443b and the second NMOS transistor 444b are turned on, and the input/output terminal 451 is double-driven toward the $V_{ss}$ side. Then, as the logic at the input/output terminal 451 is fixed to the L-level, the signal B is inverted into the H-level and, from Table 1 above, the outputs S499 and S500 taken out from the mode control means 497 both assume the H-level.

After the logic of the input/output terminal 451 is fixed to the L-level, therefore, the output S494 of the chattering-free circuit 494 assumes the L-level, whereby the second NMOS transistor 444b is turned off and the input/output terminal 451 is driven by the first NMOS transistor 443b only.

[CMOS Mode]

The CMOS mode is established when the terminal resistor 454 is removed and the mode designation signal CMOS is set to the L-level while maintaining the mode designation signal GTL at the H-level.

In this mode, from the above Table 1, the output S499 taken out from the mode control means 497 is fixed to the H-level and the output S500 is fixed to the L-level irrespective of the signal B.

Therefore, the outputs S493 and S494 of the chattering-free circuits 493, 494 in the on/off control means 491 have a logic opposite to that of the signal A. When the signal A has, for instance, the H-level, then the outputs S493 and S494 have the L-level. As a result, the four outputs (S492, S493, S494 and S466) of the on/off control means 491 all have the logic opposite to that of the signal A. When the signal A has the H-level, therefore, the first PMOS transistor 443a and the second PMOS transistor 444a are both turned on, and the input/output terminal 451 is double-driven toward the $V_{cc}$ side. Or, when the signal A has the L-level, the first NMOS transistor 443b and the second NMOS transistor 444b are both turned on, and the input/output terminal 451 is double-driven toward the $V_{ss}$ side. The driving by the two transistors is continued even after the level is fixed at the input/output terminal 451, i.e., even after the logic of the signal B is inverted, and a large driving force is obtained that its necessary for the CMOS level.

[GTL Mode]

The GTL mode is established when the mode designation signal GTL is set to the L-level. In this case, the logic of the mode designation signal CMOS is neglected. In the GTL mode, the terminal resistor 454 must be attached and the terminal voltage $V_{TT}$ must be set to +0.8V.

In this mode, the two outputs S499 and S500 taken out from the mode control means 497 are both fixed to the L-level from Table 1 above irrespective of the signal B. Therefore, the output S493 of the chattering-free circuit 493 of the on/off control means 491 is fixed to the H-level and the output S492 of the NAND gate 492 of the on/off control means 491 is fixed to the H-level due to the mode designation signal GTL. As a result, the first PMOS transistor 443a and the second PMOS transistor 444a are forcibly cut off, and an open drain is constituted that is necessary for the GTL mode. In the GTL mode, the breaking speed of the output S466 (i.e., gate potential of the first NMOS transistor 443b)

is retarded by utilizing the effect of the resistor 496 attached to the inverter gate 466 when the logic of the input/output terminal 451 is changed from the H-level into the L-level. This is to avoide a sudden snap-off of the output signal by retarding the cut-off of the first NMOS transistor 443b.

FIG. 24 is a time chart of the second embodiment. Any one of the CTT mode, GTL mode or CMOS mode can be used depending upon the combination of the two mode designation signals CMOS and GTL. That is, in the CTT mode, the input/output terminal 451 is driven by the two MOS transistors immediately after the signal A has changed until the output logic is fixed (signal B changes). After the signal B has changed, the input/output terminal 451 is driven by a single MOS transistor. In the GTL mode, the two PMOS transistors are cut off at all times to constitute the open drain. In the CMOS mode, furthermore, the input/output terminal 451 is driven by the two MOS transistors at all times to maintain a sufficiently large driving power.

Figure 25:
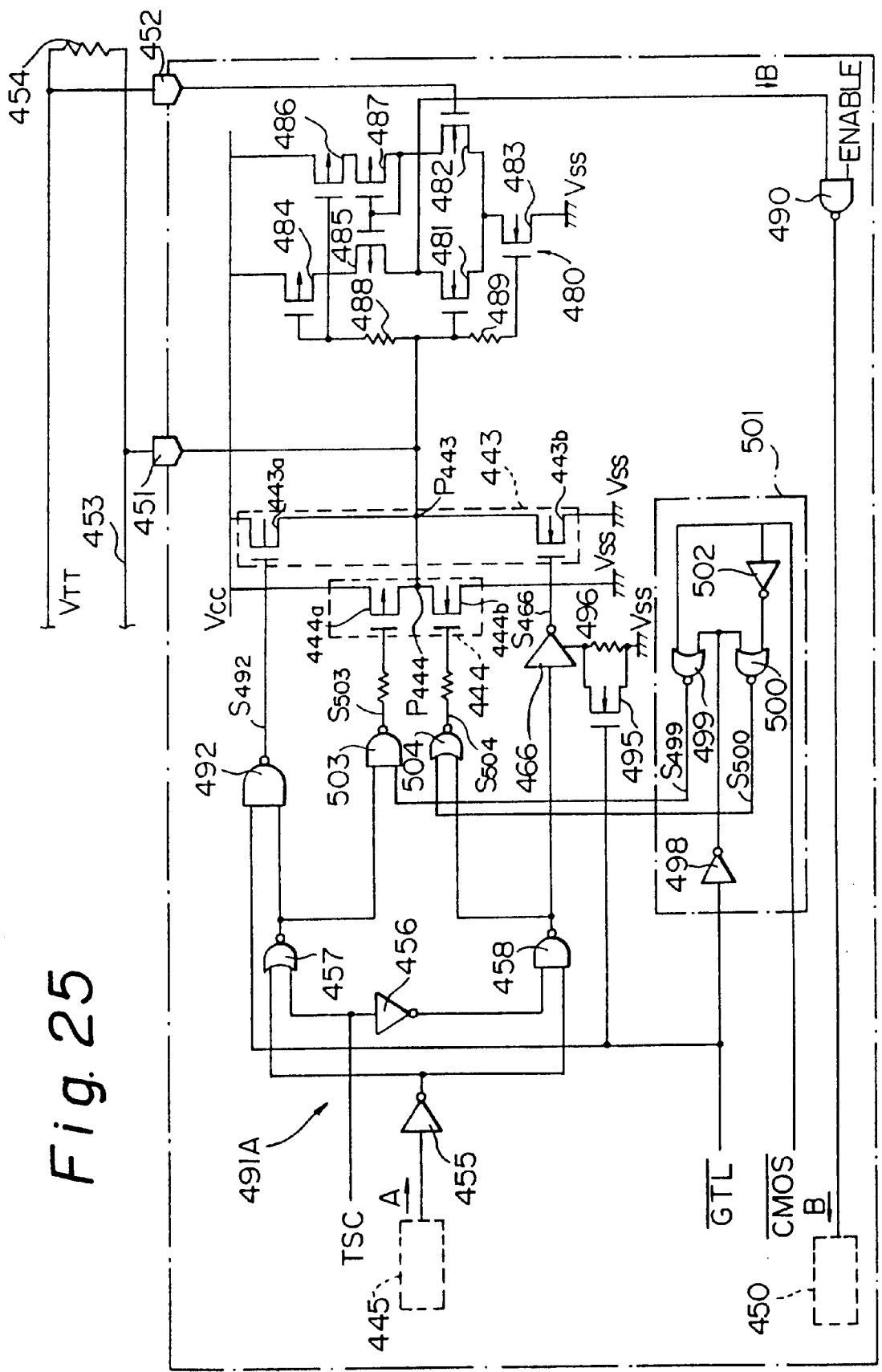
FIG. 25 is a diagram illustrating the constitution of a third embodiment of the first aspect of the present invention.
Figure 26:
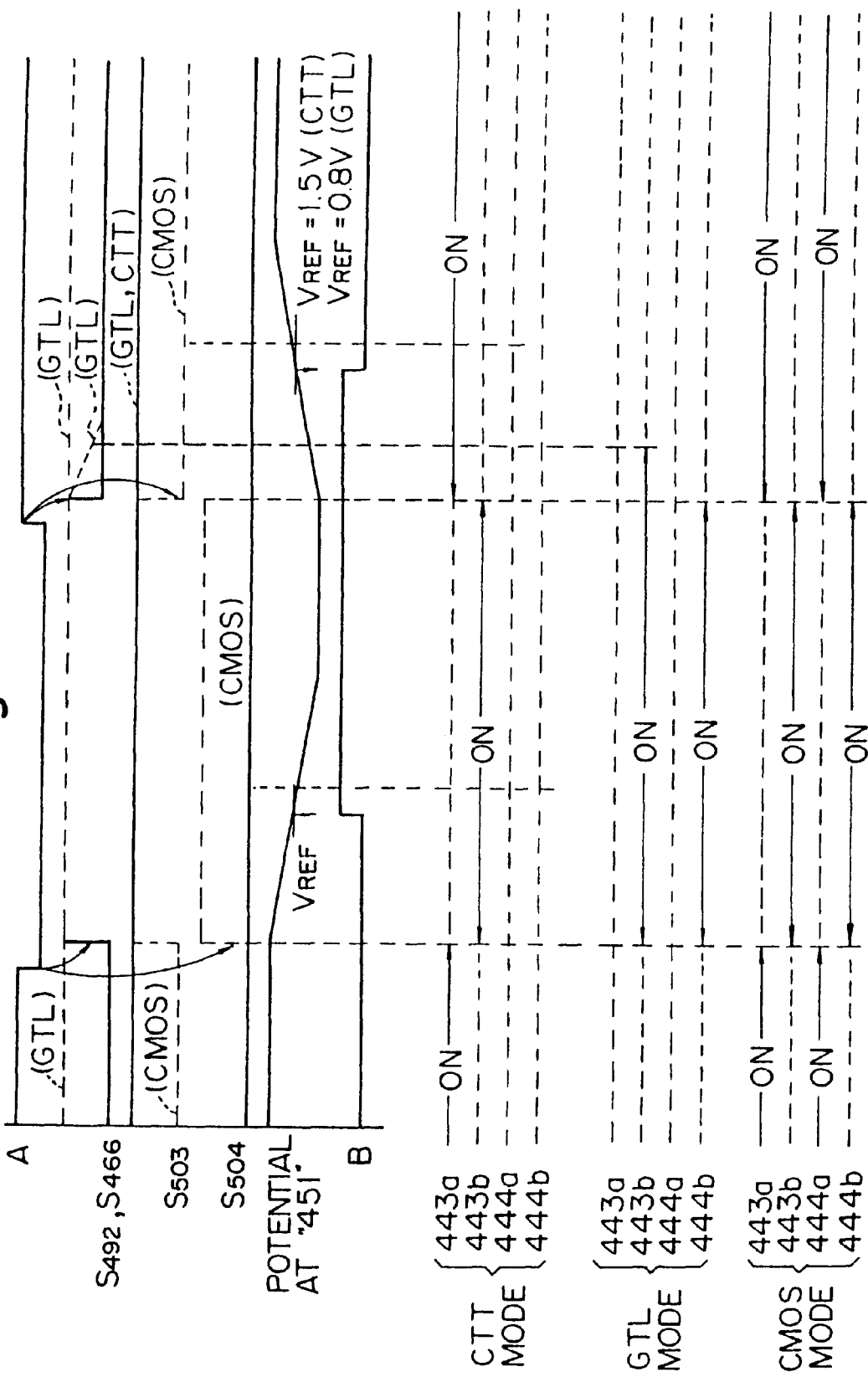
FIG. 26 is a time chart of the third embodiment of the first aspect of the present invention.

FIGS. 25 and 26 are diagrams illustrating the semiconductor integrated circuit according to a third embodiment of the present invention which is a modification from the above second embodiment. In the CTT mode according to this embodiment, the output terminal 451 is driven by using the first PMOS transistor 443a and the first NMOS transistor 443b only.

In FIG. 25, a mode control means 501 renders the output S499 of the NAND gate 499 to assume the logic opposite to that of the mode designation signal CMOS and renders the output S500 of the NAND gate 500 to assume the same logic as that of the mode designation signal CMOS when the mode designation signal GTL has the H-level. When the mode designation signal GTL has the L-level, furthermore, the mode control means 501 fixes the two outputs S499 and S500 to the L-level irrespective of the logic of the mode designation signal CMOS. Here, reference numeral 502 denotes an inverter gate that forms a signal of a logic opposite to that of the mode designation signal CMOS.

These two outputs S499 and S500 are added to the NAND gate 503 and the NOR gate 504 of the on/off control means 491A. The NAND gate 503 simply works as an inverter gate when the output S499 has the H-level, i,e., when the mode designation signal GTL has the H-level and the mode designation signal CMOS has the L-level or, in other words, in the CMOS mode.

Therefore, the output S503 of the NAND gate 503 has the same logic as the signal A in the CMOS mode and is fixed to the H-level in other modes (CTT/GTL). The NOR gate 504 simply works as an inverter gate when the output S500 has the L-level, i.e., when the mode designation signal GTL has the H-level and the mode designation signal CMOS has the L-level, or when the mode designation signal GTL has the L-level. Or, in other words, the NOR gate 504 simply works as an inverter gate in the CMOS mode or in the GTL mode.

Therefore, the output S504 of the NOR gate 504 has the same logic as that of the signal A in the CMOS mode or in the GTL mode, and is fixed to the L-level in the other mode (CTT).

According to the third embodiment as shown in a time chart of FIG. 26, therefore, the output terminal 451 is driven by the first PMOS transistor 443a and the first NMOS transistor 443b only in the CTT mode, and the same operation as that of the aforementioned second embodiment is obtained in other modes (GTL mode or CMOS mode). The above modified embodiment is suited for a system which has a long transfer distance of the CTT level. When the transfer distance is long, the acceleration effect by the second PMOS transistor 444a and the second NMOS transistor 444b is weak and, in this case, it is rather advantageous to simplify the circuit.

FIGS. 27 to 32 are diagrams illustrating a semiconductor integrated circuit according to an embodiment of the present invention.

This embodiment is to eliminate the defect of the circuit (see FIG. 22) for automatically forming the mode designation signal of the above-mentioned embodiment.

That is, the circuit of FIG. 22 of the above-mentioned embodiment determines the logic of the mode designation signal (signal CMOS) by comparing the reference potential $V_{REF}$ with the "threshold voltage" of the NMOS transistor 470. Generally, however, variation is inevitably involved in the threshold voltage of the transistor due to error in the step of fabrication, and much room is left for improving the stability of operation.

Figure 27:
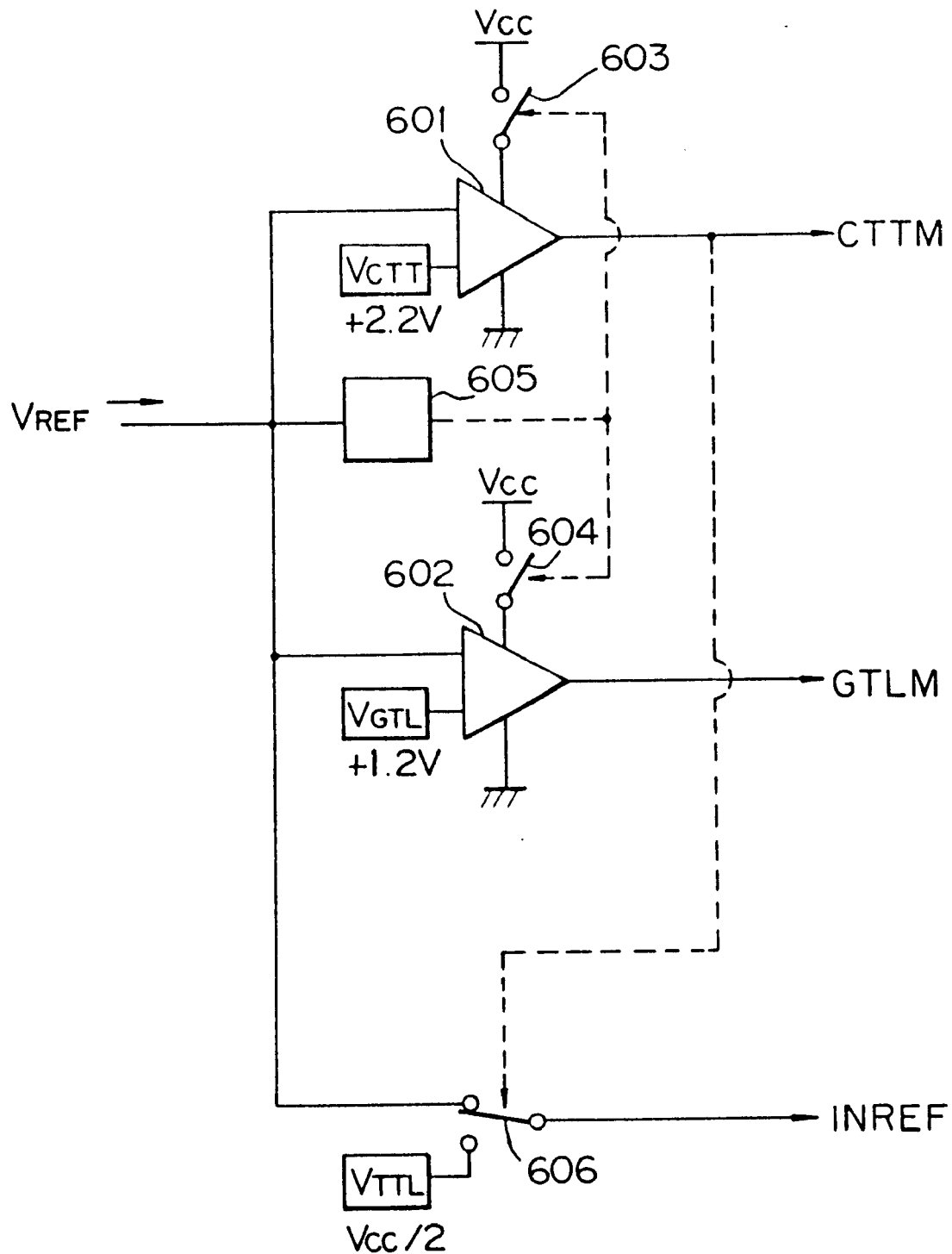
FIG. 27 is a diagram illustrating the principle and constitution of a third aspect of the present invention.

FIG. 27 is a diagram illustrating the principle and constitution of this embodiment, wherein reference numerals 601 and 602 denote comparators. Hereinafter, the comparator 601 is called first comparator, and the comparator 602 is called second comparator. The first comparator 601 compares the reference voltage $V_{REF}$ with a constant voltage $V_{CTT}$, and outputs a signal CTTM of a predetermined logic (high level) when $V_{REF} > V_{CTT}$. The second comparator 602 compares the reference voltage $V_{REF}$ with a constant voltage $V_{GTL}$, and outputs a signal GTLM of a predetermined logic (high level) when $V_{REF} > V_{GTL}$. Here, the constant voltage $V_{CTT}$ has a potential which is greater than a value ($V_{cc}/2 = +1.65V$ or $+1.5V$) of the reference voltage $V_{REF}$ in the CTT mode, and the constant voltage $V_{GTL}$ has a potential which is greater than a value (+0.8V) of the reference voltage $V_{REF}$ in the GTL mode. Desirably, for instance, $V_{CTT} = +2.2V$ and $V_{GTL} = +1.2V$.

Table 2 shows the reference voltage $V_{REF}$ and the mode designation signals (CTTM, GTLM).

TABLE 2

| | Mode designation signal | | |
|---|---|---|---|
| Range of comparison | CTTM | GTLM | Mode |
| $V_{REF} < +1.2$ V | low level | low level | GTL |
| $+1.2$ V $< V_{REF} > +2.2$ V | low level | high level | CTT |
| $+2.2$ V $< V_{REF} > V_{cc}$ (or open) | high level | high level | TTL |

Thus, the operation for discriminating the three modes is stabilized relying upon the precision of the two constant voltages $V_{CTT}$ and $V_{GTL}$, and the constant voltages $V_{CTT}$ and $V_{GTL}$ are precisely formed by, for example, dividing voltage using resistors. There is thus realized a circuit for automatically forming mode designation signals suited for the interfaces for practically all of CTT, GTL and TTL.

This embodiment is further provided with switching elements 603 and 604 capable of interrupting the power source current for the first and second comparators 601, 602, and with a control means 605 which turns the switching elements 603, 604 off when the reference voltage $V_{REF}$ is $V_{cc}$ (or open), i.e., in the TTL mode, so that no electric power is consumed by the first and second comparators 601, 602 in the TTL mode.

Moreover, this embodiment is provided with a switching element 606 which selects either the reference voltage $V_{REF}$ or the constant voltage $V_{TTL}$ according to the logic of the signal CTTM to use it as a reference voltage INREF (e.g., $V_{REF}$ of FIG. 16) of the input buffer circuit. When the signal CTTM has the low level, i.e., in the CTT mode or in the GTL mode, there holds a relation INREF=$V_{REF}$ and when the signal CTTM has the high level, i.e., in the TTL mode, there holds a relation INREF=$V_{TTL}$. Desirably, $V_{TTL}$ should be $V_{cc}/2$. In this case, the reference voltage INREF of a magnitude suited for each of the modes is automatically generated and is fed to the input buffer circuit.

Figure 28:
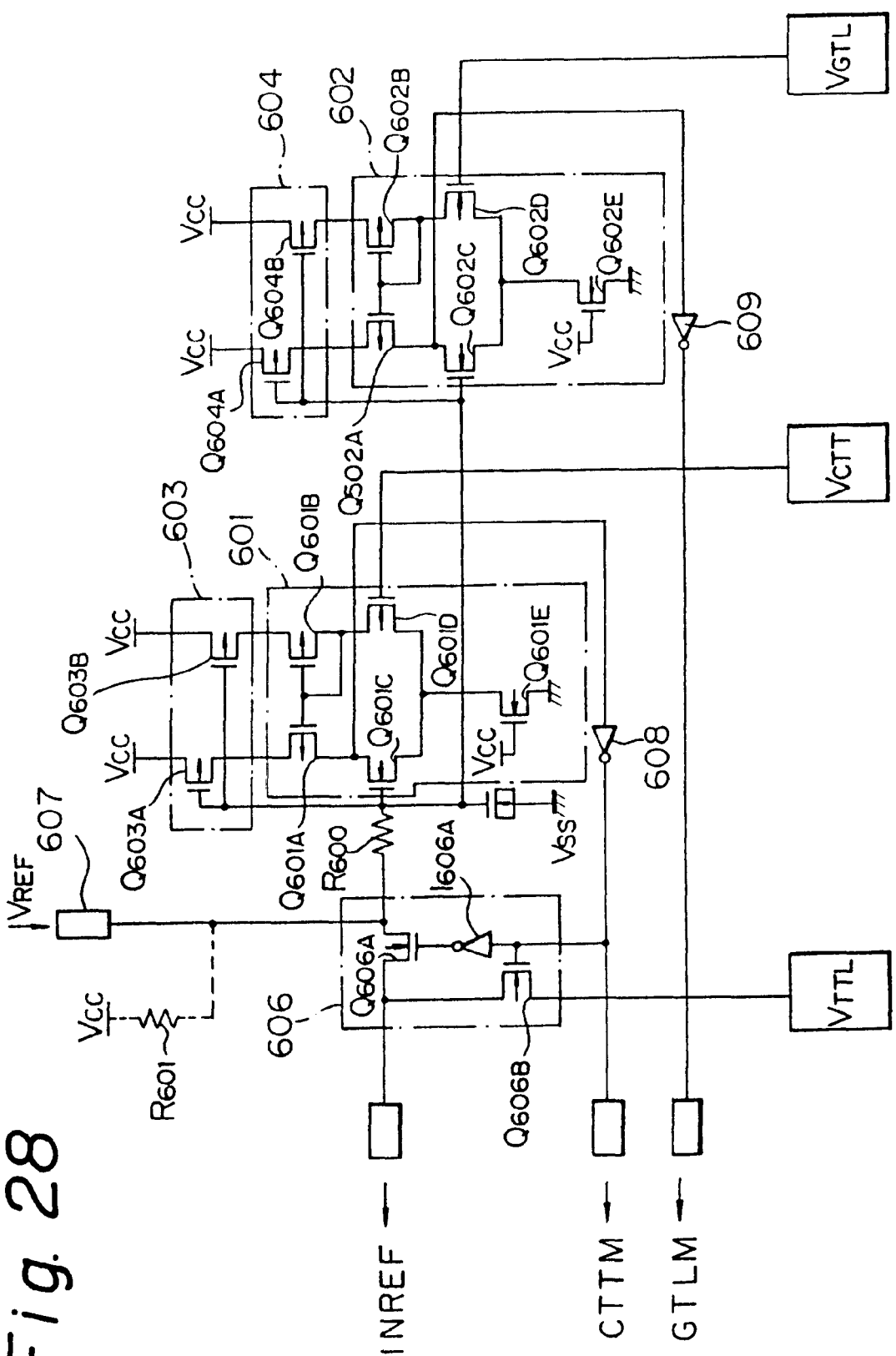
FIG. 28 is a diagram illustrating the constitution of a mode judging circuit.

FIG. 28 is a diagram which concretely illustrates the constitution of a circuit for automatically forming a mode designation signal. In FIG. 28, the same functional portions as those of FIG. 27 are denoted by the same reference numerals. That is, the first and second comparators 601 and 602 are each constituted by a pair of NMOS transistors Q601C and Q601D using PMOS transistors Q601A and Q601B as load elements, a pair of NMOS transistors Q602C and Q602D using PMOS transistors Q602A and Q602B as load elements, and constant-current sources made up of NMOS transistors Q601E, Q602E. Further, the switching elements 603 and 604 each have two PMOS transistors Q603A, Q603B and Q604A, Q604B.

The gates of the transistors in the above two switching elements 603 and 604 are served with a potential from a reference voltage terminal 607 of the chip via the resistor R600. When the reference voltage $V_{REF}$ (+0.8V, +1.65V or +1.5V) is applied from outside the chip (CTT or GTL mode), this potential becomes low to correspond to $V_{REF}$. When the reference voltage is not applied (TTL mode), this potential is fixed to a high value being pulled up to $V_{cc}$.

Therefore, the two switching elements 603 and 604 are turned on in the GTL or CTT mode to permit the supply of power source current to the first and second comparators 601, 602, but inhibit (cut off) the supply of current in the TTL mode, so that no electric power is consumed by the first and second comparators 601, 602.

The first comparator 601 compares the potential at the reference voltage terminal 607 with the constant voltage $V_{CTT}$ and renders the output (signal CTTM) of the inverter gate 608 to assume the high level when $V_{CTT}$ is lower. The second comparator 602 compares the potential at the reference voltage terminal 607 with the constant voltage $V_{GTL}$ and renders the output (signal GTLM) of the inverter gate 609 to assume the high level when $V_{GTL}$ is lower.

The signal CTTM is input to a switching element 606 which consists of two NMOS transistors Q606A and Q606B, and an inverter gate I606A. Depending on the logic condition of the signal CTTM, the switching element 606 selects either the potential at the reference voltage terminal 607 or the constant voltage $V_{TTL}$ and outputs it as the reference voltage INREF for the input buffer circuit. That is, when the signal CTTM has the low level (GTL or CTT mode), Q606A is turned on and the potential at the reference voltage terminal 607 becomes INREF. When the signal CTTM has the high level (TTL mode), on the other hand, Q606B is turned on and the constant voltage $V_{TTL}$ becomes INREF.

Figure 29:
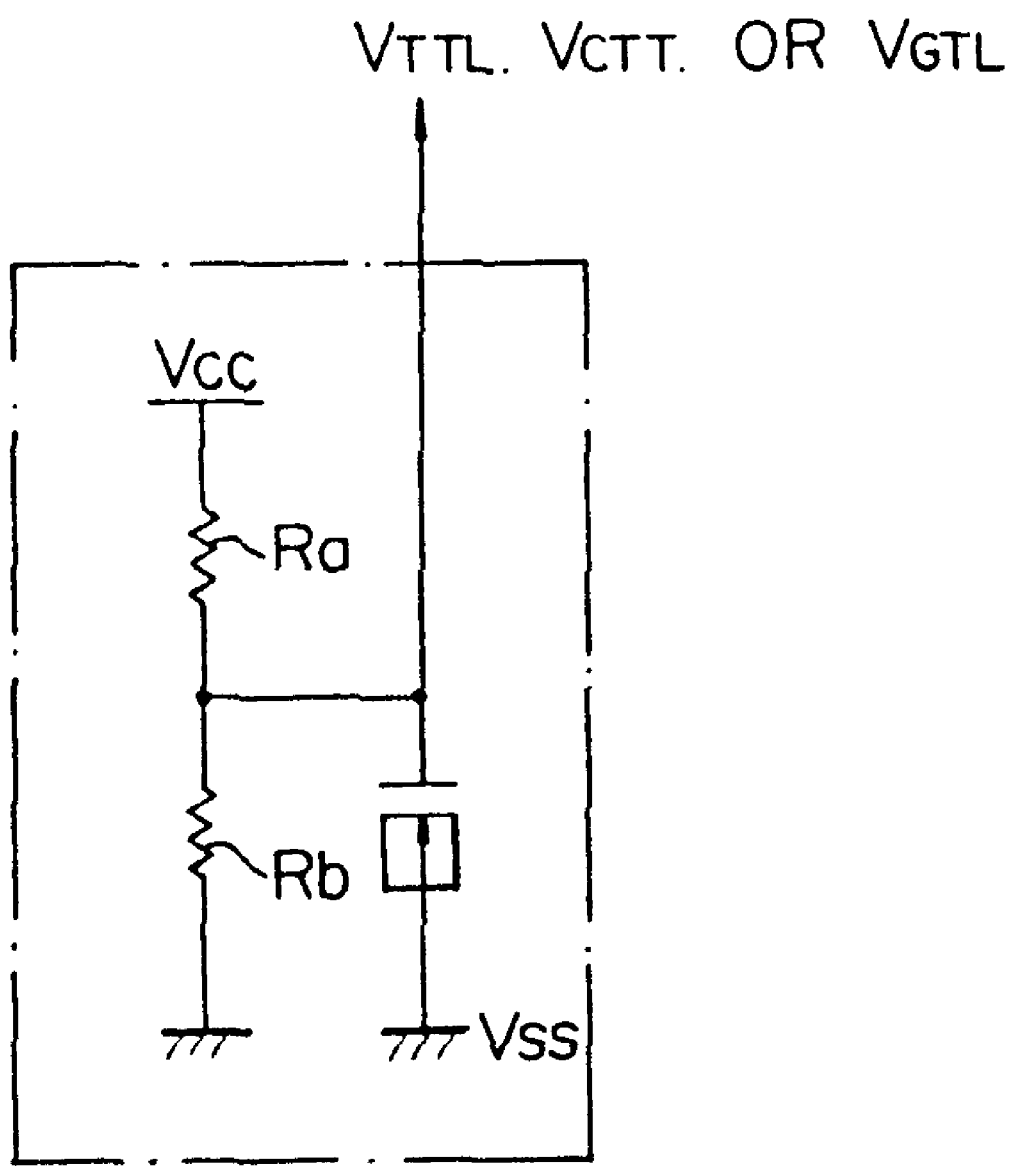
FIG. 29 is a diagram illustrating the constitution of a constant voltage-generating circuit.

FIG. 29 shows a circuit for generating the constant voltage $V_{TTL}$, $V_{CTT}$ or $V_{GTL}$, and in which the voltage between the high-potential power source $V_{cc}$ and the low-potential power source $V_{ss}$ is divided by resistors Ra and Rb, in order to obtain a constant voltage of a magnitude that corresponds to the voltage-dividing ratio.

Figure 30:
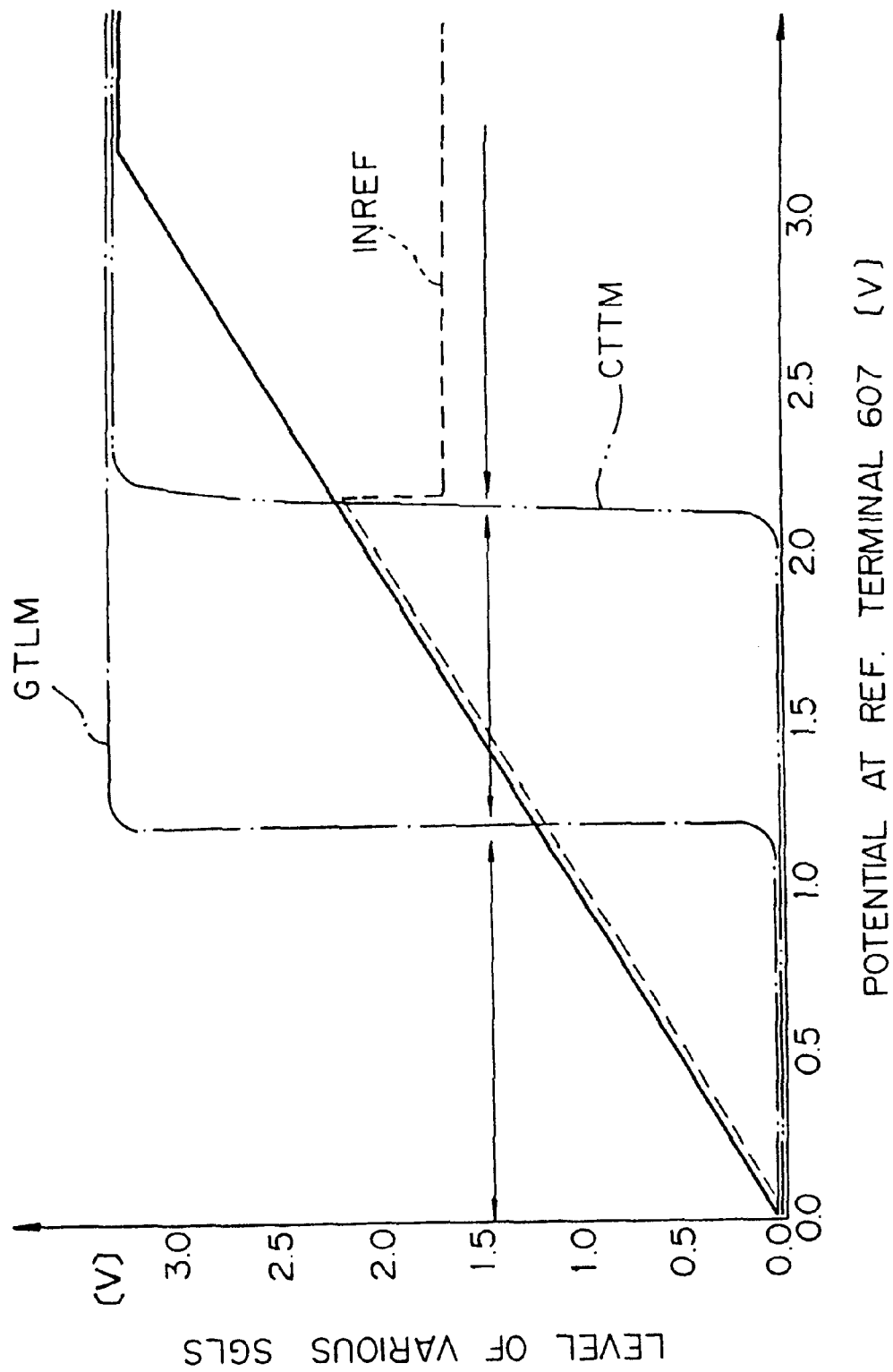
FIG. 30 is a diagram of a waveform of an output signal of the mode judging circuit.

FIG. 30 is a graph showing changes in the levels of signals (GTLM, CTTM, INREF) in response to a change in the potential at the reference voltage terminal 607. Now, the potential of the reference voltage terminal 607 is changed from 0V to $V_{cc}$ (+3.3V). In a region "a" of from 0V to $V_{GTL}$ ($V_{GTL}$=+1.2V), both the signal GTLM and the signal CTTM have the low level. In a region "b" of from $V_{GTL}$ to $V_{CTT}$ ($V_{CTT}$=+2.2V), the signal GTLM only assumes the high level and in a region "c" of from $V_{CTT}$ to $V_{cc}$, the signal CTTM, too, assumes the high level. Moreover, INREF is in agreement with the potential at the reference voltage terminal 607 between the regions "a" and "b", and is fixed to $V_{TTL}$ in the region "c".

Therefore, the potential of the reference voltage terminal 607 is +0.8V in the GTL mode, +1.65V (or +1.5V) in the CTT mode or $V_{cc}$ in the TTL mode. These potentials can be classified in their respective regions and can be displayed as combinations of the two mode designation signals GTLM and CTTM.

Figure 31:
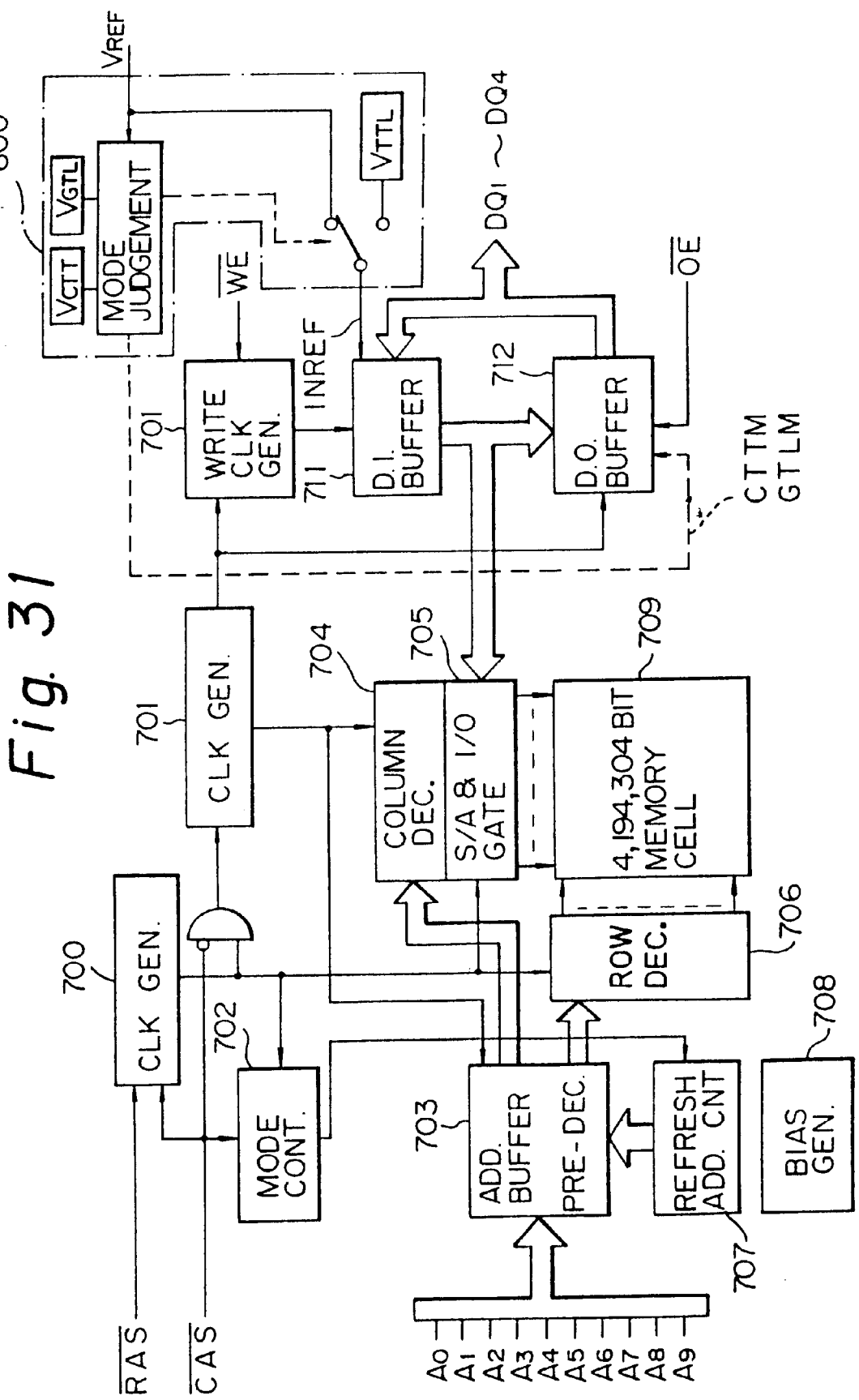
FIG. 31 is a diagram illustrating the whole constitution of a semiconductor memory of a first embodiment of the third aspect of the present invention.

FIG. 31 is a block diagram of a semiconductor memory to which the present invention is adapted and in which the portion surrounded by a dot-dash chain line is a circuit 600 for automatically forming mode designation signals. In FIG. 31, reference numerals 700 and 701 denote clock generators, 702 denotes a mode control, 703 denotes an address buffer/address predecoder, 704 denotes a column decoder, 705 denotes a sense amplifier/I/O gate, 706 denotes a row decoder, 707 denotes a refresh address counter, 708 denotes a substrate bias generator, 709 denotes a memory cell array, 710 denotes a write clock generator, 711 denotes a data input buffer, and reference numeral 712 denotes a data output buffer. Symbol RAS denotes a raw address strobe signal, CAS denotes a column address strobe signal, $A_0$ to $A_9$ denote address signals, WE denotes a write enable signal, OE denotes an output enable signal, DQ1 to DQ4 denote input/output data, and symbol $V_{REF}$ denotes a reference voltage.

The data input buffer 711 and the data output buffer 712 constitute a transceiver for use with CTT, GTL and TTL. The data input buffer 711 is served with a reference voltage INREF from the circuit 600 which automatically forms mode designation signals, and the data output buffer 712 is served with two kinds of mode designation signals CTTM and GTLM.

Figure 32:
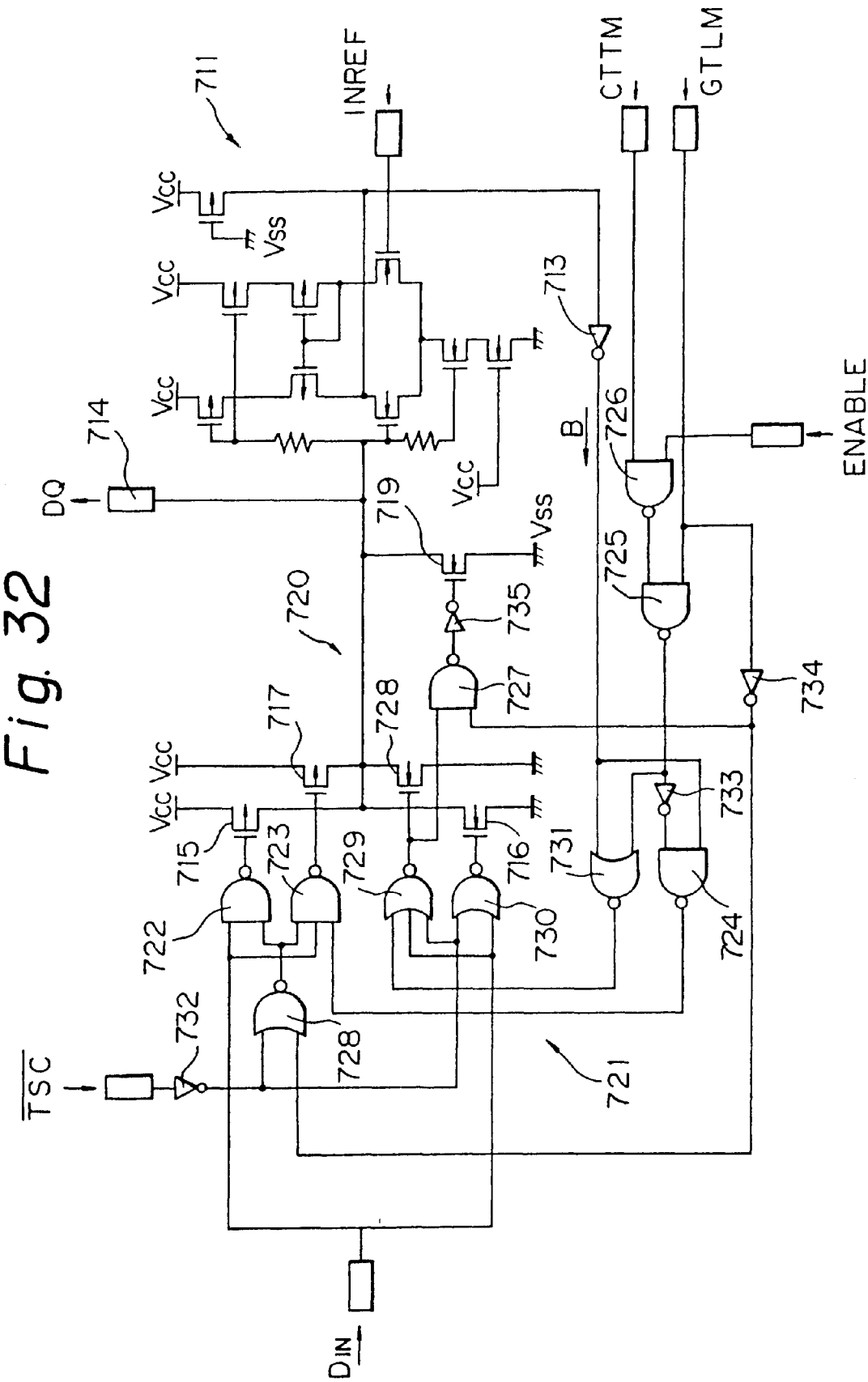
FIG. 32 is a diagram illustrating the constitution of an input/output circuit of the third aspect of the present invention.

FIG. 32 is a diagram illustrating the constitution of the transceiver (constitution for one bit only). The data input buffer 711 has five PMOS transistors Q711A, Q711B, Q711C, Q711D, Q711E, four NMOS transistors Q711F, Q711G, Q711H, Q711I, and one inverter gate 713, and compares the potential at the data input/output terminal 714 with the reference voltage INREF, and renders the output (output of the inverter gate 713, hereinafter denoted by symbol A) to assume the high level when the INREF is lower.

The data output buffer 712 has a group of output transistors 720 including a first PMOS transistor 715 and a first NMOS transistor 716 connected in series between the high-potential power source $V_{cc}$ and the low-potential power source $V_{ss}$, a second PMOS transistor 717 and a second NMOS transistor 718 similarly connected in series, and a third NMOS transistor 719 connected in parallel with the first NMOS transistor 716 (or the second NMOS transistor 718).

The first and second PMOS transistors 715, 716 as well as the first to third NMOS transistors 717 to 719 are controlled for their turn on/off operation by a control circuit 721 which comprises NAND gates 722 to 727, NOR gates 728 to 731, and inverter gates 732 to 735.

Each of the operation modes will be described hereinbelow. In the following description, both the tri-state control signal TSC and the operation permit signal Enable have the high level.

[GTL]

First, when the signal CTTM and the signal GTLM have the low level (GTL mode), the output of the NAND gate 725 is fixed to the high level, and whereby the output of the NOR gate 731 is fixed to the low level and the output of the NAND gate 724 is fixed to the high level, so that the logic of the signal B is inhibited from being fed back to the side of the output buffer. At the same time, the output of the inverter gate 734 assumes the high level, the output of the NOR gate 728 assumes the low level and, hence, the outputs of the NAND gates 722 and 723 are fixed to the high level, the first and second PMOS transistors 715 and 717 are fixed to the off state, and the NMOS transistors only perform the open-drain operation in the group of output transistors 720. That is, when the logic of the data Din from the internal circuit is, for instance, low level, the outputs of the NOR gates 729 and 730 both assume the high level and, at the same time, the output of the inverter gate 735 assumes the high level, too. Therefore, the first and second NMOS transistors 716 and 718 are turned on and, in addition, the third NMOS transistor 719 is turned on, so that the input/output terminal 714 is efficiently driven by these three NMOS transistors. Thus, there is realized an output transistor which produces a large driving force required for the GTL mode.

[CTT]

Next, when the signal CTTM has the low level and the signal GTLM has the high level (CTT mode), the outputs of the NAND gate 725 and the inverter gate 734 both have the low level. Therefore, the logic of the signal B is fed back to the side of the output buffer, and the transistors constituting the group of output transistors 720 are turned on and off depending upon the logics of both the signal B and the data Din from the internal circuit.

That is, the logic of the signal B remains at the low level immediately after the logic of the data Din from the internal circuit has changed from the low level into the high level. Therefore, the outputs of the AND gates 722 and 723 assume the low level, the first and second PMOS transistors 715 and 717 are turned on, and the output terminal 714 are driven by these two PMOS transistors. Then, when the potential of the output terminal 714 becomes greater than the reference voltage INREF and the signal B assumes the high level after a predetermined period of time has passed, the output of the AND gate 724 assumes the low level, the output of the AND gate 723 assumes the high level, and the second PMOS transistor 717 is turned off. As a result, the subsequent output terminal 714 is driven by the first PMOS transistor 715 only, and the waveform of the data DQ is not distorted.

[TTL]

Next, when the signal CTTM and the signal GTLM have the high level (TTL mode), the output of the NAND gate 725 is fixed to the high level, the output of the NOR gate 731 assumes the low level and the output of the NAND gate 724 assumes the high level. Therefore, the transistors constituting the group of output transistors 720 operate in parallel depending upon the logic of the data Din from the internal circuit irrespective of the logic of the signal B, and work to efficiently drive the capacitive load connected to the output terminal 714.

As described above, according to this embodiment in which provision is made of switching elements 603 and 604 (see FIG. 28) which interrupt the power source current to the comparators 601, 602 (see FIG. 28) that judge the level of the reference voltage $V_{REF}$ when the potential of the reference voltage terminal 607 is $V_{cc}$ or is open, it is made possible to decrease the consumption of electric power during the operation in the TTL mode.

Moreover, since the third NMOS transistor 719 is connected in parallel with the first and second NMOS transistors 716 and 718 (see FIG. 32) and is permitted to operate in the predetermined operation modes (e.g., TTL and GTL modes), it is made possible to increase the drivability of the transistor of the pull-down side in the predetermined operation modes.

Moreover, since the reference voltage INREF used in the data input buffer 711 (see FIG. 32) is alternatively changed into either $V_{REF}$ or $V_{CTT}$, the reference voltage INREF is optimized for each of the operation modes in order to stabilize the operation of the data input buffer 711.

Fourth Aspect of the Invention

For a better understanding of the preferred embodiments, the related prior art will be explained with reference to FIGS. 33 and 34.

Figure 33:
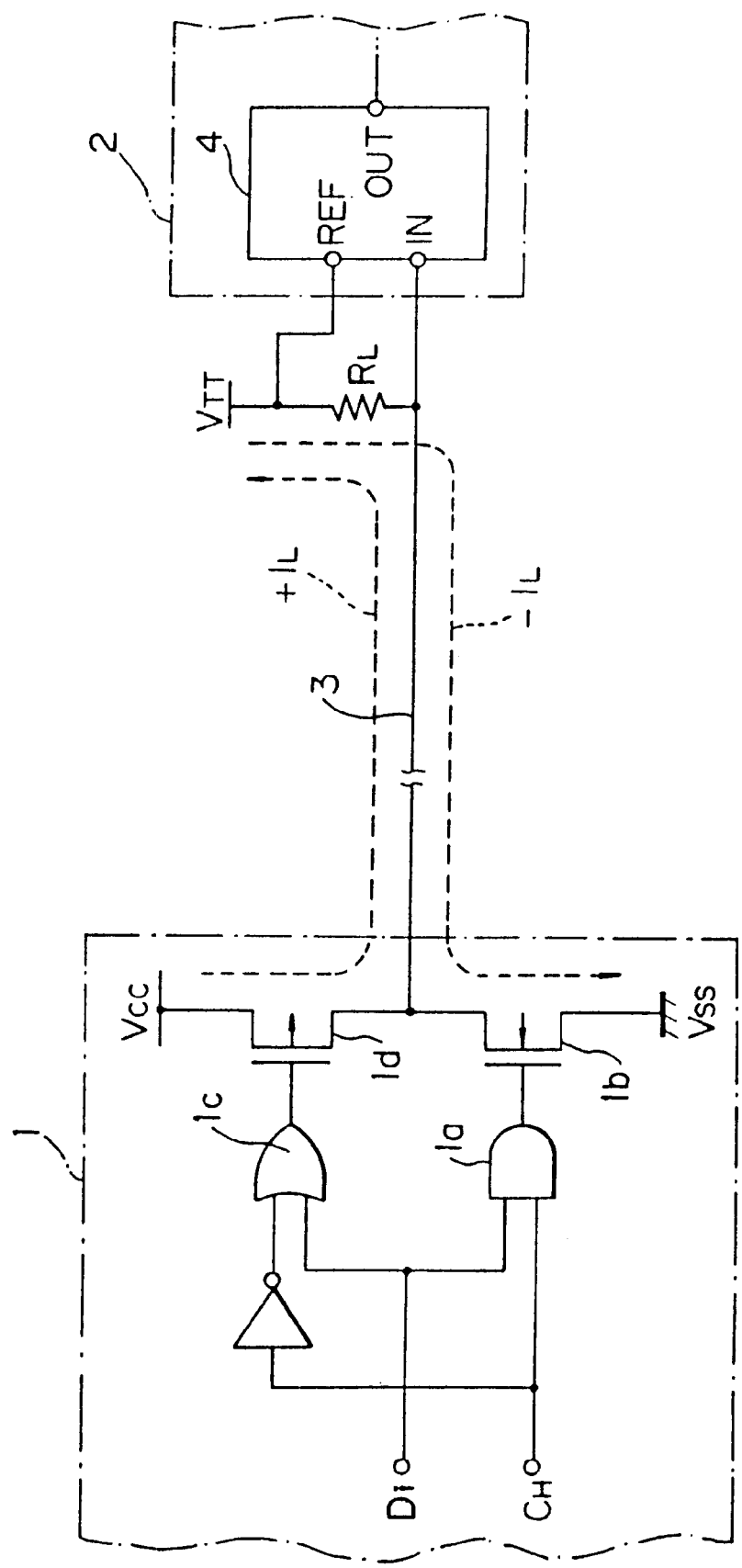
FIG. 33 is a diagram illustrating the whole constitution of a data transfer circuit.

In FIG. 33, reference numeral 1 denotes an LSI chip on a data output side (hereinafter referred to as an "output chip"), and reference numeral 2 denotes an LSI on a data input side (hereinafter referred to as an "input chip"). These output and input chips are connected by a data bus 3 which is shared in common with other chips. The data bus 3 is connected to a predetermined intermediate potential power source $V_{TT}$ (a power source having an intermediate potential between a high potential side power source $V_{cc}$ and a low potential side power source $V_{ss}$; e.g. $V_{TT}$=+1.65V when $V_{cc}$=+3.3V and $V_{ss}$=0V) through a resistor $R_L$.

Here, assuming that internal data Di of the output chip 1 is a logic "H", for example, with the proviso that a high impedance control signal $C_H$ is the logic "H". Since both of Di and $C_H$ have the logic "H", the output of an AND gate 1a becomes the logic "H" and an output transistor 1b on the $V_{SS}$ side is turned ON. Accordingly, a current ($-I_L$) flows in a direction of $V_{TT}$→resistor $R_L$→output transistor 1b→$V_{ss}$, and a voltage drop $R_L \times -I_L$ occurs across both ends of the resistor $R_L$. In consequence, a potential of an input terminal IN of a differential amplification circuit 4 disposed inside the input chip 2 becomes $-(R_L \times I_L)$ [V] and becomes "lower" by "$(R_L \times I_L)$" [V] than a potential $V_{REF}$ ($V_{REF}=V_{TT}$) of a reference terminal REF.

On the other hand, when the internal data Di is the logic "L", the output of the AND gate 1a becomes the logic "L" and the output transistor 1b on the $V_{ss}$ side is turned OFF. However, since the output of a NOR gate 1c is the logic "L", an output transistor 1d on the $V_{cc}$ side is turned ON. Accordingly, in this case, the current (+$I_L$) flows in a direction $V_{cc}$→output transistor 1d→resistor $R_L$→$V_{TT}$, and a voltage drop $R_L \times I_L$ occurs across both ends of the resistor $R_L$. Therefore, the potential $V_{IN}$ of the input terminal IN of the differential amplification circuit 4 becomes $+(R_L \times I_L)$ [V] and is higher by $+(RL \times I_L)$ [V] than the potential $V_{REF}$ of the reference terminal REF.

Figure 34:
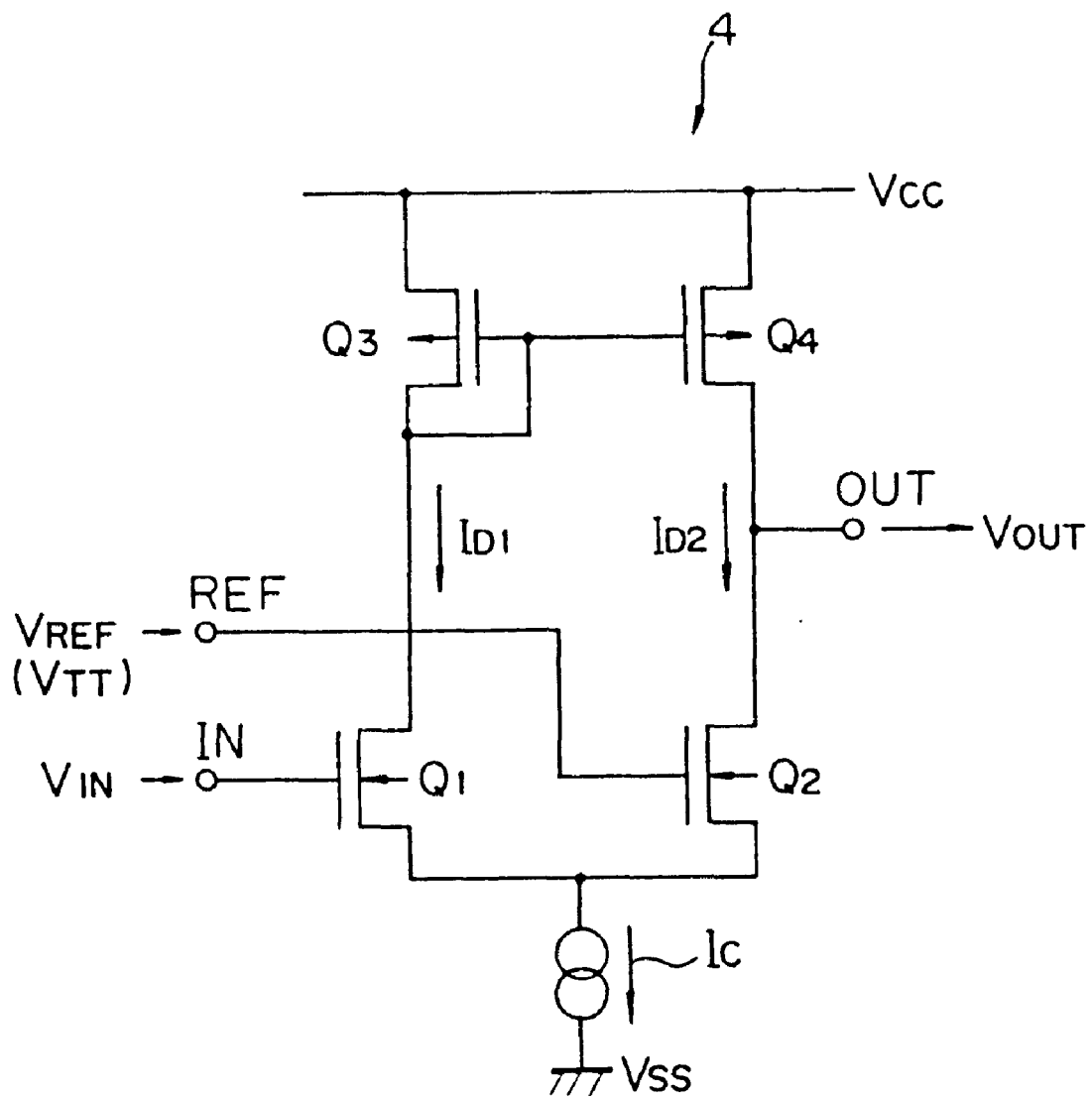
FIG. 34 is a diagram illustrating the constitution of a conventional input circuit.

FIG. 34 is a structural diagram of the differential amplification circuit 4. This differential amplification circuit 4 includes a first transistor $Q_1$ which receives the input voltage $V_{IN}$ at the gate thereof, a second transistor $Q_2$ which receives the reference voltage $V_{REF}$ having a substantial intermediate potential (+1.65V) between the high potential side power source $V_{cc}$ (+3.3V) and the low potential side power source $V_{ss}$ (0V) at the gate thereof, load transistors $Q_3$ and $Q_4$ having a current mirror structure connected to the drain side of the first and second transistors $Q_1$ and $Q_2$, and a constant current source 4a interposed between the first and second transistors $Q_1$, $Q_2$ and the low potential side power source $V_{ss}$.

A pair of transistors having uniform characteristics are used as the first and second transistors $Q_1$, $Q_2$. In other words, these transistors $Q_1$, $Q_2$ function as differential transistors, and output a voltage $V_{OUT}$ proportional to the difference between $V_{REF}$ and $V_{IN}$ from the terminal OUT thereof. The drain current $I_{D1}$ of the first transistor $Q_1$ and the drain current $I_{D2}$ of the second transistor $Q_2$ have a relational formula $I_{D1}:I_{D2}=1:n$ which is determined by a current mirror ratio n (n includes 1) of the load transistors $Q_3$, $Q_4$, and $I_{D1}+I_{D2}$ is limited to a constant current $I_c$ by the constant current source 4a. Hereinafter, it will be assumed for ease of explanation that n=1 or in other words, $I_{D1}:I_{D2}=$ 1:1.

In the circuit construction described above, the logic level of the output voltage $V_{OUT}$ of the differential amplification circuit 4 is determined in accordance with the voltage relationship between $V_{IN}$ and $V_{REF}$. When $V_{IN}>V_{REF}$, that is, when $V_{IN}$ exceeds +1.65V, $I_{D1}\times 1>I_{D2}\times n$. Accordingly, the drain voltage of $Q_1$ substantially corresponds to $V_{ss}$ (0V). Since this drain voltage of $Q_1$ is also the gate voltage of the load transistor $Q_4$ (P-channel MOSFET), the channel resistance of $Q_4$ becomes minimal and hence, the level of the output voltage $V_{OUT}$ is pulled up to the logic H which substantially corresponds to $V_{cc}$ (+3.3V). When $V_{IN}<V_{REF}$, on the contrary, that is, when $V_{IN}$ is lower than +1.65V, $I_{D1}\times 1<I_{D2}\times n$, on the contrary. Accordingly, the level of the output voltage $V_{OUT}$ is lowered to the logic L substantially corresponding to $V_{ss}$.

However, the prior art input circuit described above employs the structure wherein the logic H is outputted when the level of the input signal $V_{IN}$ is higher than $V_{REF}$, that is, $V_{TT}$ (=+1.65 V) as the threshold value, and the logic L is outputted when the level is lower than $V_{REF}$. Accordingly, the following problems occur.

When a noise (e.g. an external noise such as ringing due to signal reflection, EMI, etc) adds to the input signal, this noise component undesirably inverts the output logic. Though ringing due to reflection can be suppressed to a certain extent by finely dividing the level of the signal (±300 mV to ±500 mV) as already described, ringing cannot be removed completely. Therefore, this problem occurs unavoidable, though the degree may be different.

When the output circuit connected to the data bus is of a three-state type, there occurs the problem in that the output logic of the differential amplification circuit 4 becomes indefinite. (In other words, it is not distinct whether the output logic becomes the logic L or the logic H.) For example, when the control signal $C_H$ becomes the logic L in the chip 1 shown in FIG. 33, the output of the AND gate 1a becomes the logic L, the output of the inverter gate 1a becomes the logic L and the output of the inverter gate 1e becomes the logic H, so that the output of the NOR gate 1c becomes the logic H. Accordingly, two output transistors 1d and 1b are turned OFF, the output chip 1 and the data bus 3 are cut off from each other and the high impedance state is reached. Accordingly, the voltage drop of the resistor $R_L$ becomes zero and hence, $V_{REF}=V_{IN}$ or in other words, the threshold value level and $V_{IN}$ coincide with each other, so that the output logic of the differential amplification circuit 4 becomes indefinite.

Further, when a very fine noise (e.g. external noise such as EMI) exists on the data bus, this noise component further inverts the output logic of the differential amplification circuit.

Hereinafter, embodiments of the present invention will be explained with reference to the drawings. By the way, the overall structural diagram between the chips and an interface should be referred to FIG. 33 in the description below.

Figure 35:
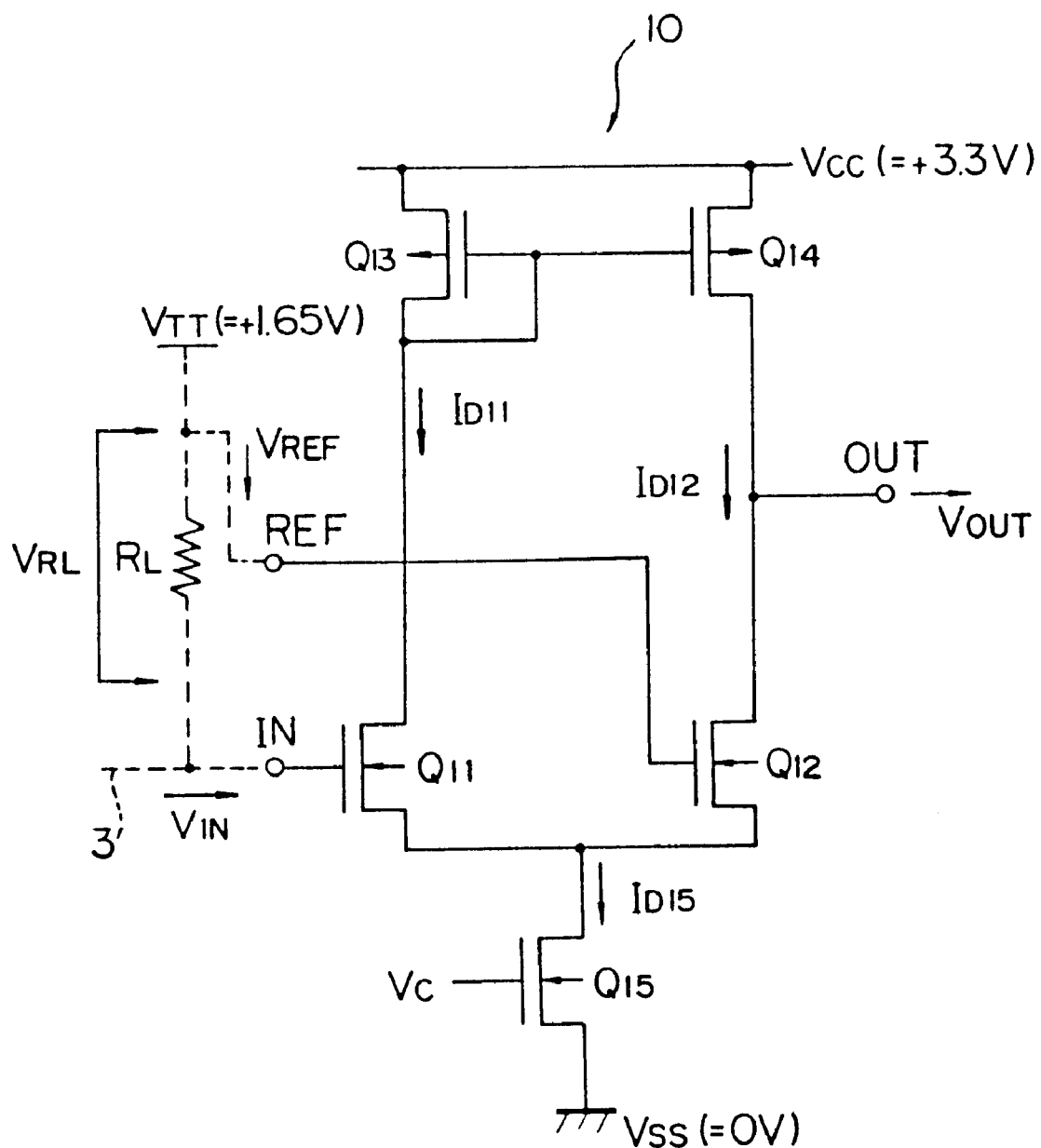
FIG. 35 is a diagram illustrating the constitution of a first embodiment of a fourth aspect of the present invention.

FIG. 35 shows a semiconductor integrated circuit according to the first embodiment of the present invention.

In FIG. 35, an input circuit 10 includes a first transistor $Q_{11}$ (a differential transistor on the input side) which receives the input signal $V_{IN}$ transferred thereto through the data bus 3 at the gate thereof, a second transistor $Q_{12}$ (a differential transistor on the reference side) which receives the reference potential $V_{REF}$ equal to the intermediate potential power source $V_{TT}$ substantially corresponding to the intermediate potential (+1.65V) between the high potential side power source $V_{cc}$ (+3.3V) and the low potential side power source $V_{ss}$ (0V) at the gate thereof, a third transistor $Q_{13}$ functioning as an active load to $Q_{11}$, a fourth transistor $Q_{14}$ functioning as an active load to $Q_{12}$ and a fifth transistor $Q_{15}$ functioning as a constant current source to these transistors $Q_{11}$ to $Q_{14}$. Among these transistors $Q_{11}$ to $Q_{15}$, the transistors $Q_{11}$, $Q_{12}$ and $Q_{15}$ are N channel type MOSFETs and the rest of the transistors $Q_{13}$ and $Q_{14}$ are P channel MOSFETs. The gates of $Q_{11}$ and $Q_{14}$ are mutually connected, and are also connected to the drain of $Q_{11}$. In other words, $Q_{13}$ and $Q_{14}$ constitute a current mirror and operate in such a manner as to lower the internal resistance of $Q_{13}$ and $Q_{14}$ when the drain voltage of $Q_{11}$ drops, and to raise the internal resistance of $Q_{13}$ and $Q_{14}$ when the drain voltage rises.

Here, the threshold values $V_{th11}$, $V_{th12}$ of the first and second transistors $Q_{11}$, $Q_{12}$ are set to mutually different values, or in other words, $V_{th11} \neq V_{th12}$. This can be accomplished by regulating the dose of the channel region, for example.

When the difference between $V_{th11}$ and $V_{th12}$ is 50 mV, for example, in the circuit construction described above (with the proviso that $V_{th11}>V_{12}$), the output voltage $V_{OUT}$ in this case is the logic L in the range where $V_{IN}$ is not greater than +1.60V and becomes the logic H in the range where it exceeds +1.60V. In other words, +1.60V which is lower by 50 mV from $V_{TT}$ becomes the threshold value. Accordingly, the data bus 3 attains a high impedance, and when $V_{IN}=V_{REF}$ ($V_{TT}$=+1.65V), $V_{IN}$ enters the range of not lower than +1.60V, so that the output signal $V_{OUT}$ is definitely set to the logic H.

Even when the noise exists on $V_{IN}$, $V_{IN}$ continues to remain within the range of at least 1.60 if the amplitude of this noise on the negative side is within 50 mV. Accordingly, the logic of the output signal $V_{OUT}$ is not undesirably inverted. In other words, a noise margin corresponding to 50 mV is secured, and noise resistance can be improved to the extent of this margin.

Though the difference of the threshold values is set to 50 mV in the embodiment described above, this value is not limitative, in particular, and may be any value so long as it is within the range not exceeding at least ½ of the level of the input signal $V_{IN}$. When the level of $V_{IN}$ is 300 mV, for example, the value may be selected from the range of a value near 0 mV to a value near 200 mV. The voltage relationship between the threshold values is not limited to the relation $V_{th11}>V_{th12}$, either, and may be $V_{th11}<V_{th12}$. If the difference is 50 mV in this case, for example, $V_{OUT}$ becomes the logic L within the range of $V_{IN}$ of not greater than +1.7V while $V_{OUT}$ becomes the logic H within the range greater than +1.7V. Therefore, $V_{OUT}$ becomes the logic L when $V_{IN}=V_{REF}$ (1.65V).

Besides the adjustment of the dose, the threshold values of $Q_{11}$ and $Q_{12}$ can be adjusted by changing a transistor size ($\beta$), for example. Alternatively, the threshold values of $Q_{11}$ and $Q_{12}$ can be made different indirectly by changing the threshold values and sizes of the load transistors ($Q_{13}$, $Q_{14}$) so as to change the drain voltages of $Q_{11}$ and $Q_{12}$. Further, the noise resistance can be improved while keeping the same threshold value for $Q_{11}$ and $Q_{12}$ by generating a potential, which is within the maximum amplitude of the input signal $V_{IN}$ and is different from the intermediate amplitude value ($V_{REF}=V_{TT}$ of the input signal $V_{IN}$, by potential generation means such as a resistor type potential divider, and applying this potential to the gate of $Q_{12}$.

By the way, though the predetermined constant voltage $V_c$ is applied to the gate of the constant current transistor $Q_{15}$ in FIG. 35, the input signal $V_{IN}$, for example, may be applied, as well. The drain currents $I_D$, $I_{D12}$ of the differential transistors $Q_{11}$, $Q_{12}$ can be controlled in accordance with the potential change of $V_{IN}$, and response of the differential amplification circuit 10 can be improved.

Further, the judgement voltage can be deviated by using the transistors having the same characteristics for $Q_{11}$ and $Q_{12}$ while using the transistors having different characteristics for $Q_{13}$ and $Q_{14}$. When the current of $Q_{13}$ is set so as to be 1.2 times the current of $Q_{14}$, for example, the point at which $Q_{11}$ passes the current 1.2 times that of $Q_{12}$ is the judgement point for discriminating and L and H, and in order to pass the 1.2×current, $V_{IN}$ must be higher than $V_{REF}$.

Figure 36:
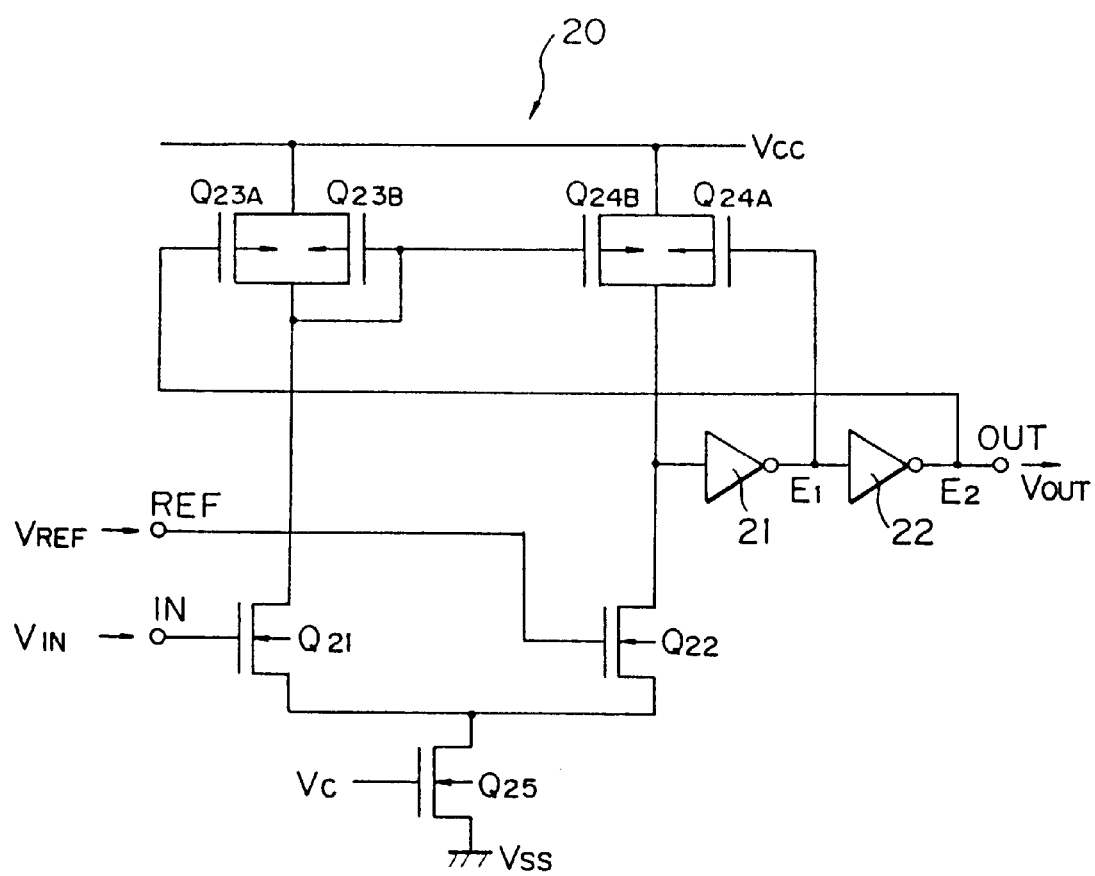
FIG. 36 is a diagram illustrating the constitution of a second embodiment.
Figure 37:
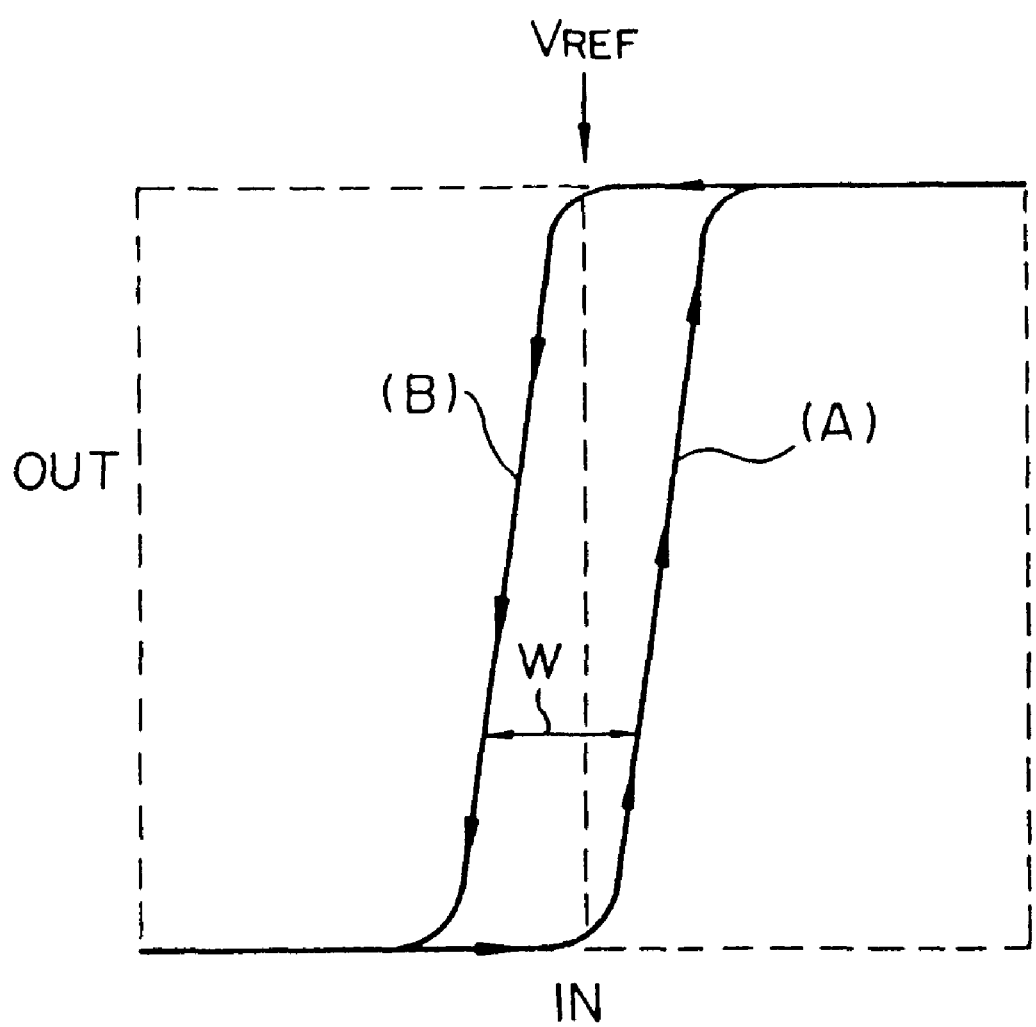
FIG. 37 is a diagram of input and output characteristics of the second embodiment.

FIGS. 36 and 37 show the semiconductor integrated circuit according to the second embodiment of the present invention.

In FIG. 36, reference numeral 20 denotes the input circuit. Symbols $Q_{21}$ and $Q_{22}$ denote the differential transistors and symbols $Q_{23A}$, $Q_{23B}$ and $Q_{24A}$, $Q_{24B}$ denote the load transistors of Q and $Q_{22}$, respectively. Reference numerals 21 and 22 denote the first and second inverter gates which output a signal $V_{out}$ that changes with the same phase as that of the drain voltage of $Q_{22}$. The common gate of $Q_{23B}$ and $Q_{24B}$ is connected to the drain of $Q_{21}$, the gate of $Q_{23A}$ is connected to the output $E_1$ of the first inverter gate 21, and the gate of $Q_{24A}$ is connected to the output $E_2$ of the second inverter gate 22. The transistors $Q_{21}$, $Q_{22}$ and $Q_{25}$ are N channel MOSFETs and the transistors $Q_{23A}$, $Q_{23B}$, $Q_{24A}$ and $Q_{24B}$ are P channel MOSFETS.

According to the circuit construction described above, when $V_{IN}$=logic H, $E_1$=logic L and $Q_{24A}$ is turned ON. Accordingly, a greater current flows through $Q_{22}$. In consequence, the judgement point for reading and separating H and L when $V_{IN}$ once becomes the logic H is a point lower than $V_{REF}$. On the contrary, the judgement point for reading and separating H and L when $V_{IN}$ once becomes the logic L is a point higher than $V_{REF}$.

Accordingly, as shown in input-output characteristic diagram of FIG. 37, the rise orbit "A and the fall orbit "B" can describe hysteresis, and a noise margin corresponding to the gap W between both orbits can be secured.

Figure 38:
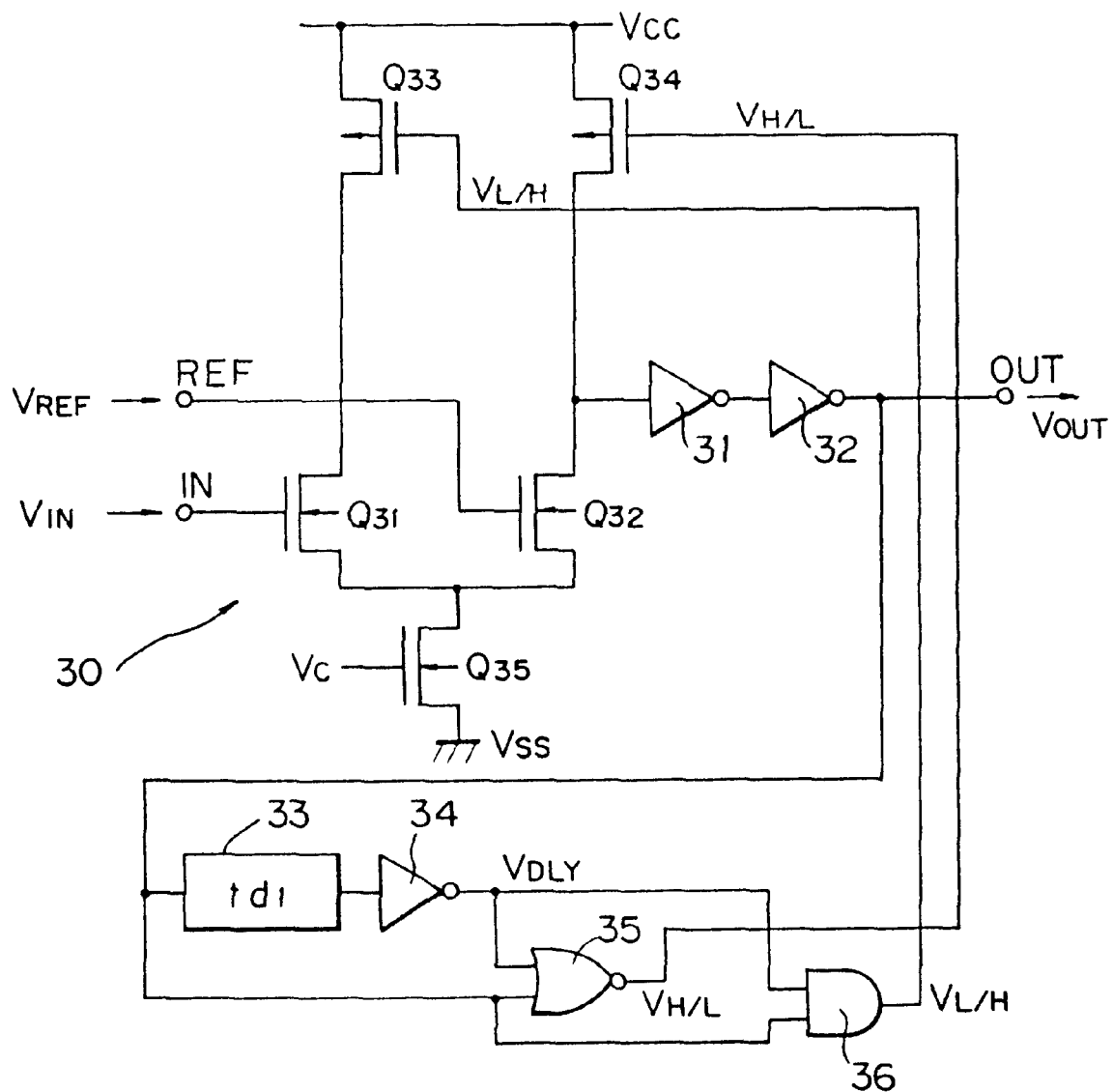
FIG. 38 is a diagram illustrating the constitution of a third embodiment.
Figure 39:
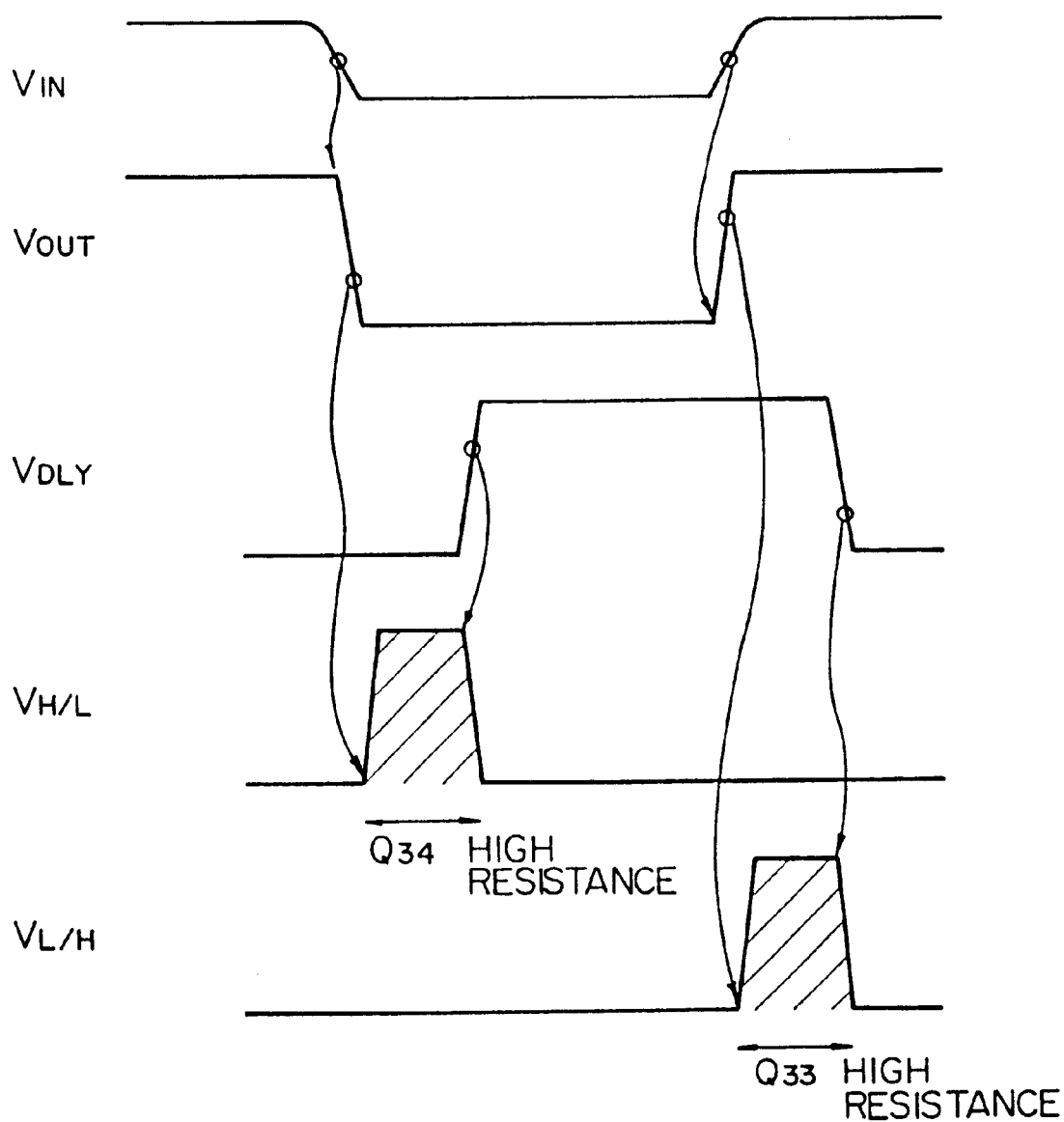
FIG. 39 is a timing chart of signals of the third embodiment.
Figure 40:
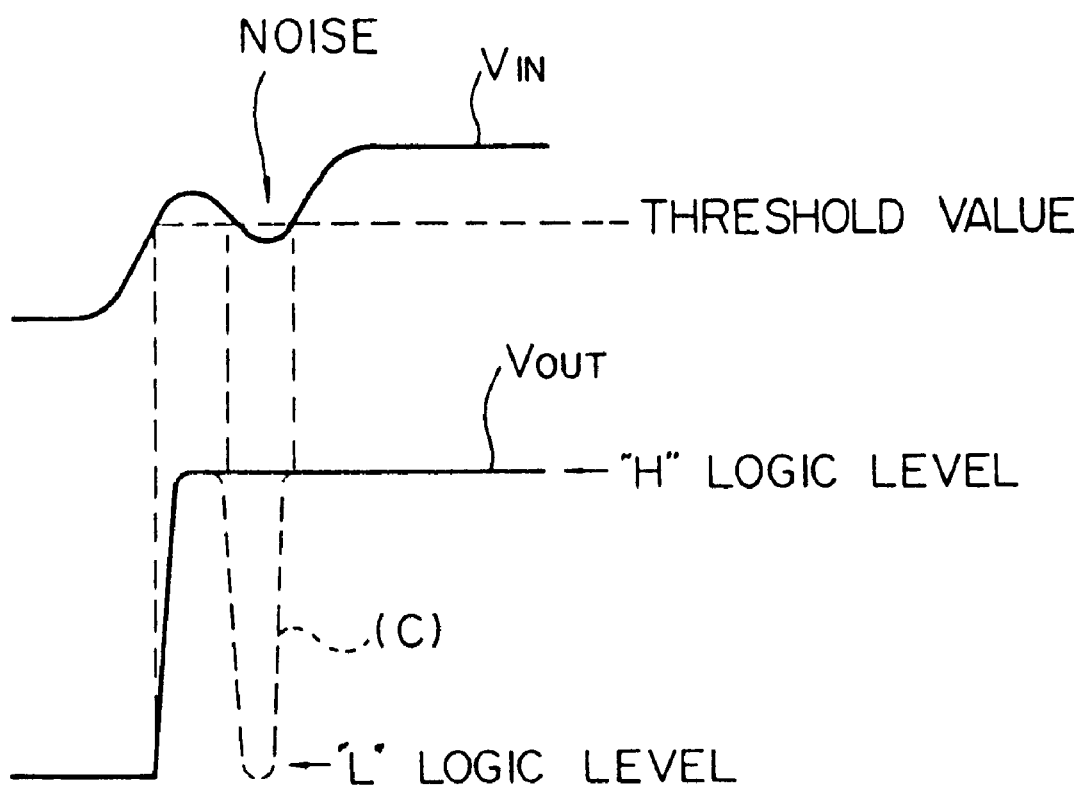
FIG. 40 is a diagram of input and output waveforms of the third embodiment.

FIGS. 38 to 40 show the semiconductor integrated circuit according to the third embodiment of the present invention.

In FIG. 38, reference numeral 30 denotes the input circuit. Symbols $Q_{31}$ and $Q_{32}$ represent the differential transistors having mutually different threshold values, and symbols $Q_{33}$ and $Q_{34}$ represent the load transistors of $Q_{31}$ and $Q_{32}$, respectively. Reference numerals 31 and 32 denote the first and second inverter gates which output the signal $V_{OUT}$ that changes with the same phase as that of $Q_{32}$, reference numeral 33 denotes a delay circuit for delaying $V_{OUT}$ by a predetermined time $td_1$, reference numeral 34 denotes the third inverter gate for inverting the output of the delay circuit 33, reference numeral 35 denotes a NAND gate for outputting a first control voltage $V_{H/L}$ which becomes the logic H when the output ($V_{DLY}$) of the third inverter gate 34 and $V_{OUT}$ are the logic L, and reference numeral 36 denotes an AND gate for outputting a second control voltage $V_{L/H}$ which becomes the logic H when both of $V_{DLY}$ and $V_{OUT}$ are the logic H.

According to the circuit construction described above, internal resistance of $Q_{34}$ can be increased for the time $td_1$ immediately after the fall of $V_{IN}$, and the internal resistance of $Q_{32}$ can be increased for the time $td_1$ immediately after the rise of $V_{IN}$. Consequently, it is possible to fix the state of the differential transistors in the predetermined period immediately after the rise/fall, in which these differential transistors are most likely to be affected by the noise, and to reliably prevent the undesirable inversion of the output logic.

In other words, FIG. 39 is a generation time chart of the signal ($V_{H/L}$) for increasing the internal resistance of $Q_{34}$ and the signal ($V_{L/H}$) for increasing the internal resistance of $Q_{33}$. The signal $V_{H/L}$ is the signal which keeps the logic H from the fall of $V_{OUT}$ to the rise of $V_{DLY}$, and the signal $V_{L/H}$ is the signal which keeps the logic H from the rise of $V_{OUT}$ to the fall of $V_{DLY}$. By the way, the H logic period of these signals $V_{H/L}$ and $V_{L/H}$ can be set to an arbitrary value by adjusting the delay time $td_1$ of the delay circuit 33.

In the H logic period of $V_{L/H}$, internal resistance of $Q_{33}$ is increased. (For example, when the logic level of $V_{H/L}$ is a TTL level, $Q_{33}$ is kept OFF.) In this case, the drain voltage of one of the differential transistors, i.e. $Q_{31}$, using this $Q_{33}$ as the load resistor is fixed to the potential corresponding to $V_{ss}$ and the drain voltage of the other differential transistor $Q_{32}$ is fixed to the potential corresponding to $V_{cc}$ (logic H). Accordingly, even when the noise or the like is inputted, the output signal $V_{OUT}$ remains at the logic H and is not inverted. During the H logic period of $V_{H/L}$, the internal resistance of $Q_{34}$ is increased (with $Q_{34}$ being kept OFF if the logic level of $V_{L/H}$ is at the TTL level, for example), and the drain voltage of the other differential transistor $Q_{32}$ using this transistor $Q_{34}$ as the load resister is fixed to the potential (logic L) corresponding to $V_{ss}$. Accordingly, even when the noise or the like is inputted, the output signal $V_{OUT}$ remains at the logic L and is not inverted.

Accordingly, it becomes possible to fix the state of the differential transistors during the predetermined time immediately after the rise/fall, in which these transistors are most likely to be affected by the noise, and to reliably prevent the undesirable inversion of the output logic. For example, even when the noise exists on $V_{IN}$ in the negative direction immediately after the rise as shown in FIG. 40, this embodiment can reliably avoid the undesirable logic inversion (refer to an imaginary line "C" in the drawing) of $V_{OUT}$ irrespective of the amplitude of the noise so long as the noise position is included within the predetermined time $td_1$.

Figure 41:
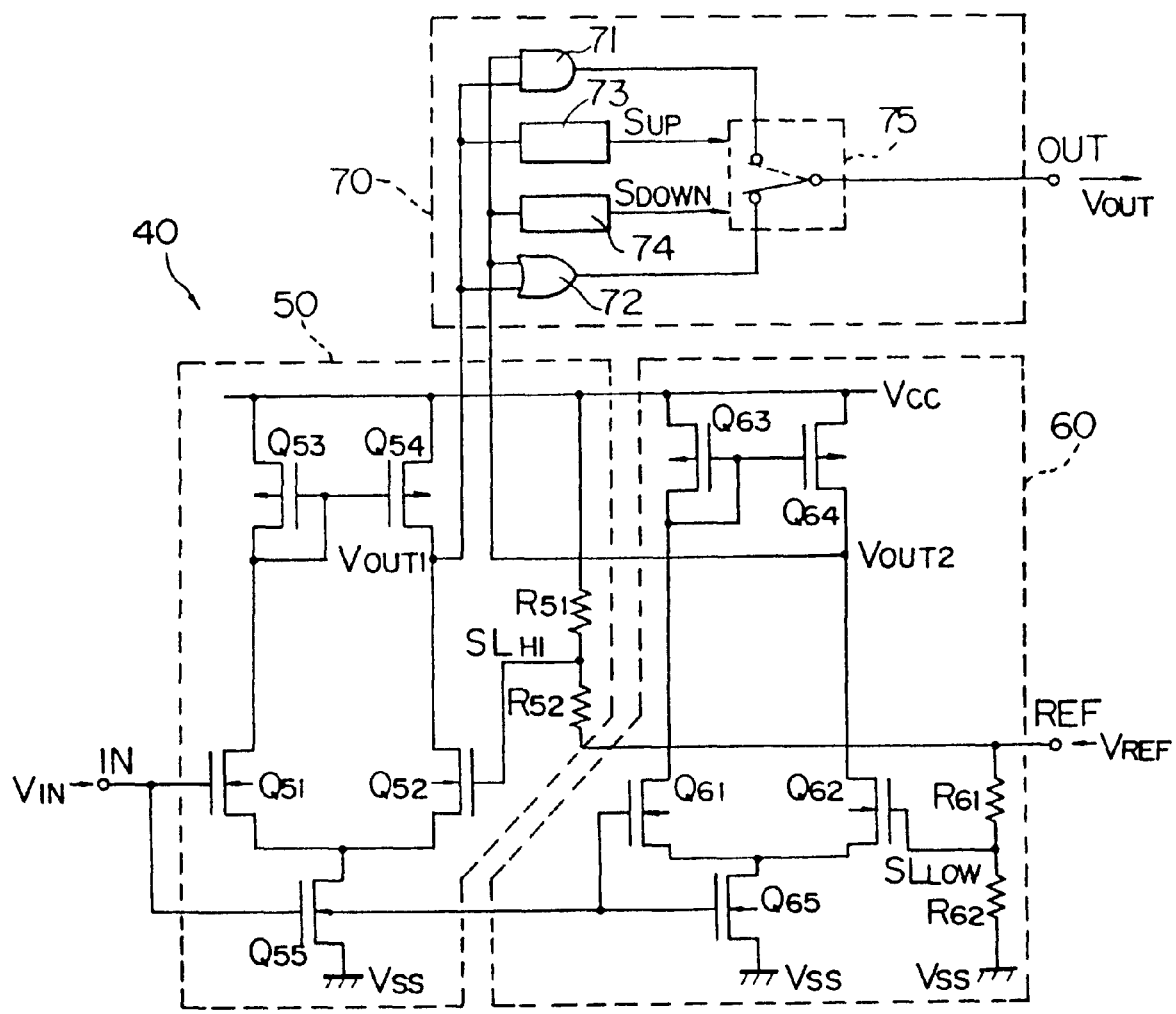
FIG. 41 is a diagram of constitution of a fourth embodiment.
Figure 42:
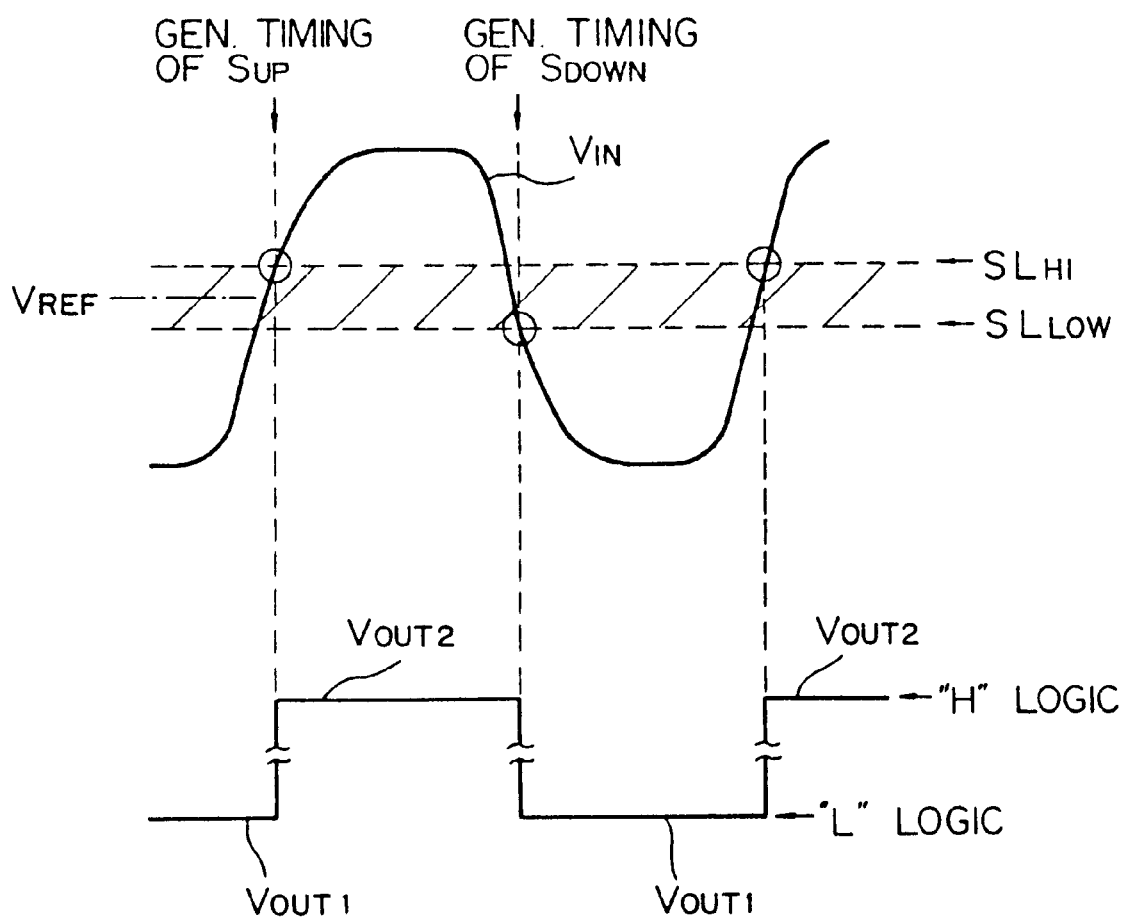
FIG. 42 is a diagram of input and output waveforms of the fourth embodiment.

FIGS. 41 and 42 show the semiconductor integrated circuit device according to the fourth embodiment of the present invention.

In FIG. 41, reference numeral 40 denotes the input circuit. This input circuit 40 includes a first differential amplification unit 50, a second differential amplification unit 60 and a selection unit (selection means) 70.

The first differential amplification unit 50 includes differential transistors $Q_{51}$, $Q_{52}$, load transistors $Q_{53}$, $Q_{54}$ and a constant current transistor $Q_{55}$. It also includes resistors $R_{51}$ and $R_{52}$ as potential generation means for generating a reference potential (the first potential) $SL_{HI}$ on the high side by effecting resistor type potential division of the potential difference (1.65V) between the power source $V_{cc}$ on the high potential side and the reference voltage $V_{REF}$.

The second differential amplification unit 60 includes differential transistors $Q_{61}$, $Q_{62}$, load transistors $Q_{63}$, $Q_{64}$ and a constant current transistor $Q_{65}$. It also includes resistors $R_{61}$ and $R_{62}$ as potential generation means for generating a reference potential $SL_{LOW}$ (the second potential) by effecting resistance potential division of the potential difference (1.65V) between the power source $V_{ss}$ on the low potential side and the reference potential $V_{REF}$.

The selection unit 70 includes an AND gate 71 for outputting a signal which becomes the logic H when both of the output $V_{OUT1}$ of the first differential amplification unit 50 and the output $V_{OUT2}$ of the second differential amplification unit 60 are the logic H (in other words, it produces the same signal as $V_{OUT1}$), an OR gate 72 for outputting a signal which becomes the logic H when one of the outputs $V_{OUT1}$ and $V_{OUT2}$ is the logic H (in other words, it produces the same signal as $V_{OUT2}$), a rise detection unit 73 for generating a signal $S_{UP}$ in synchronism with the rise of $V_{OUT1}$, a fall detection unit 74 for generating a signal $S_{DOWN}$ in synchronism with the fall of $V_{OUT2}$, and a switch 75 for switching a contact C to the position of a dash line in response to the signal $S_{UP}$ or to the position of a solid line in response to the signal $S_{DOWN}$.

According to the circuit construction described above, the first differential amplification unit 50 outputs the signal $V_{OUT1}$ which becomes the logic L when $V_{IN}<SL_{HI}$, that is, when $V_{IN}$ is within the range of not lower than +1.65+X, and becomes the logic H when $V_{IN}>SL_{HI}$, that is, when $V_{IN}$ is within the region exceeding +1.65V+X. The second differential amplification unit 60 outputs the signal $V_{OUT2}$ which becomes the logic L when $V_{IN}<SL_{LOW}$, that is, when $V_{IN}$ is within the range not higher than +1.65-Y (Y may be equal to X) and becomes the logic H when $V_{IN}>SL_{LOW}$, that is, when $V_{IN}$ is within the range higher than +1.65V-Y. When the rise and fall timings of these two output signals $V_{OUT1}$ and $V_{OUT2}$ are compared, the rise timing is slower for $V_{OUT1}$ and the fall timing is slower for $V_{OUT2}$. Such rise/fall timing differences are determined by the difference between $SL_{HI}$ and $SL_{LOW}$, that is, by X+Y.

These two output signals $V_{OUT1}$ and $V_{OUT2}$ are combined in the selection unit 70 as shown in FIG. 42. First of all, when $V_{IN}$ exceeds $SL_{HI}$, $V_{OUT1}$ rises and $S_{UP}$ occurs in response to this rise. Accordingly, the contact C of the switch 75 is switched to the position indicated by the solid line and the output of the OR gate 72 (or in other words, $V_{OUT2}$) is selected. Next, when $V_{IN}$ is lower than $SL_{LOW}$, $V_{OUT2}$ rises and $S_{DOWN}$ occurs in response to this rise. Accordingly, the contact C of the switch 75 is switched to the position indicated by the solid line and output of the AND gate 71 (that is, $V_{OUT1}$) is selected. As a result, the signal $V_{OUT}$ which has the H logic period from the rise timing of $V_{OUT1}$ (the occurrence timing of $S_{UP}$) to the fall timing of $V_{OUT2}$ (the occurrence timing of $S_{DOWN}$) can be taken out from the selection unit 70.

Accordingly, after $V_{IN}$ exceeds once $SL_{HI}$, the logic of the signal $V_{OUT}$ is not inverted unless it exceeds $SL_{HI}$, and the noise resistance can be increased by securing the input margin (the hatched region in FIG. 42) corresponding to the difference between $SL_{HI}$ and $S_{LOW}$.

Fifth Aspect of the Invention

For a better understanding of the preferred embodiments, the related prior art will be explained with reference to FIGS. 43 to 46.

Both of CTT and GTL terminate the wirings thereof to a voltage lower than the power source voltage and generate a signal amplitude of not greater than 1V across both ends of a resistor by a driving current of an output circuit flowing through this terminal resistor. Reflection of the signal is prevented by bringing the value of the terminal resistor into conformity with the characteristic impedance of the wirings, and high speed data transfer is made possible. Hereinafter, a prior art example of a semiconductor integrated circuit equipped with an output circuit to be adapted to the CTT level and the GTL level will be explained.

[CTT]

Figure 43:
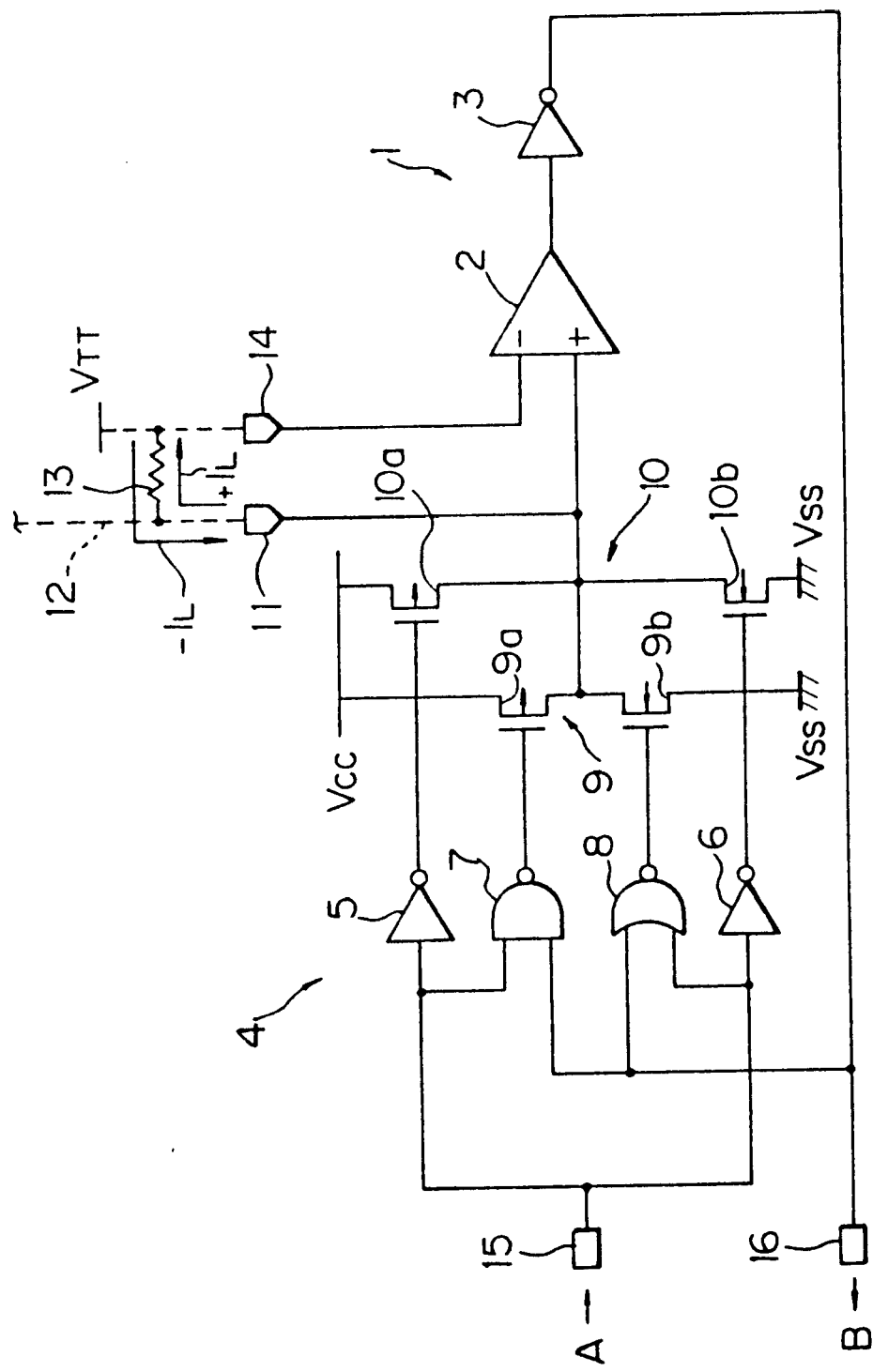
FIG. 43 is a diagram illustrating a conventional constitution of a CTT system.

FIG. 43 is a structural circuit diagram of a transceiver circuit of CTT. Reference numeral 1 denotes an input circuit including a differential amplifier 2 and an inverter gate 3, and reference numeral 4 denotes an output circuit including inverter gates 5, 6, a NAND gate 7, a NOR gate 8 and two-stage CMOS output units 9, 10. In the pre-stage CMOS unit 9, a P channel MOS transistor (hereinafter referred to as the "PMOS transistor") 9a and an N channel MOS transistor (hereinafter referred to as the "NMOS transistor") 9b are connected in the push-pull connection between a power source $V_{cc}$ on the high potential side and a power source $V_{ss}$ on the low potential side. Similarly, in the post-stage CMOS unit 10, a PMOS transistor 10a and an NMOS transistor 10b are connected in the push-pull connection between $V_{cc}$ and $V_{ss}$. Reference numeral 11 denotes an input/output terminal for connecting a wiring 12 to one of the ends of a terminal resistor 13, reference numeral 14 denotes a reference power source terminal for connecting the other end of the terminal resistor 13 to a pull-up power source $V_{TT}$ (VTT=$V_{cc}$/2; +1.65V when $V_{cc}$=+3.3V), reference numeral 15 denotes an input terminal of a signal (represented by symbol "A" for convenience' sake) from an internal circuit and reference numeral 16 denotes an output terminal of a signal (represented by symbol "B" for convenience' sake) to the internal circuit.

In the circuit construction described above, the level of the terminal 16 (the level of the signal B) is determined by the potential relationship between the inversion input (−) and non-inversion input (+) of the differential amplifier 2. In other words, since the potential of the inversion input (−) is VTT=1.65V, the signal B is the L level when the potential of the non-inversion input (+) is greater than 1.65V and is the H level when the non-inversion input is lower than +1.65V.

When the signal A is inputted at the H level while the signal B is at the H level, the outputs of the inverter gates 1, 2, the NAND gate 3 and the NOR gate 4 become all the L level. For this reason, the PMOS transistors 9a, 10a of the two-stage CMOS units 9, 10 are turned ON while the NMOS transistors 9b, 10b are turned OFF, and a current +$I_L$ flows in the direction of $V_{cc}$→PMOS transistor 9a (10a) →terminal resistor 13→$V_{TT}$. Accordingly, the signal B falls to the L level at the point of time when the potential of the non-inversion input (+) of the differential amplifier 2 becomes higher by $I_L \times R_L$ (where $R_L$ is the value of the terminal resistor 13) than the potential of the inversion input (−) (as will be explained below).

When the signal A changes from the H level to the L level, the outputs of the inverter gates 5, 6, the NAND gate 7 and the NOR gate 8 all become the H level, and the PMOS transistors 9a, 10a of the two-stage CMOS units 9, 10 are turned OFF while their NOMS transistor 9b, 10b are turned ON, contrary to the case described above. Therefore, a current −$I_L$ flows through $V_{TT}$→NMOS transistor 9b (10b) →$V_{ss}$. Accordingly, the signal B inverses to the H level at the point of time when the potential of the non-inversion input (+) of the differential amplifier 2 becomes lower by $I_L \times R_L$ (where $R_l$ is the value of the terminal resistor 13) than the potential of the inversion input (−) (as will be explained next*.)

Figure 44:
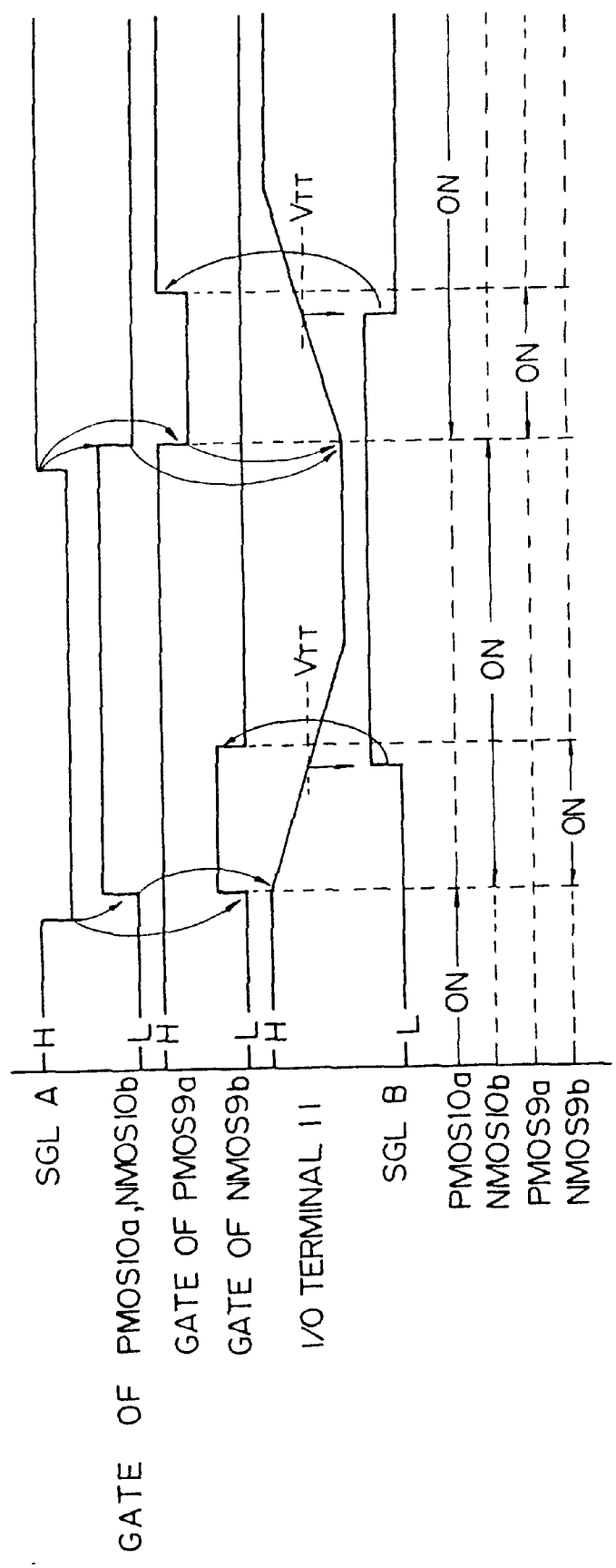
FIG. 44 is a time chart of the circuit of FIG. 43.

As shown in FIG. 44, the potential at the output terminal 11 changes relatively slowly in accordance with a time constant curve determined by the capacitance of the wiring 12, etc. Therefore, the signal B changes after the passage of a predetermined time corresponding to the time constant from the shift of the level of the signal A. Accordingly, during the shift of the signal A from H to L, the current −$I_L$ flows through the two NMOS transistors 9b, 10b (or in other words, at a low resistance) until the signal B changes to the H level. When the signal B reaches thereafter the H level, the current $-I_L$ flows through one NMOS transistor 10b (or in other words, at a high resistance). On the other hand, during the shift of the signal A from L to H, the current $+I_L$ flows through the two PMOS transistors 9a, 10a (or in other words, at the low resistance) until the signal B changes to the L level. When the signal B thereafter reaches the L level, the current $+I_L$ flows through one PMOS transistor 9b (or in other words, at the high resistance). This means that a large driving current can be caused to flow in the former half period of the output transition period and a small driving current can be caused to flow in the latter half, and the occurrence of ringing, over-shoot, etc, can be suppressed by providing the difference to the load currents flowing in and out through the output terminal 11.

Figure 45:
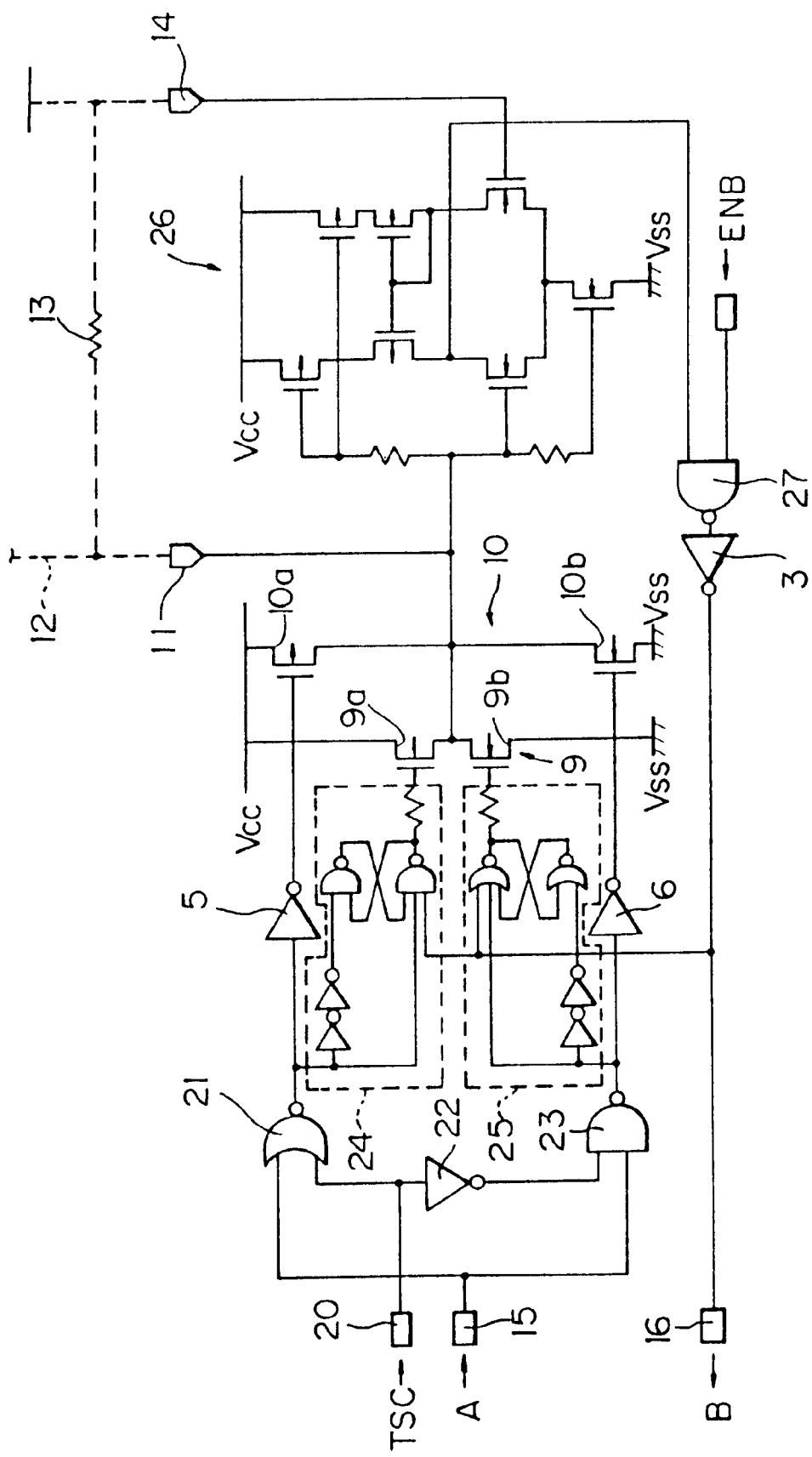
FIG. 45 is a diagram illustrating a conventional constitution of a tri-state CTT system.

FIG. 45 shows the structure wherein a tristate control circuit is added to the circuit shown in FIG. 43. This tristate control circuit includes a control terminal 20 for receiving a tristate control signal TSC of positive logic, a NOR gate 21 for converting the output to the L level when either one of the signal A and the signal TSC is the H level, an inverter gate 22 for inverting and outputting the signal TSC and a NAND gate 23 for converting the output to the L level when both of the output of the inverter gate 22 and the signal A are the H level. When the signal TSC is the L level, the PMOS transistors 9a and the NMOS transistor 9b, and the PMOS transistor 10a and the NMOS transistor 10b, are caused to conduct the push-pull operation in accordance with the level of the signal A, and when the signal TSC is the H level, the H level is applied to the gates of the PMOS transistors 9a, 10a while the L level is applied to the gates of the NMOS transistors 9b, 10b, so that the ON operation of these transistors is inhibited and the output terminal 11 can be brought into the open state. In other words, according to the circuit construction of FIG. 45, the output terminal 11 can assume the three values (tristate) of the H level, the L level and the open state.

By the way, two circuits 24, 25 connected to the pre-state CMOS unit 9 in FIG. 45 correspond to the NAND gate 7 and the NOR gate 8 in FIG. 43, respectively, and they are so-called "deglitcher circuits" for improving the noise resistance by inhibiting the acceptance of an input for a predetermined time from the acceptance of one input. The AND gate 27 interposed between the differential amplifier 26 (the detailed structure of which is the same as that of the embodiment and will be explained elsewhere) and the inverter gate 3 is for cutting off the input at the time of stand-by, which permits the output of the differential amplifier 26 only when an enable signal ENB is the H level.

[GTL]

Figure 46:
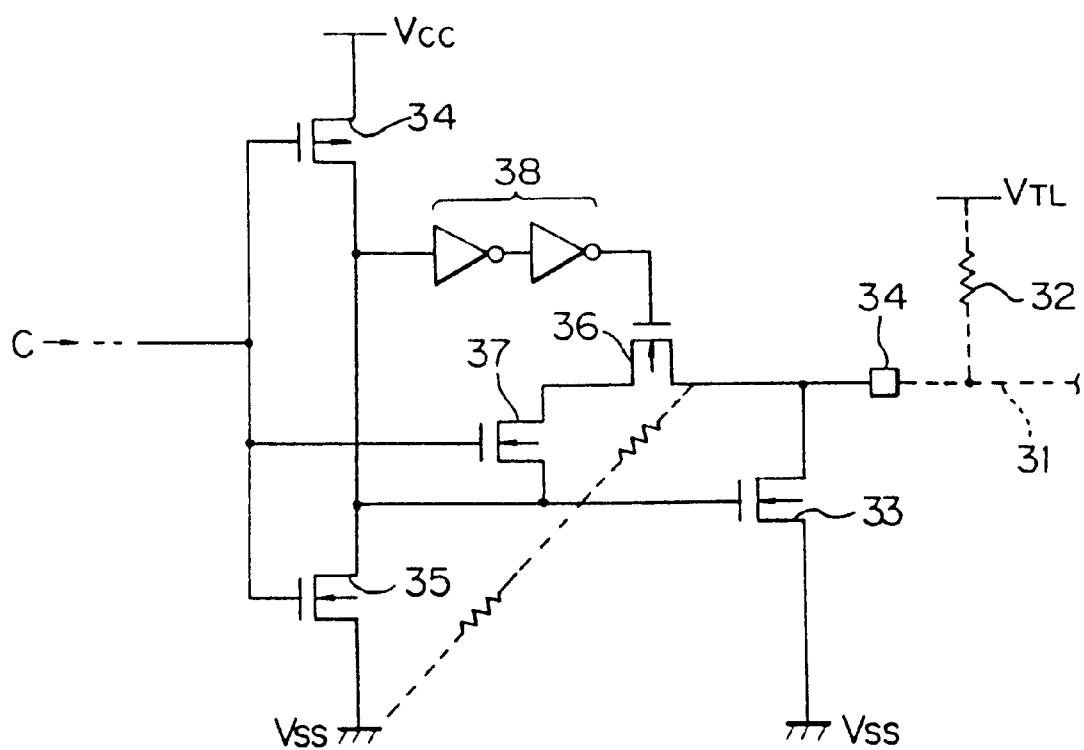
FIG. 46 is a diagram illustrating a conventional constitution of a GTL system.
Figure 47:
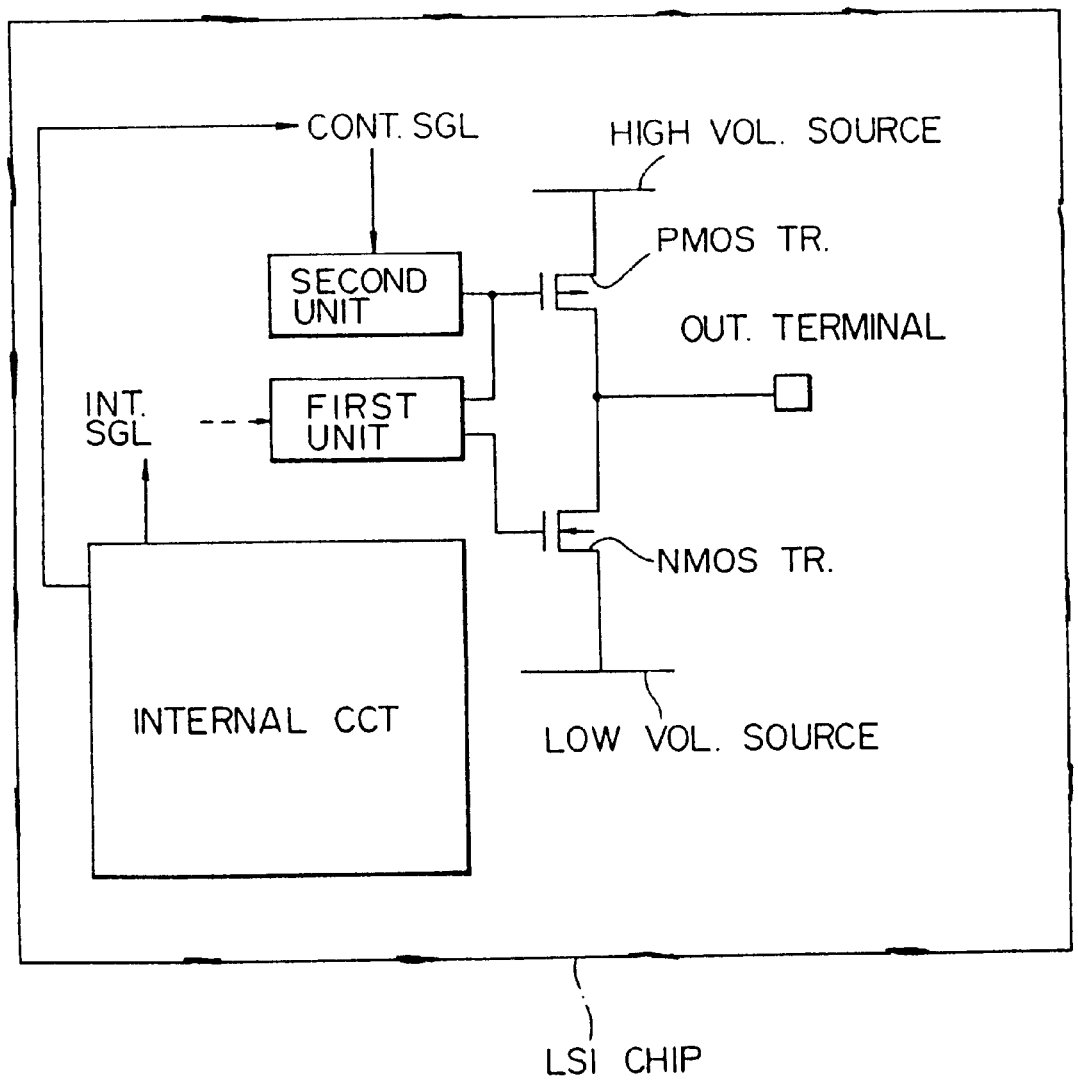
FIG. 47 is a diagram illustrating the principle and constitution of a fifth aspect of the present invention.

FIG. 46 is a structural circuit diagram of an output circuit of a GTL. This circuit connects a wiring 31 to an output terminal 30 thereof, pulls up a potential to a predetermined potential $V_{TL}$ (where $V_{TL}$ is determined to 1.2V) through a terminal resistor 32, and connects the gate of an NMOS transistor 33, which is interposed between the output terminal 30 and $V_{ss}$, to an output stage (consisting of a PMOS transistor 34 and an NMOS transistor 35) having a push-pull structure. Two NMOS transistors 36, 37 are resistance elements which are connected in parallel with the NMOS transistor 33 for a time (tα) determined by the number of stages (2, in the drawing) of an inverter gate 38 when the input signal C shifts from the L level to the H level. A load current is caused to flow at a low resistance through the parallel circuit comprising the NMOS transistor 33 and the two NMOS transistors 36, 37 till the time tα passes away and after the passage of this time tα, the load current is caused to flow at a high resistance through only the NMOS transistor 33, so that the occurrence of the noise such as ringing resulting from snap-off can be prevented while accomplishing high speed driving.

In the semiconductor integrated circuit according to the prior art described above, however, the output circuit can be used for only one of the CTT and the GTL. For this reason, it has been necessary to produce a semiconductor integrated circuit equipped with two kinds of output circuits for the CTT and for the GTL. Accordingly, the price of the semiconductor chip becomes high, and the cost of management becomes high, too, due to the increase of the number of the total stock. From the aspect of users, side, different chips must be used for different standards of transmission lines; hence, the interface design becomes troublesome.

By the way, in the output circuit of the CTT (see FIG. 43), the output circuit can be used for the TTL level, too, by removing the terminal resistor 13, but it does not have compatibility with the GTL. This is because the GTL essentially requires the open drain structure, and even in the case of an expansion type CTT, it is of the three-state type and does not have the structure that satisfy this condition.

To eliminate such problems with the prior art, the structure of the present invention characterizingly includes a PMOS transistor and an NMOS transistor that are interposed in series between a power source on the high potential side and power source on the low potential side, an output terminal extended from the junction of both of these transistors, first means for allowing the PMOS transistor and the NMOS transistor to effect the push-pull operation in accordance with the logic of the signal to be outputted, and second means for cutting off the PMOS transistor in response to a predetermined level designation signal.

According to the present invention, when the output terminal is pulled up to the intermediate potential ($V_{TT}$) between the high potential side power source and the low potential side power source while the control signal is kept non-active, a current flows through the pull-up resistor through either the PMOS transistor or the NMOS transistor, and a potential of the CTT level appears at the output terminal.

When the control signal is rendered active, the PMOS transistor is cut off and the open-drain structure can be accomplished. When the output terminal is pulled up to the predetermined potential (+1.2V), a potential of the GTL level appears at the output terminal.

Furthermore, when the pull-up resistor is removed while the control signal is kept non-active, a potential of the TTL level appears at the output terminal.

Next, an embodiment of the present invention will be explained with reference to the drawings.

FIGS. 48 to 53 show the semiconductor integrated circuit according to an embodiment of the present invention.

Figure 48:
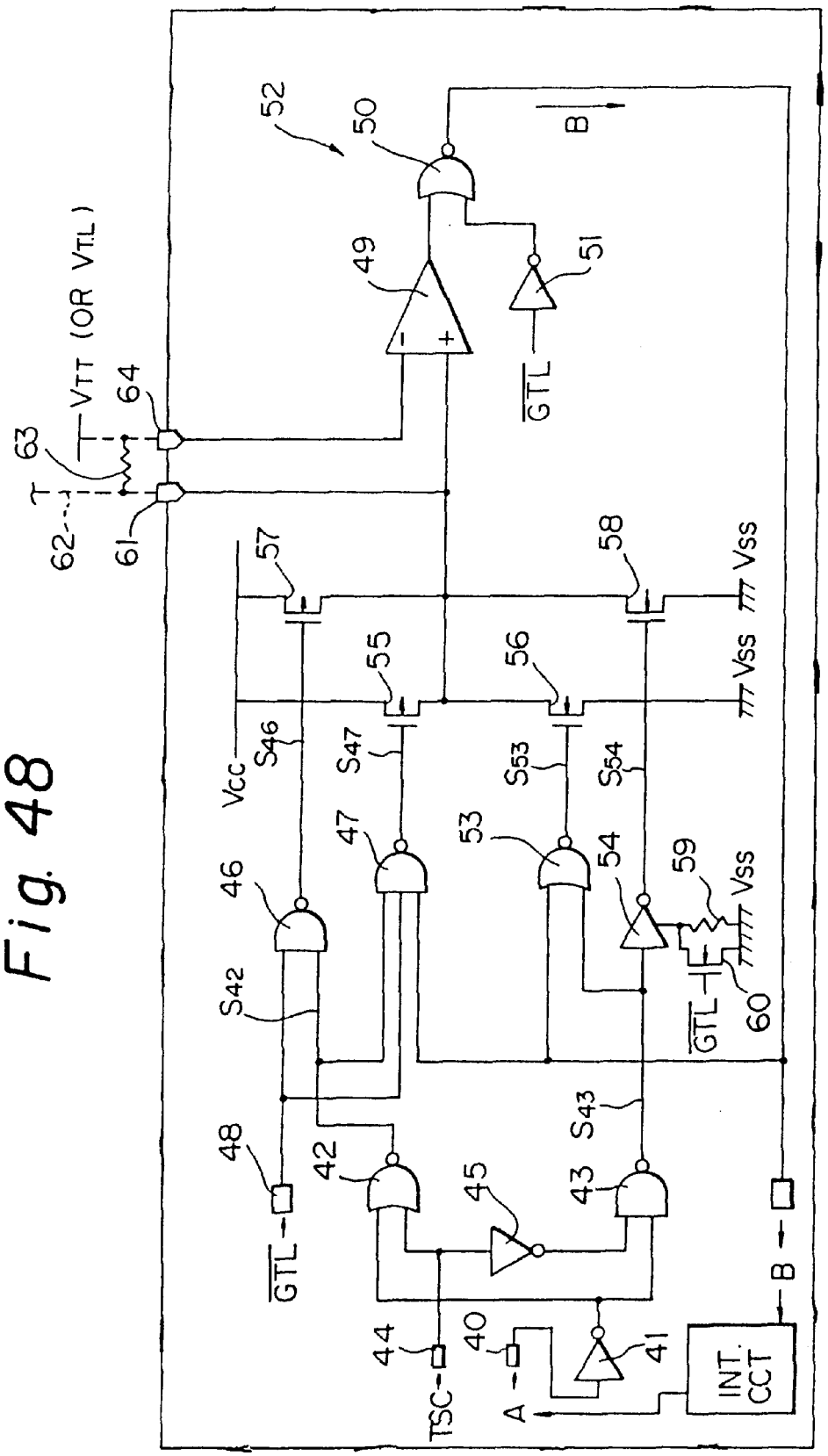
FIG. 48 is a diagram of constitution of an embodiment.

First of all, the structure will be explained. In FIG. 48, a signal (represented by symbol "A" for convenience' sake) from an internal circuit applied to the input terminal 40 is first inverted by an inverter gate 41 and is then applied to one of the input each of the NOR gate 42 and the NAND gate 43. A tristate control signal TSC (which designates an output high impedance at the time of the low level) is applied to the other input terminal of the NOR gate 42 through a control terminal 44, and the same signal TSC inverted by the inverter gate 45 is applied to the other input terminal of the NAND gate 43. Accordingly, a signal $S_{42}$ which becomes the low level when the signal A is the low level or the signal TSC is the high level is outputted from the NOR gate 42, and a signal S$_{43}$ which becomes the low level when both of the signal A and the signal TSC are the low level is outputted from the NAND gate 43.

The signal S$_{42}$ is applied to one of the input terminals of the AND gate 46 and to one of the input terminals of a three-input AND gate 47. A predetermined level designation signal GTL (GTL designation at the low level/CTT designation at the high level) is further applied to these AND gates 46, 47 through a control terminal 48. A signal from an input circuit (signal B to an internal circuit) including a differential amplifier 49, an inverter gate 50 and a NOR gate 51 is applied to the remaining one input terminal of the three-input NAND gate 47. The signal S$_{43}$ is applied not only to one of the input terminals of the NOR gate 53 but also to the inverter gate 54, and the signal B from the input circuit 52 is applied to the other input terminal of the NOR gate 53. Accordingly, these AND gates 46, 47, NOR gate 53 and inverter gate 54 output the signals S$_{42}$, S$_{43}$ (which are determined by the state of the signal A and the signal TSC) and the signals S$_{46}$, S$_{47}$, S$_{53}$, S$_{54}$ in accordance with the state of the signal GTL and the signal B, and these signals S$_{46}$, S$_{47}$, S$_{53}$, S$_{54}$ are applied to the gates of a PMOS transistor 55 and an NMOS transistor 56, and a PMOS transistor 57 and an NMOS transistor 58, that are interposed in the bush-pull connection between the high potential side power source V$_{cc}$ (+3.3V) and the low potential side power source (0V).

The PMOS transistor 57 and the NMOS transistor 58 conduct the push-pull operation (they are turned ON and OFF complementarily) in accordance with the logic of the signal A when the signal gtl is the high level (CTT designation) and the signal TSC is the low level. However, when the signal TSC is the high level (output high impedance designation), both of them are fixed at OFF or when the signal GTL is the low level (GTL designation), only the PMOS transistor 57 is fixed at OFF.

Similarly, the PMOS transistor 55 and the NMOS transistor 56 conduct the push-pull operation in accordance with the logic of the signal A when the signal GTL is the high level (CTT designation), the signal TSC is the low level and moreover, the signal B is the high level. When the signal TSC is the high level (output high impedance designation), both of them are fixed at OFF or when the signal GTL is the low level (GTL designation), only the MPOS transistor 55 is kept at OFF.

Accordingly, the inverter gates 41, 45, 54, the NOR gates 42, 53 and the NAND gates 43, 46, 47 are integral means for causing the push-pull operation of the PMOS transistor 55 and the NMOS transistor 56 or the PMOS transistor 57 and the NMOS transistor 58, and the NAND gates 46, 47 are means for cutting off the PMOS transistor 55 or the PMOS transistor 57 in response to a predetermined control signal (signal GTL).

Here, a current limiting resistor 59 is inserted in the line of the low potential side power source V$_{ss}$ of the invertor gate 54 which outputs the signal S$_{54}$, and an NMOS transistor 60 which is turned ON when the signal GTL is the high level (CTT designation) is connected across both ends of this resistor 59. The potential V$_{ss}$ is supplied through the ON resistance of the NMOS transistor 60 when CTT is designated. However, since V$_{ss}$ is supplied through the resistor 59 at the time of the GTL designation, the fall of the signal S$_{54}$ at the time of the GTL designation, that is, the fall of the gate potential of the NMOS transistor 58, is retarded.

The drain of each of the MPOS transistor 56, the PMOS transistor 57 and the NMOS transistor 58 is connected to the non-inversion input (+) and output terminal 61 of the differential amplifier 49. One of the ends of each of a wiring 62 and a terminal resistor 63 is connected to the output terminal 61, and a power source (V$_{TT}$=+1.65V or V$_{TL}$=1.2V) which is connected to the other end of this terminal resistor 63 and has a predetermined potential is applied to the non-inversion input (−) of the differential amplifier 46 through the reference terminal 64.

The differential amplifier 49 compares the drain potentials of the PMOS transistor 55, the NMOS transistor 56, the PMOS transistor 57 and the NMOS transistor 58, that is, the potential at the input/output terminal 61 (hereinafter referred to as "V$_{I/O}$") with the potential at the reference terminal 64 (hereinafter referred to as "V$_{REF}$"), and outputs a high level signal when V$_{I/O}$>V$_{REF}$. It is means for detecting determination of the logical state of the input/output terminal 61. The output of the differential amplifier 49 is inverted by the NOR gate 50 and is converted to the signal B as the logic detection signal. This signal B is fixed at the low level irrespective of the logic of the input/output terminal 61 when the output of the inverter gate 51 is the high level or in other words, when the signal GTL is the low level (GTL designation).

Figure 49A:
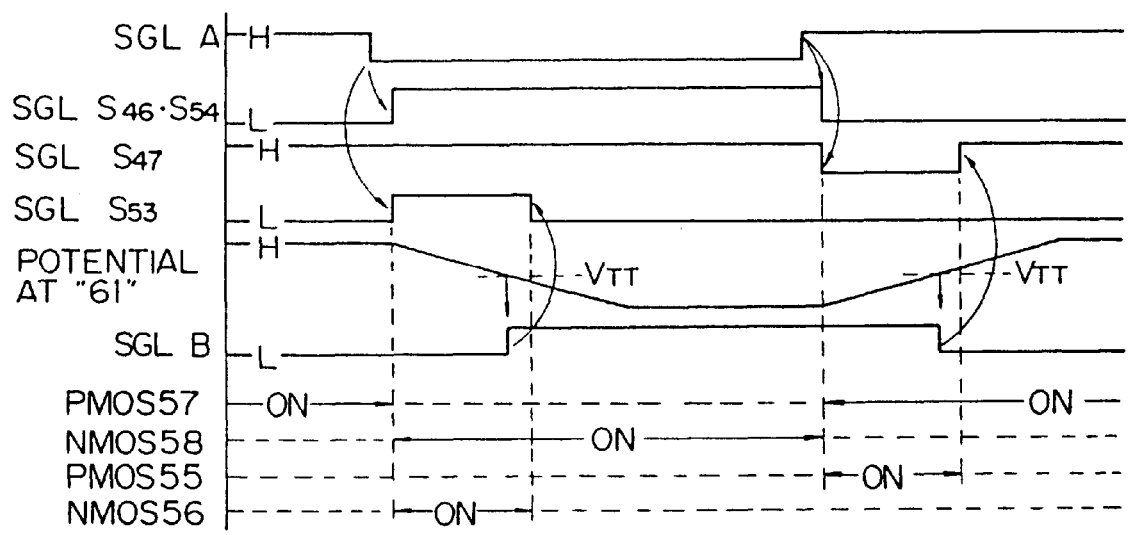
FIG. 49 is a time chart of the embodiment.
Figure 49B:
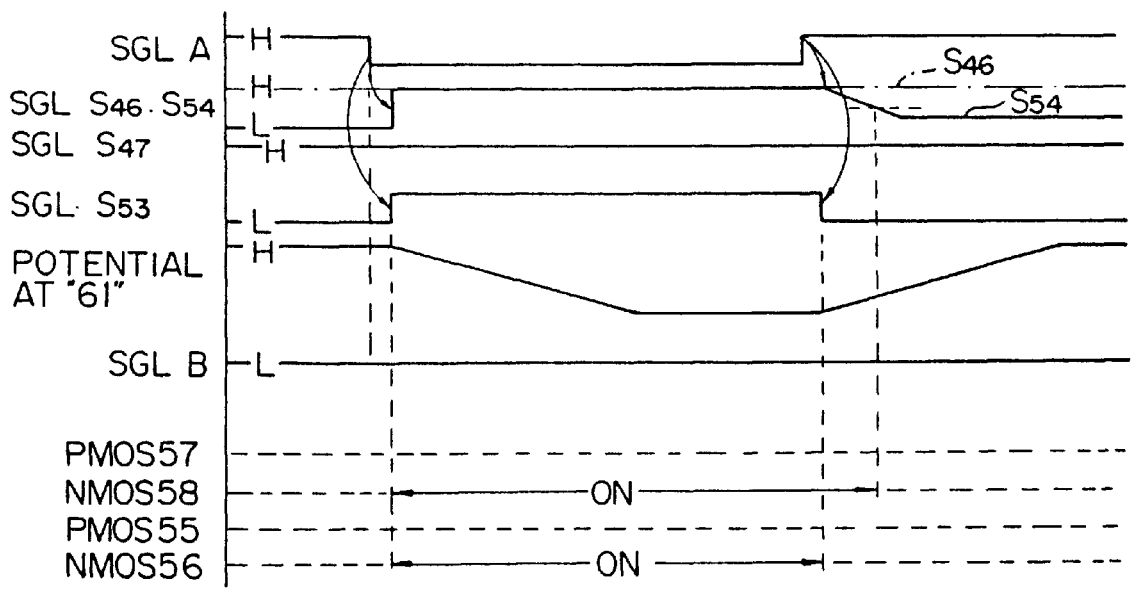

Next, the operation will be explained. FIG. 49(a) is a time chart when the signal GTL is the high level, that is, in the case of the CTT designation, and FIG. 49(b) is a time chart when the signal GTL is the low level, that is, in the case of the GTL designation.

[CTT Operation]

In FIG. 49(a), when the signal A shifts from the high level to the low level, the signal S$_{46}$, the signal S$_{54}$ and the signal S$_{53}$ change to the high level and the NMOS transistor 58 ask well as the NMOS transistor 56 are turned ON. Accordingly, the output terminal 61 and V$_{ss}$ are connected with each other at a low resistance through the NMOS transistors 58 and 56, and the potential of the output terminal 61 starts lowering toward V$_{ss}$. This fall proceeds in match with the discharge rate of a large capacitance of the wiring 62. As the time passes away and the potential of the output terminal 61 becomes lower than the reference potential V$_{REF}$ (V$_{REF}$=V$_{TT}$ in the time of the CTT operation), the signal B changes to the high level and the signal S$_{53}$ changes to the low level in response to this change, so that the NMOS transistor 56 is turned OFF. Accordingly, in the range where the potential of the output terminal 61 is lower than V$_{TT}$, only the NMOS transistor 58 drives the output terminal 61. In other words, the driving capacity is limited and over-shoot of the waveform can be avoided.

On the other hand, when the signal A changes from the low level to the high level, the signal S$_{46}$, the signal S$_{56}$ and the signal S$_{53}$ change to the low level, and the PMOS transistor 55 as well as the PMOS transistor 57 are turned ON. In consequence, the output terminal 61 and V$_{cc}$ are connected with each other at a low resistance through the PMOS transistor 55 and the PMOS transistor 57, and the potential of the output terminal 61 starts rising toward V$_{cc}$. When the potential of the output terminal 61 becomes higher than the reference potential V$_{TT}$, the signal B changes to the low level and the signal S$_{47}$ changes to the high level in response to the former, so that the PMOS transistor 55 is turned OFF. Accordingly, only the PMOS transistor 57 drives the output terminal 61 in the range where the potential of the output terminal 61 is higher than V$_{TT}$, and over-shoot of the rise waveform can be avoided by limiting the driving capacity.

[GTL Operation]

Referring to FIG. 49(b), when the signal A shifts from the high level to the low level, the signal S$_{54}$ and the signal S$_{53}$ change to the high level, and the NMOS transistor 58 and the NMOS transistor 56 are turned ON. For this reason, the output terminal 61 and $V_{ss}$ are connected with each other at a low resistance through the NMOS transistor 58 and the NMOS transistor 56, and the potential of the output terminal 61 falls toward $V_{ss}$ and gets stabilized at the low level after the passage of a predetermined time. By the way, the signal B is kept fixed at the low level in this GTL operation.

On the other hand, when the signal A shifts from the low level to the high level, the signal $S_{53}$ immediately changes to the low level, whereas the signal $S_{54}$ slowly changes and decreases due to the operation of the current limiting resistor 59. For this reason, a difference can be secured in the OFF timing between the PMOS transistor 55 and the PMOS transistor 57, and instantaneous current cut-off can be prevented by avoiding drastic snap-off. As a result, reverse electromotive force induced in the parasitic inductance components of the wiring 62 and the power source system can be suppressed and the occurrence of detrimental noises can be prevented.

According to the embodiment described above, the same transceiver circuit can be used for both of the CTT level and the GTL level by merely changing over the levels of the signal GTL, or if the terminal resistor is removed while keeping the CTT operation, the receiver circuit can also be used for the TTL level. Accordingly, this embodiment can provide a transceiver circuit having compatibility to the three systems, and can reduce the price of the semiconductor chips and the management cost resulting from the reduction of the number of the total stock. Since the same chip can be used even when the standards of the transmission lines are different, the interface design can be carried out more easily.

Figure 50:
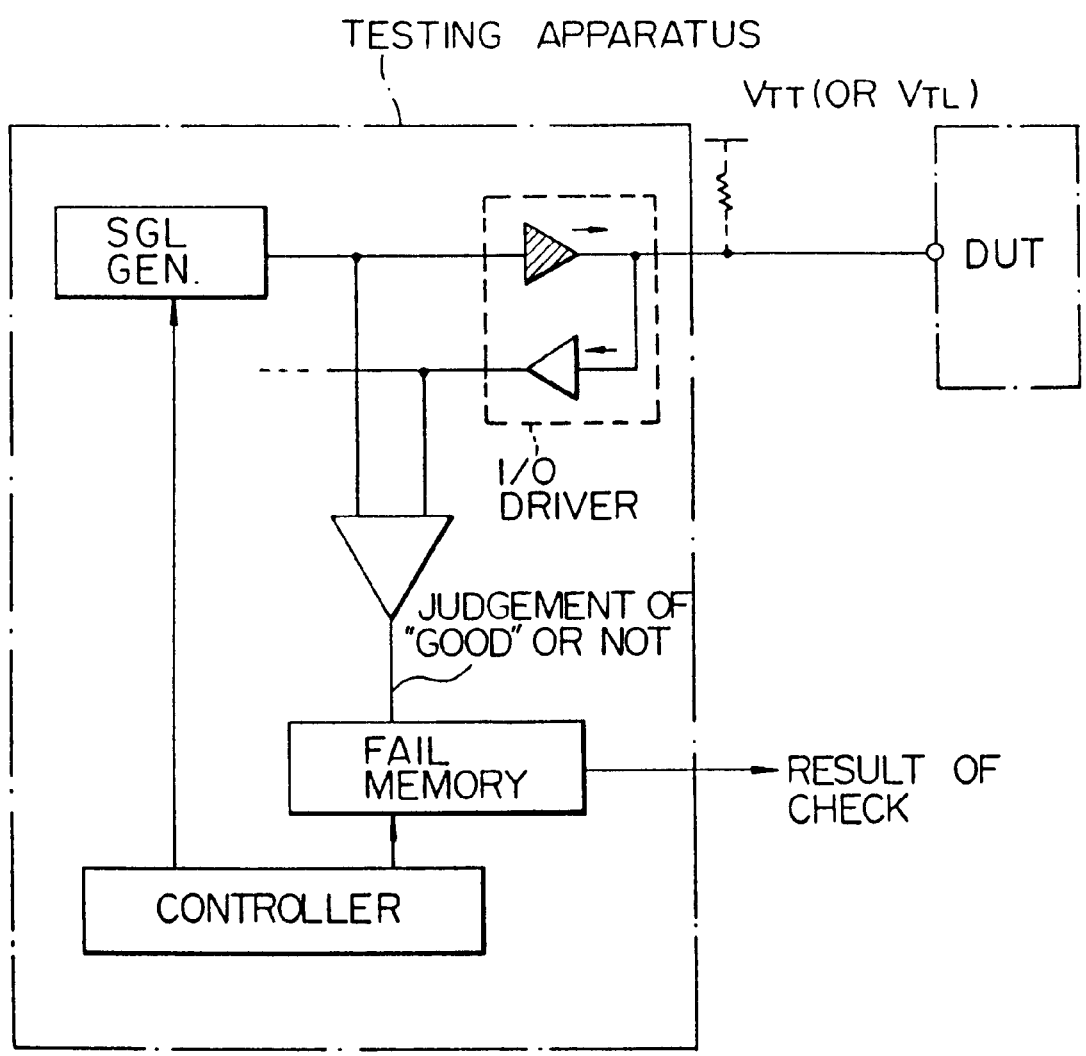
FIG. 50 is a diagram schematically showing a testing device to which the embodiment is adapted.

For example, the application to a testing apparatus (a memory tester or an LSI tester) shown in FIG. 50 is preferred. In such a testing apparatus, an input/output driver (the transceiver circuit) must be replaced in accordance with the interface system of a DUT (Device Under Test). Therefore, if this embodiment is applied, one input/output driver can be used in common for at least three systems of TTL, CTT and GTL.

Here, the output low level of GTL is +0.4V and the output low level of CTT is +1.25V. This difference means that the driving capacity of the transistors for low level driving (the NMOS transistors 56 and 58) is not equal between CTT and GTL. In other words, the optimum driving capacity for GTL is excessively greater for CTT. If the internal resistance of the transistor when the low level of the GTL system is outputted is X, for example, the value X necessary for generating +0.4V from the terminal voltage (+1.2V) is $X=12.5\Omega$ from the following equation ①:

$$0.4V/1.2V=X/(X+25\Omega) \qquad ①$$

where the resistance value 25Ω is a parallel combined resistance value of the terminal resistor 63 (50Ω) across both ends of the wiring 62. Since the terminal voltage is +1.65V in the CTT system, the internal resistance Y of the transistor necessary for generating +1.25V at this terminal resistance 25Ω is Y=78.125Ω from the following equation ②:

$$1.25V/1.65V=Y/(Y+25\Omega) \qquad ②$$

Accordingly, if the internal resistance of the driving transistor is 12.5Ω, for example, the logical amplitude becomes too great in the CTT system, and the operation speed is lowered, on the contrary.

This problem can be avoided by using two driving transistors (NMOS transistors 56 and 58 in this embodiment) for low level driving, regulating the combined internal resistance of these two transistors to 12.5Ω and setting the internal resistance of one of the transistors (the NMOS transistor 58 in the embodiment) to 78.124Ω. The internal resistance of the other transistor (the NMOS transistor 56 in this embodiment) proves to be 14.88Ω by simple calculation. Driving is effected by these two transistors in the case of the GTL system, but in the case of the CTT system, driving is made only for a short time by these two transistors and is then made by the transistor having the internal resistance of 78.12Ω alone.

Figure 51:
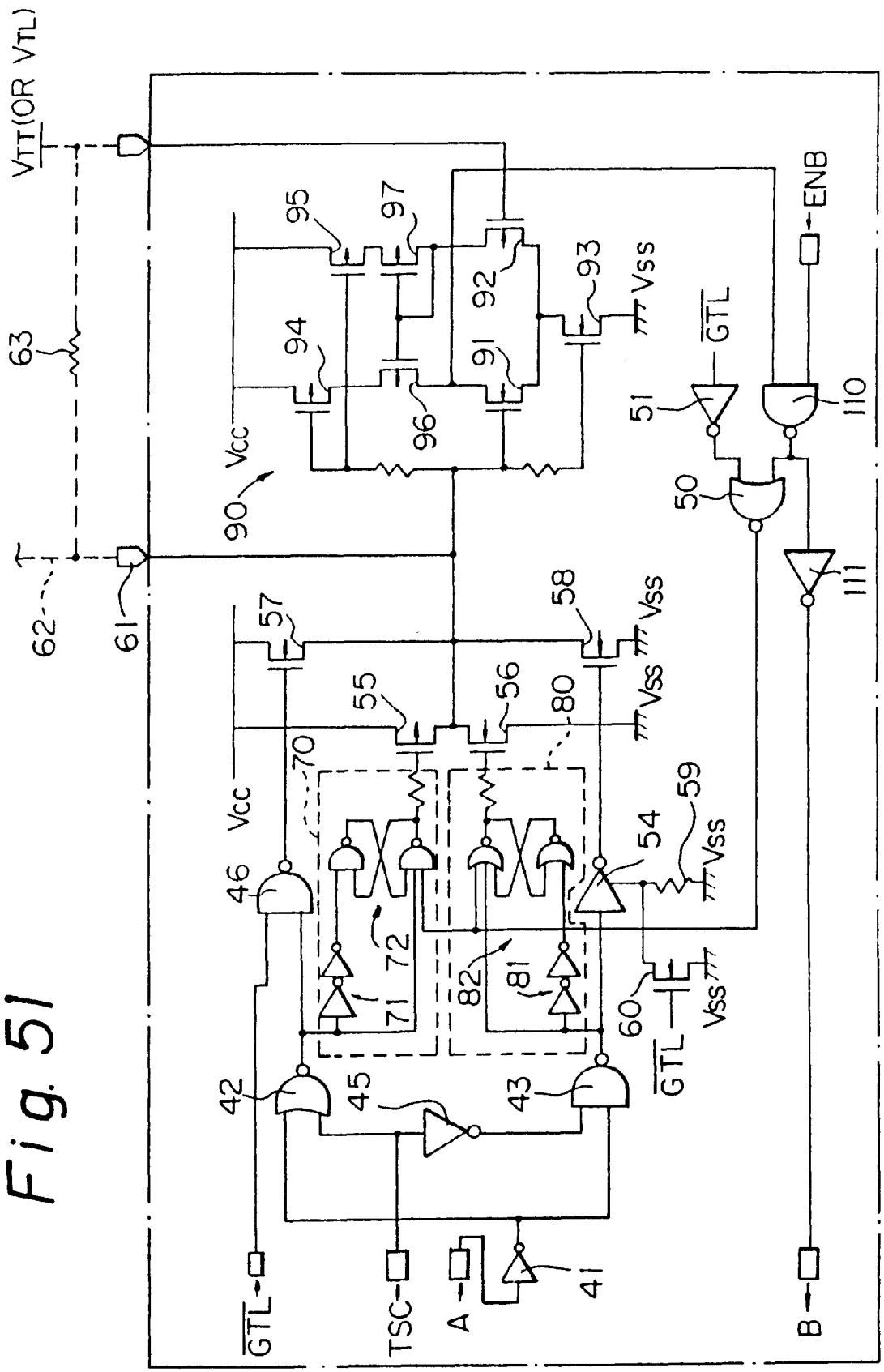
FIG. 51 is a diagram showing a concrete constitution of the embodiment.
Figure 52:
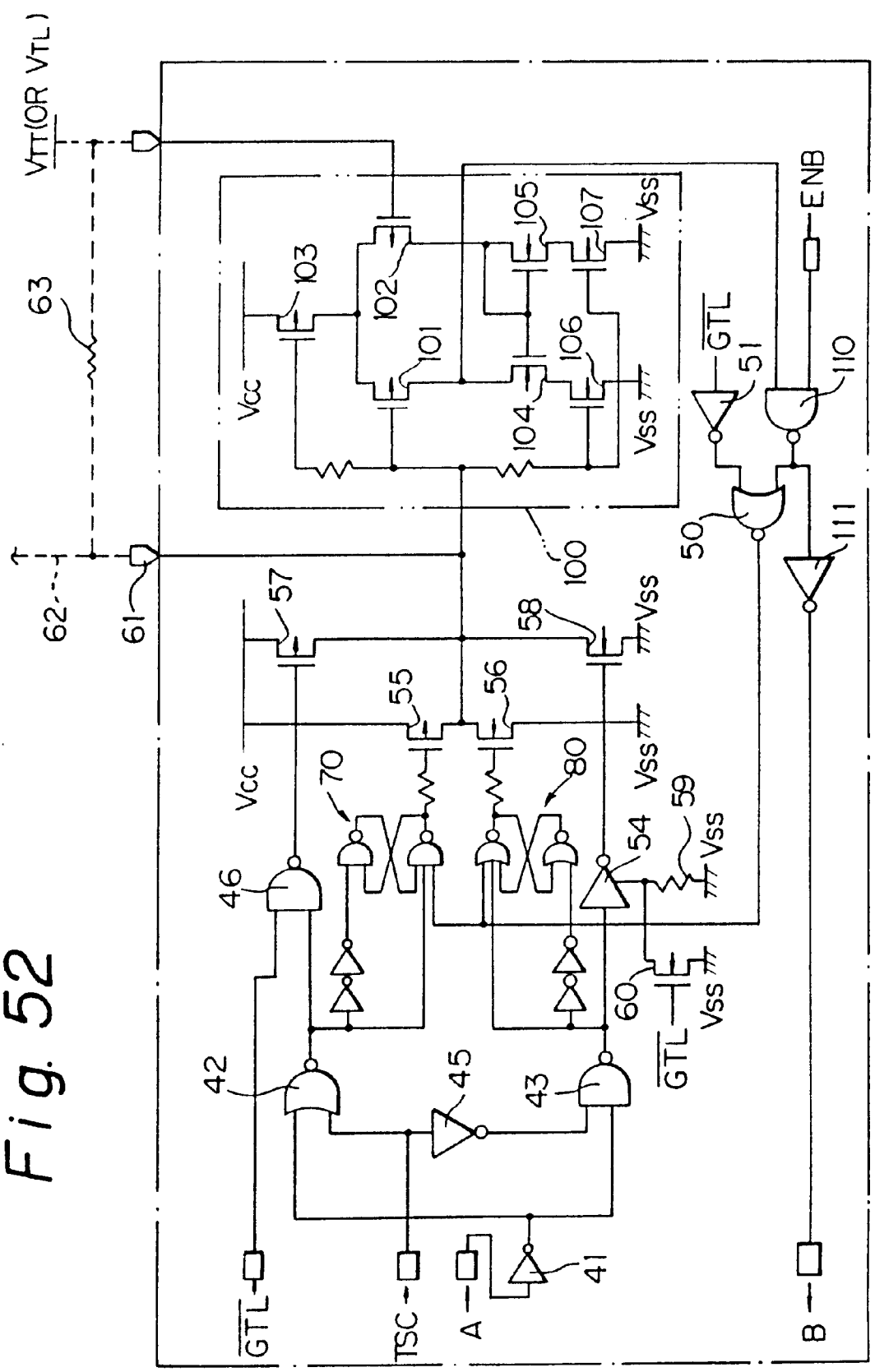
FIG. 52 is a diagram showing another concrete constitution of the embodiment.
Figure 53:
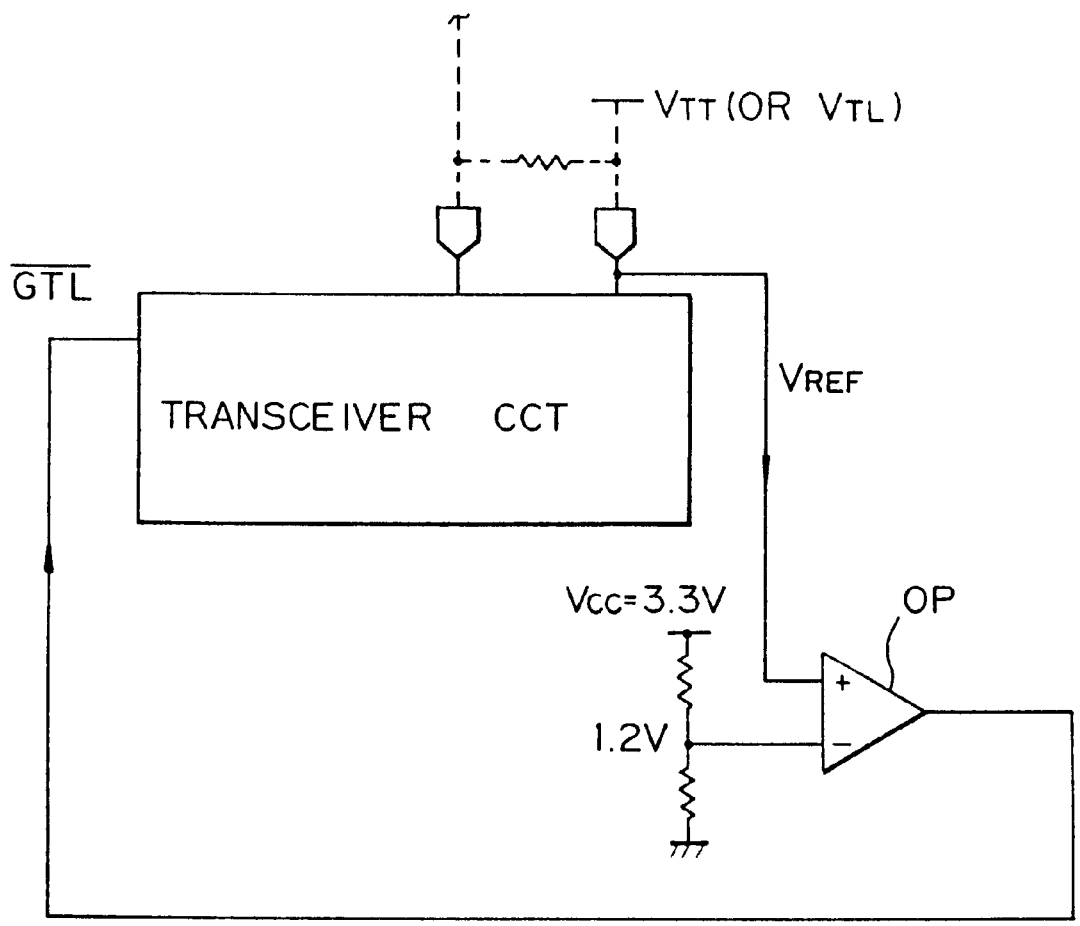
FIG. 53 is a diagram illustrating the constitution including a circuit for automatically forming a signal GTL of the embodiment.

FIG. 51 shows a preferred definite example of FIG. 48, and represents an example in which the NAND gate 47 and the NOR gate 53 shown in FIG. 48 comprises deglitcher circuits. Each of the deglitcher circuits 70, 80 includes a delay unit 71, 81 for determining an input allowance time for the PMOS transistor 55 and the NMOS transistor 56 and a flip-flop 72, 82. When the input to the PMOS transistor 55 and the NMOS transistor 56 is allowed, next input is not accepted until the time set by the delay unit 71, 81 lapses. In this way, the undesirable inversion of the PMOS transistor 55 and the NMOS transistor 56 due to the noise, etc, can be reliably prevented, and the circuit operation can be stabilized. By the way, a differential amplifier 90 in this example comprises a differential pair consisting of two NMOS transistors 91, 92, a constant current transistor consisting of an NMOS transistor 93 and load transistors consisting of four PMOS transistors 94 to 97, and two of the load transistors have a current mirror structure. However, a differential amplifier 100 may comprise a differential pair consisting of two PMOS transistors 101, 102, a constant current transistor consisting of a PMOS transistor 103 and load transistors consisting of four NMOS transistors 104 to 107, whereby two of the load transistors have a current mirror structure, as shown in FIG. 52. When the structure shown in FIG. 52 is used, a sufficient voltage is applied between the gate and source of the differential pair even when the level of the reference voltage $V_{REF}$ is low, and a large gain can be obtained. Therefore, this structure is particularly advantageous for the GTL system.

By the way, the NAND gate 110 and the signal ENB in FIGS. 51 and 52 are used in order to cut off the signal B in the stand-by state or the sleep state and to prevent unnecessary power consumption inside the chip. In other words, the signal ENB is ordinary the high level but when this signal is lowered to the low level, the output of the NAND gate 110 becomes the high level and the output of the inverter gate 111 (which becomes the signal B into the chip) can be fixed at the low level.

Further, the signal GTL can be automatically generated by comparing the reference potential $V_{REF}$ with a potential corresponding to $V_{TL}$ (+1.2V) by an operational amplifier OP. In other words, the reference potential $V_{REF}$ is applied to the non-inversion input (+) of the operational amplifier OP while +1.2V is applied to the inversion input (−). Then, the operational amplifier OP outputs the high level when $V_{REF}>+1.2V$ or in other words, when $V_{REF}$ is +1.65V (in the CTT system), and outputs the low level when $V_{REF}\leq+1.2V$ (in the GTL system). Therefore, this output may as such be used as the signal GTL. The circuit operation can be automatically changed over in accordance with the interface system and ease of using the circuit can be improved. Though the operational amplifier OP and its accessorial circuits are shown disposed outside the transceiver circuit in the drawing, they may of course be included in the transceiver circuit.

Besides the logic control of the signal GTL other than the automatic generation system described above, it is also possible to employ a system which takes out the control terminal 48 outside the chip and applies either the high level or the low level to the extended terminal, or to employ a bonding option system. Further, programming may be made appropriately by disposing a fuse and a PROM (Programmable ROM device) inside the chip, or a system which determines the sequence of making of the power sources inclusive of the reference potential in accordance with the interface system and detects the practical sequence of making inside the chip and stores it in a register, etc, may also be employed.

Sixth Aspect of the Invention

For a better understanding of the preferred embodiments, the related prior art will be explained with reference to FIGS. 54 and 55.

Figure 54:
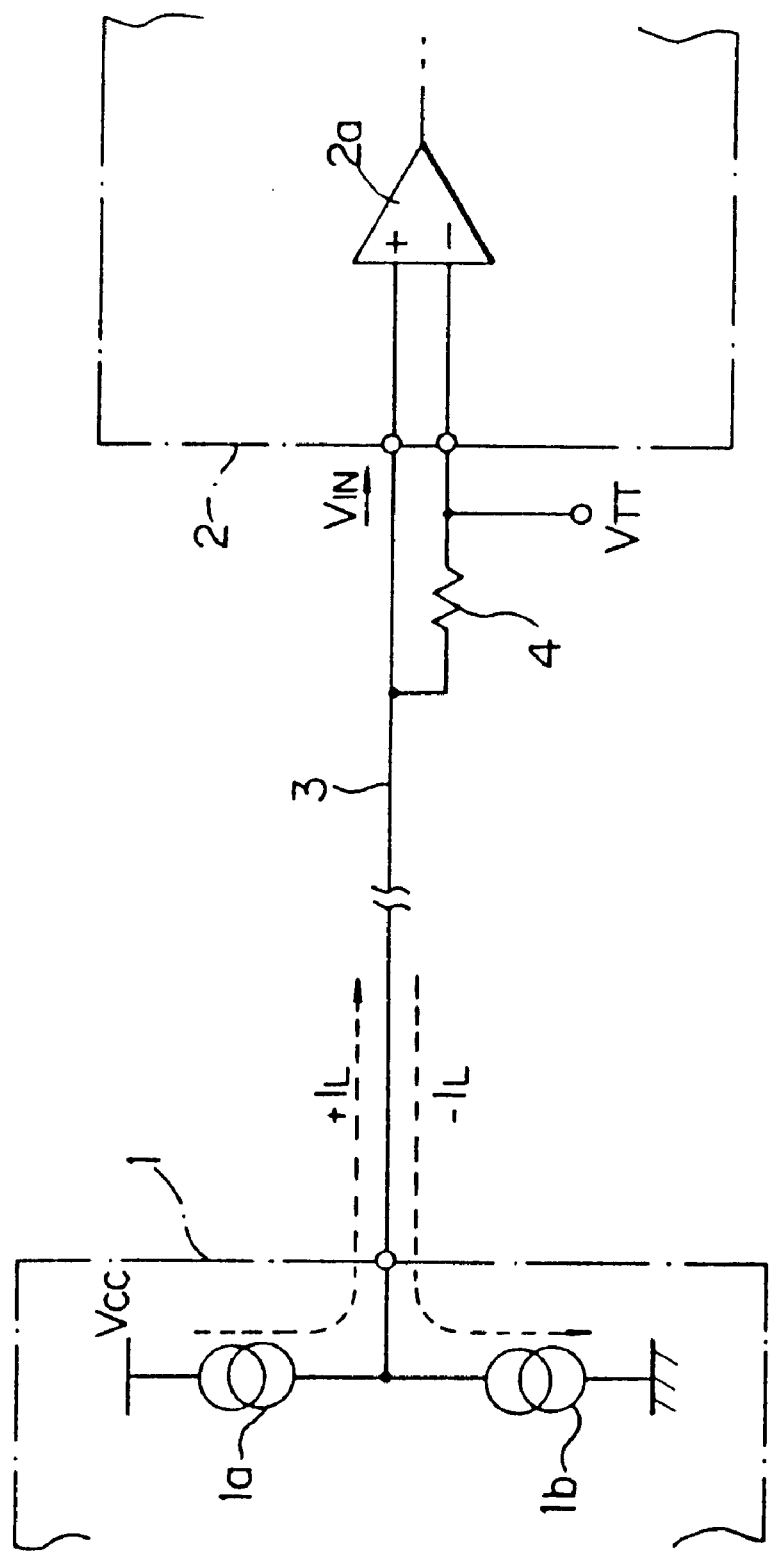
FIG. 54 is a diagram of a conventional constitution of a CTT interface.

FIG. 54 is a conceptual view of the CTT. In the CTT, a signal line 3 which is extended between a signal output unit 1 and a signal input unit 2 is connected to an intermediate power source $V_{TT}$ ($V_{TT}=V_{cc}/2$; $V_{TT}=+1.65V$ when $V_{cc}=+3.3V$) through a resistor 4. The output unit 1 generally comprises a constant current element 1a on the H level side which connects the signal line 3 to the power source $V_{cc}$ when the logic of the signal to be outputted is the H level and a constant current element 1b on the L level side which connects the signal line 3 to the ground when the logic of the signal to be outputted is the L level. When the logic of the signal to be outputted is the H level, a current $+I_L$ flows from $V_{cc}$ to $V_{TT}$, and a potential $+I_L \times R_L$ (where $R_L$ is the value of a resistor 4) appears across both ends of the resistor 4. When the logic of the signal to be outputted is the L level, a current $-I_L$ flows from $V_{TT}$ to the ground in the opposite direction to the above, and a potential $-I_L \times R_L$ develops across both ends of the resistor 4. These potentials are applied to two inputs of a differential gate 2a of the input unit 2, and the potential relationship of the signal line 3 is judged with $V_{TT}$ as the reference potential. In other words, when $\pm I_L \times R_L > V_{TT}$, the H level of the input signal $V_{IN}$ applied through the signal line 3 is judged, and when $\pm I_L \times R_L < V_{TT}$, the L level of the input signal $V_{IN}$ is judged.

Figure 55:
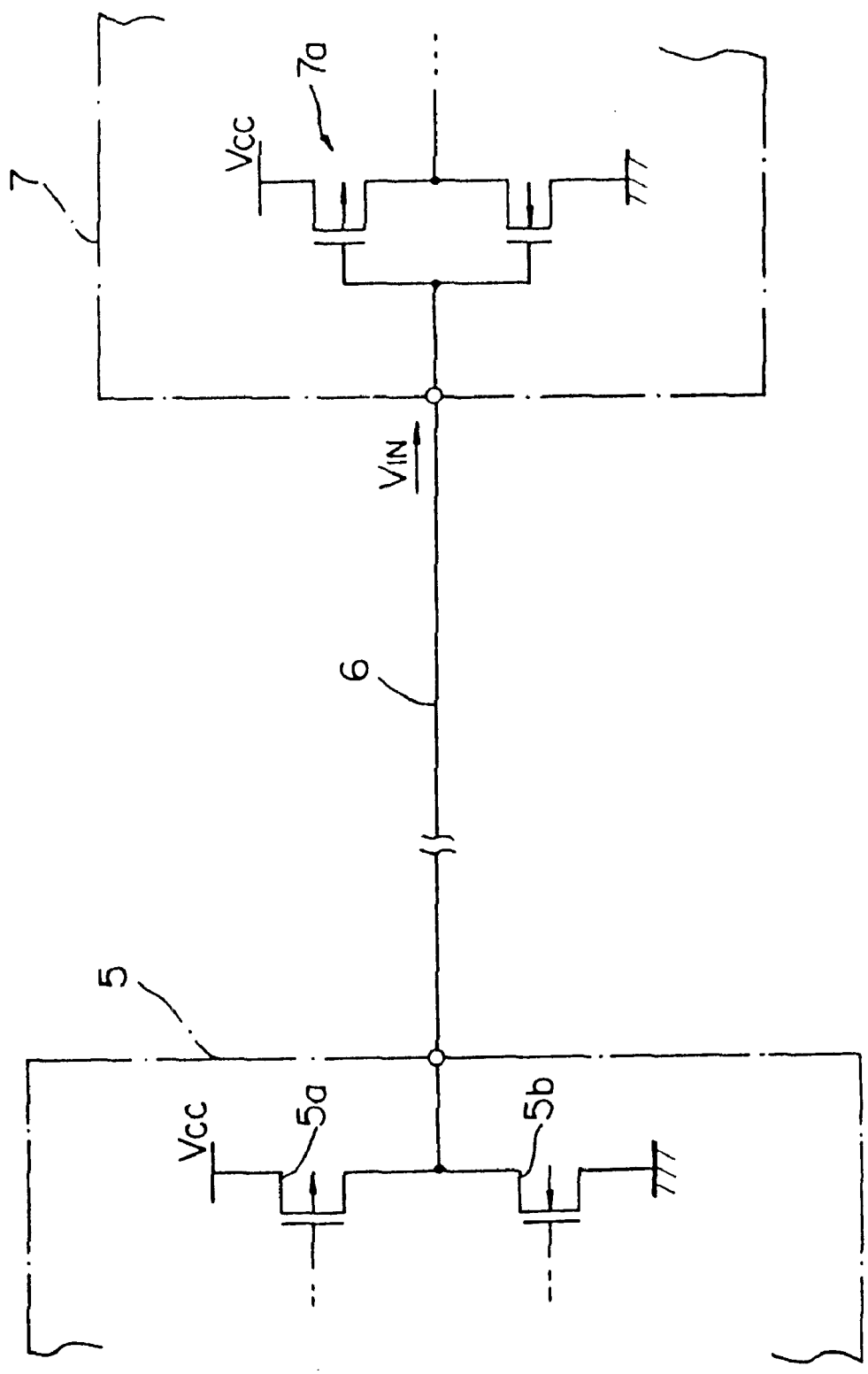
FIG. 55 is a diagram of a conventional constitution of a CMOS interface.

FIG. 55 is a conceptual view of the CMOS interface which is shown for comparison. One of the two transistors 5a, 5b of the output unit 5 is turned ON in accordance with the logic of the signal to be outputted. Assuming that the logic of the signal to be outputted is the H level, the P channel MOS transistor 5a is turned ON and the signal line 6 is driven by the power source $V_{cc}$, and when the logic of the signal to be outputted is the L level, on the other hand, the N channel MOS transistor 5b is turned ON and the signal line 6 is driven by the ground potential. A CMOS inverter gate 7a of the input unit 7 has a predetermined input threshold value $V_{INV}$, judges the H level when the potential of the input signal $V_{IN}$ given through the signal line 6 is higher than the input threshold value $V_{INV}$, and judges the L level when it is lower than $V_{INV}$.

Let's compare both interfaces of CMOS and CTT. Whereas the logical amplitude of CMOS is substantially a full current width (for example, 3.3V), the amplitude of CTT has a value (for example, 400 mV) which is by far smaller and is determined by the driving current $\pm I_L$ and the $R_L$ value.

In the semiconductor integrated circuit according to the prior art described above, however, the semiconductor integrated circuit must be fabricated for each interface because it can use only the signal interface having a large amplitude or the signal interface having a small amplitude. Accordingly, the price of the semiconductor chip becomes higher and the management cost increases, too, due to the increase of the number of the total stock. From the aspect of users, the users must use those chips which are different with the standards of the interfaces, so that the system design becomes more troublesome.

Figure 56:
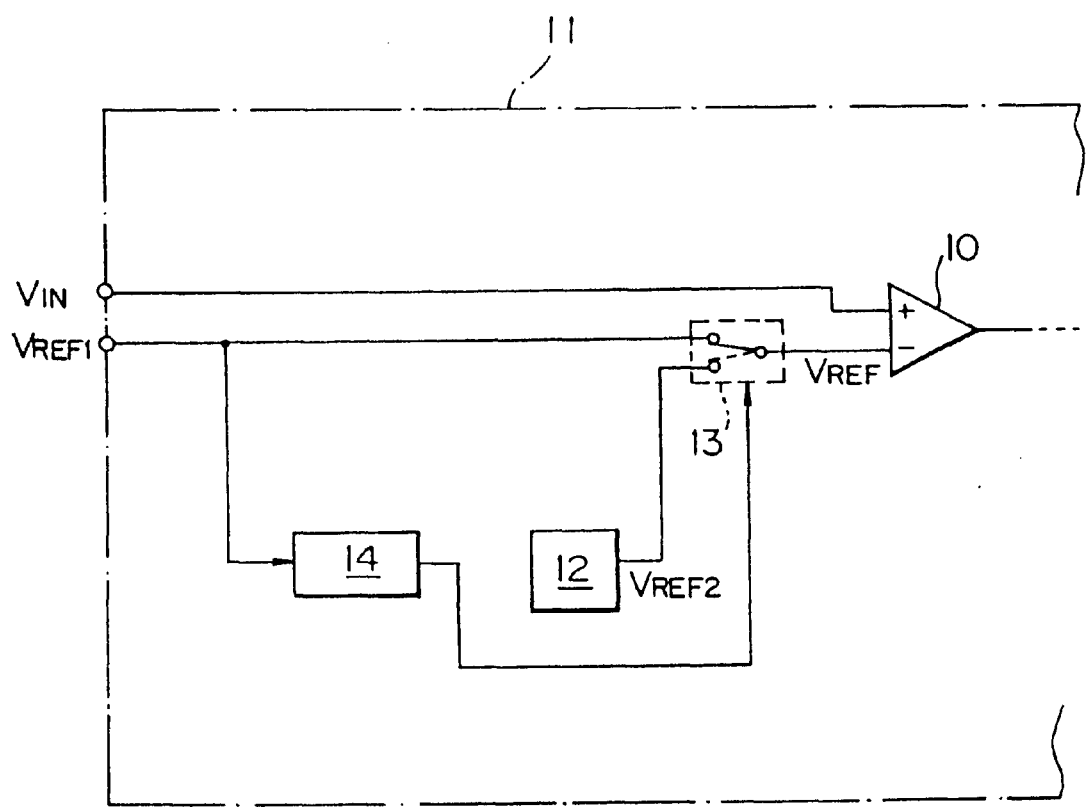
FIG. 56 is a diagram illustrating the principle and constitution of a sixth aspect of the present invention.

To solve the problems with the prior art described above, in a semiconductor integrated circuit including a differential gate 10 for comparing the potential of the input signal $V_{IN}$ with the predetermined reference potential $V_{REF}$ and judging the logic of this input signal $V_{IN}$ as shown in FIG. 56, the semiconductor integrated circuit according to the present invention comprises selection means 13 for selecting either one of the first reference potential $V_{REF1}$ given from outside a chip 11 and the second reference potential $V_{REF2}$ generated by reference potential generation means 12 inside the chip, and instruction means 14 for instructing the selection means 13 to select the first reference potential $V_{REF1}$ when the first reference potential $V_{REF1}$ is given and instructing the selection means 13 to select the second reference potential $V_{REF2}$ when the first reference potential $V_{REF1}$ is not given.

If the first reference potential $V_{REF1}$ corresponds to a terminal potential $V_{TT}$ of the CTT interface and the second reference potential $V_{REF2}$ corresponds to a threshold value $V_{INV}$ of a CMOS inverter gate, for example, the comparison operation between $V_{REF1}$ and $V_{IN}$ and the comparison operation between $V_{REF2}$ and $V_{IN}$ are alternatively changed over in accordance with the existence or absence of the first reference potential $V_{REF1}$ from outside the chip. Therefore, the CTT interface can be accomplished by the former comparison operation and the CMOS interface, by the latter comparison operation. In other words, the present invention can provide a semiconductor integrated circuit having excellent compatibility which can be used in common for both of the signal interface having a large logical amplitude (CMOS, in this case) and the signal interface having a small logical amplitude (CTT, in this case).

Hereinafter, an embodiment of the present invention will be explained with reference to the drawings.

FIGS. 57 to 60 show the semiconductor integrated circuit according to an embodiment of the present invention, and represent the example which can be applied to both of the CMOS interface and the CTT interface.

Figure 57:
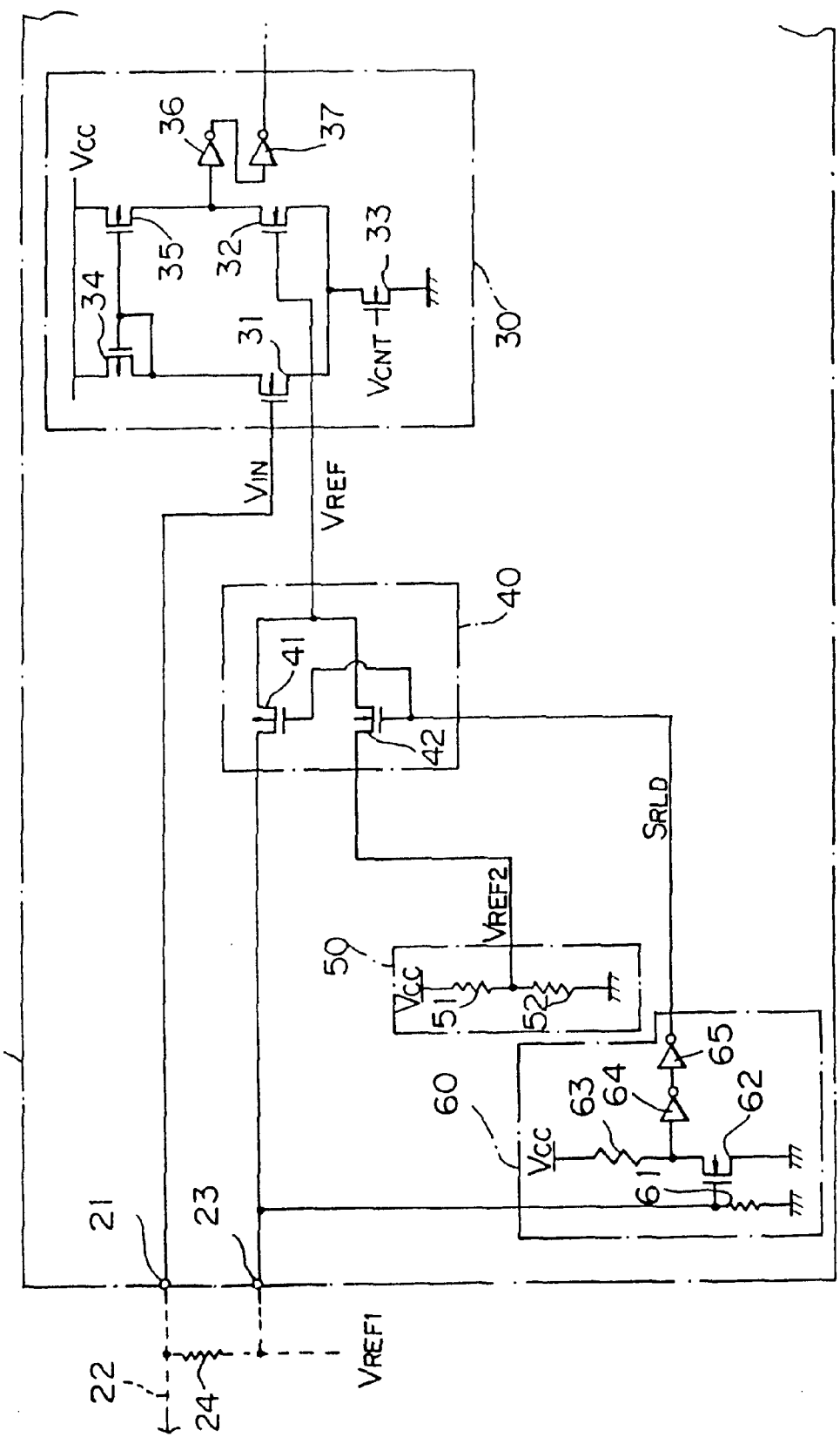
FIG. 57 is a diagram illustrating the constitution of the embodiment.

First of all, the structure will be explained. In FIG. 57, reference numeral 20 denotes a chip on the input side; 21 is an input terminal connected to a chip on the output side, shown outside, through a signal line 22; and 23 is a reference terminal connected to the signal line 22 through a resistor 24 and to a first reference potential $V_{REF1}$ having a potential corresponding to $V_{cc}/2$ (for example, +1.65V).

A differential gate 30, selection means 40, reference potential generation means 50 and instruction means 60 are disposed inside the chip 20, and they have the following structures.

In the differential gate 30, the sources of a pair of N channel MOS transistors 31, 32 are connected in common to the ground through a constant current transistor 33, and the drains of these N channel MOS transistors 31, 32 are connected to the power source $V_{cc}$ through P channel MOS transistors 34, 35 hating a current mirror structure, respectively. The output signal appearing at the drain of one of the N channel MOS transistors 32 is taken out in the same phase through inverter gates 36, 37 of two stages, and is applied into an internal circuit of the chip 20. Here, symbol $V_{IN}$ represents the input signal applied to the gate of the N channel MOS transistor 31, $V_{REF}$ is the reference potential applied to the gate of the N channel MOS transistor 32, and $V_{CNT}$ is a constant voltage.

The selection means 40 includes a P channel MOS transistor 41 and an N channel MOS transistor 42, outputs $V_{REF1}$ as $V_{REF}$ when a predetermined instruction signal $S_{RLD}$ has the L level and outputs the second reference potential $V_{REF2}$ as $V_{REF}$ generated by the reference potential generation means 50 when the instruction signal $S_{RLD}$ is at the high level. By the way, the reference potential generation means 50 consists of a resistance type potential division circuit formed by connecting in series at least two resistors 51, 52 between the power source $V_{cc}$ and the ground, and generates the second reference potential $V_{REF2}$ having a potential ($\approx$2.5V) corresponding to the threshold value $V_{INV}$ of the CMOS level.

The instruction means 60 has the structure wherein a resistor 61 is interposed between a reference terminal 23 and the ground, the drain of an N channel MOS transistor 62, which uses the potential across both ends of this resistor 61 as the gate-source potential thereof, is connected to the power source $V_{cc}$ through a resistor 63, and the source of this transistor 62 is connected to the ground. When the potential across both ends of the resistor 62 (which potential is also the potential at the reference terminal 23) is higher than the threshold voltage $V_{th}$ of the transistor 62, the transistor 62 is turned ON, and an L level instruction signal $S_{RLD}$ is outputted through two-stage inverter gates 64, 65. When the potential across both ends of the resistor 61 is not higher than the threshold voltage $V_{th}$ of the transistor 62, on the other hand, the transistor 62 is turned OFF, and an H level instruction signal $S_{RLD}$ is outputted through the two stage inverter gates 64, 65. In other words, the instruction signal $S_{RLD}$ is a signal which has the L logic level when $V_{REF1}$ is applied to the input terminal 23, and the H logic level when $V_{REF1}$ is not applied.

Next, the operation will be explained.

When the chip 20 is used with the CTT interface standard, $V_{REF1}$ is applied to the reference terminal 23. Then, the potential across both ends of the resistor 61 of the instruction means 60 becomes $V_{REF1}$, the transistor 62 is turned ON and the instruction signal $S_{RLD}$ is outputted at the L level.

In this case, therefore, the P channel MOS transistor 41 of the selection means 40 is turned ON and $V_{REF1}$ becomes equal to $V_{REF}$, so that the differential gate 30 judges the binary level of the input signal $V_{IN}$ with this $V_{REF1}$ (=+1.65V) being the reference. (This is the judgement operation of the CTT interface.) When $V_{IN} > V_{REF1}$, for example, the drain current of the N channel MOS transistors 31 becomes greater by the difference between $V_{IN}$ and $V_{REF1}$ and flows, and the drain current of the other N channel MOS transistor 32 attempts to increase by the mirror ratio of the load transistors 34, 35. However, since the sum of both drain currents is made constant by the constant current transistor 33, the drain voltage of the other N channel MOS transistor 32 is pulled up in the $V_{cc}$ direction in such a manner as to supplement this insufficiency. After all, the differential gate 30 outputs the H level signal as the judgement result of $V_{IN} > V_{REF1}$.

When the chip 20 is used with the CMOS interface standard, on the other hand, no voltage is applied to the reference terminal 23. Then, the potential across both ends of the resistor 61 of the instruction means 60 becomes zero, so that the transistor 62 is turned OFF and the instruction signal $S_{RLD}$ is outputted at the H logic level.

In this case, since the N channel MOS transistor 42 of the selection means 40 is turned ON, $V_{REF2} = V_{REF}$ and the differential gate 30 judges the level of the input signal $V_{IN}$ using this $V_{REF2}$ ($\approx$+2.5V) as the reference. (This is the judgement operation of the CMOS interface standard.)

According to the embodiment described above, the chip can be switched and used for the CTT interface and the CMOS interface depending on the existence of the voltage applied to the reference terminal 23. Therefore, one chip can be used for two interfaces and the semiconductor integrated circuit need not be fabricated for each interface. In other words, the cost of the semiconductor chip can be restricted and the management cost can be reduced due to the decrease of the number of the total stock. Further, from the aspect of the users, the system design becomes easier because the same chip can be used for different interfaces.

Figure 58:
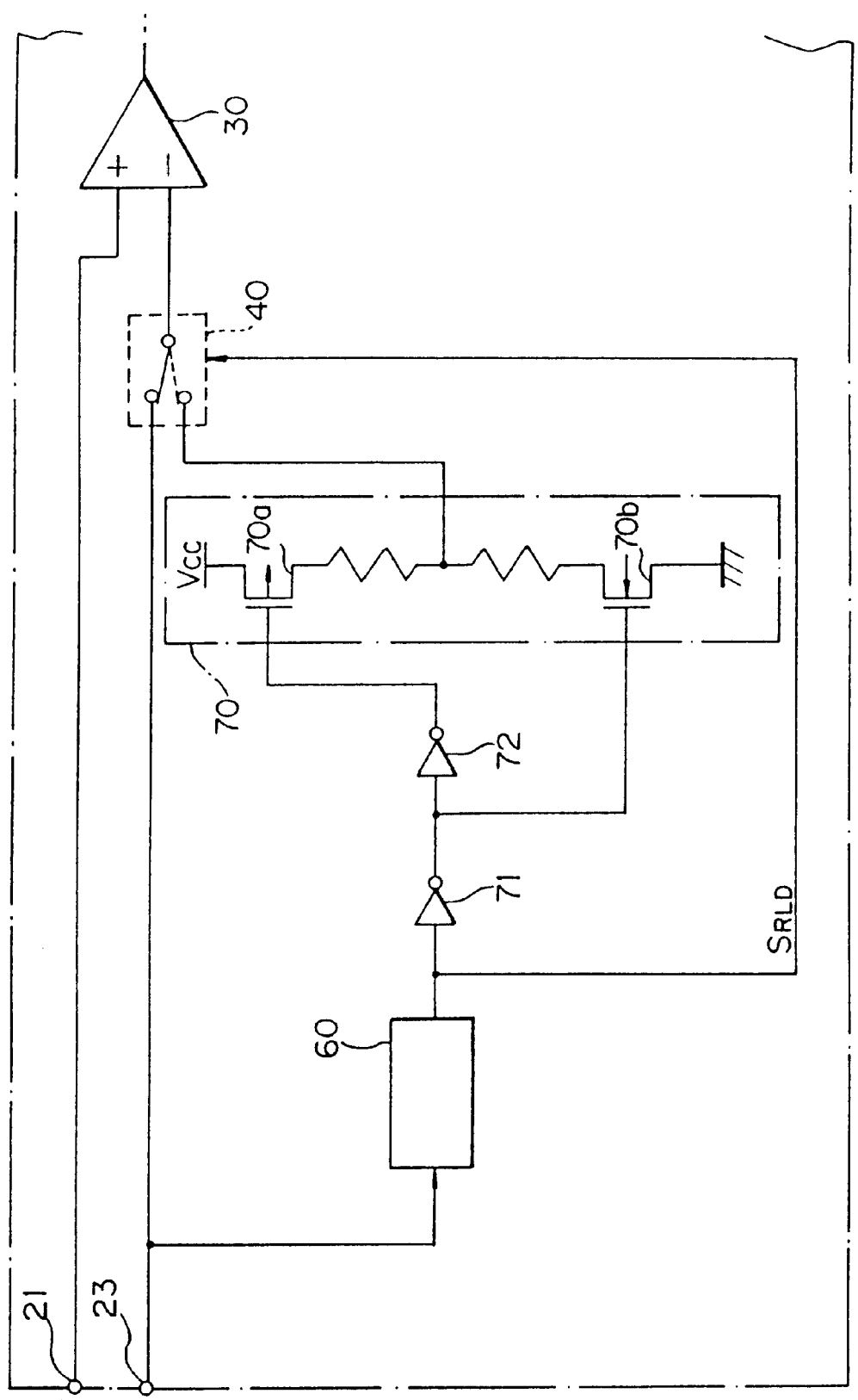
FIG. 58 is a diagram illustrating another constitution of the embodiment.

FIG. 58 shows a preferred modified example of the embodiment described above. In this example, when the chip is operated with the CTT interface standard, a switch element (a P channel MOS transistor 70b and an N channel MOS transistor 70c in the drawing) across both ends of a resistance circuit 70c of the reference potential generation means 70 is turned OFF, and unnecessary power consumption is restricted by stopping in this manner the operation of the reference potential generation means 70. By the way, an opposite phase instruction signal $\overline{S_{RLD}}$ subjected to logic inversion by the inverter gate 71 and the same phase instruction signal $S_{RLD}$ subjected to further logic inversion by the inverter gate 72 are applied to the switch element. Further, the switch element may comprise only either of the P channel MOS transistor 70b and the N channel MOS transistor 70c.

Figure 59:
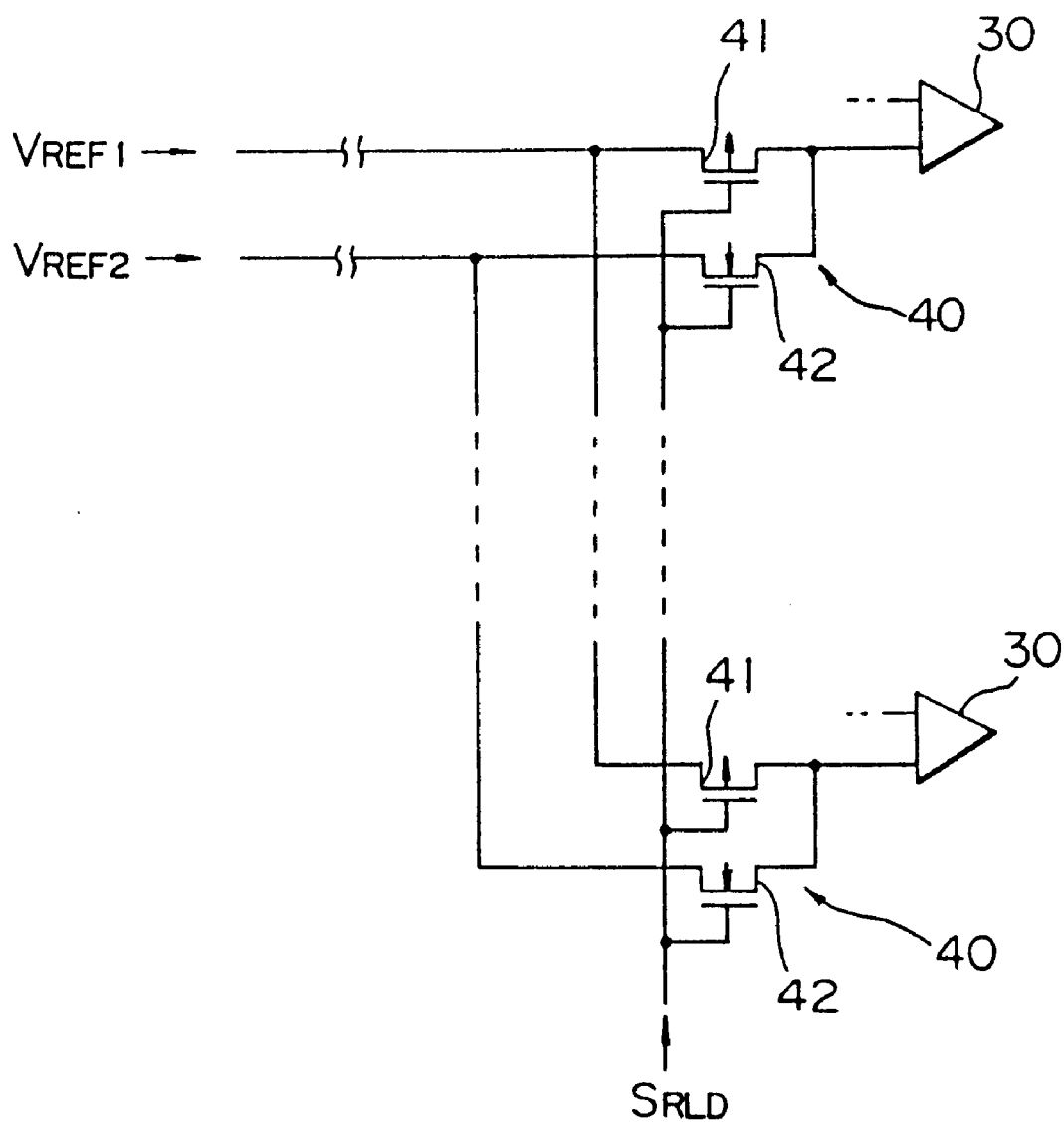
FIG. 59 is a diagram of preferred arrangement of a selection means of the embodiment.
Figure 60:
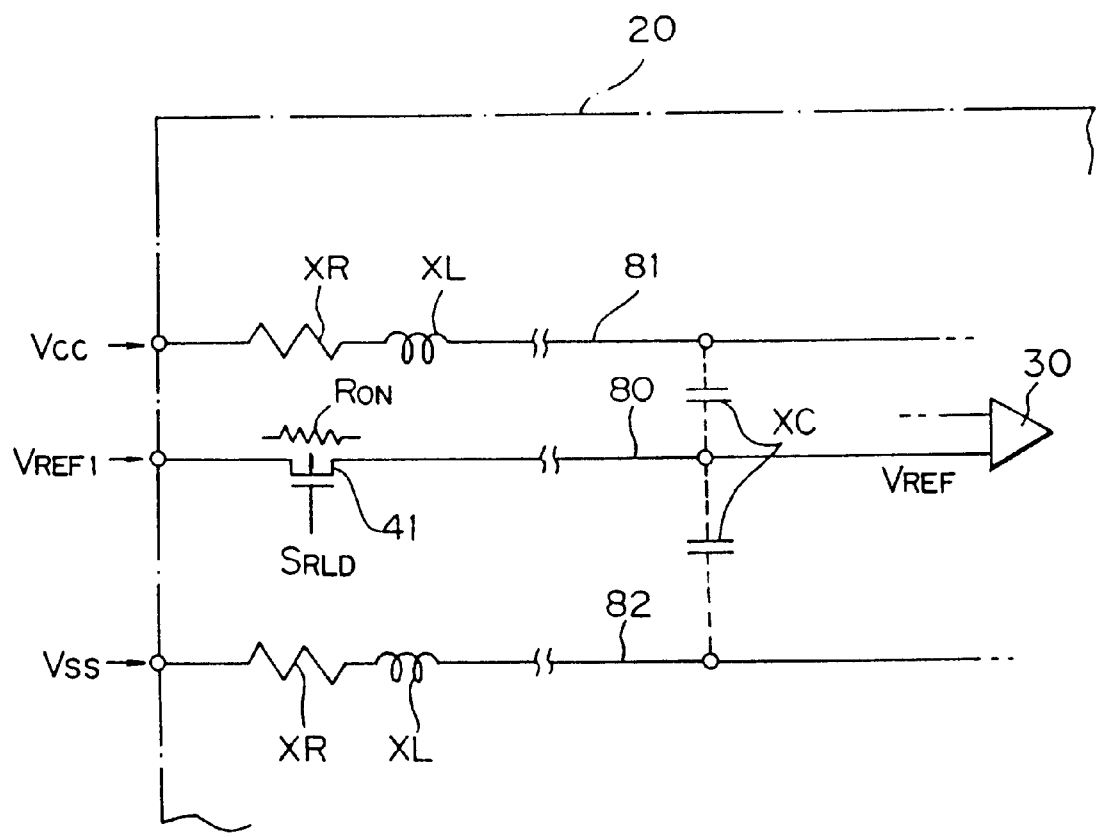
FIG. 60 is a diagram which schematically illustrates the effect of a change in the power-source.

The selection means 40 is preferably disposed most closely to the differential gate 30 as shown in FIG. 59. If the selection means 40 and the differential gate 30 are spaced apart from each other, the reference potential of the differential gate 30 is likely to change with the fluctuation of the power source voltage. FIG. 60 is a structural view of principal portions including the P channel MOS transistor 41 of the selection means, the reference potential wiring 80 connecting this MOS transistor 41 to the differential gate 30, the $V_{cc}$ power source wiring 81 and the $V_{ss}$ (ground) power source wiring 82. Symbol XR represents the resistance of the power source wirings; XL is the inductance of the power source wirings; XC is the capacitance between the. wirings; and $R_{ON}$ is the ON resistance of the MOS transistor 41.

In this circuit diagram, the current flowing through the power source wirings 81, 82 changes with the operation of the internal circuit of the chip 20, and a large current change occurs particularly when a large number of internal circuits are simultaneously switched. Therefore, the power source voltages instantaneously fluctuate due to XR and XL of the power source wirings and this voltage fluctuation is transmitted to the reference potential wiring 80 through XC. Consequently, the reference potential $V_{REF}$, which must be constant, changes in such a manner as to follow up the fluctuation of the power source voltages. To cope with this problem, it is effective to reduce XC, and this can be accomplished effectively by reducing the distance between the selection means 40 and the differential gate 30. Furthermore, it is preferred to reduce the impedance of $V_{REF1}$ viewed from the side of the differential gate 30 by reducing $R_{ON}$ as much as possible.

Although the embodiment described above represents the example where the chip is applied to the CMOS interface and the CTT interface, the present invention is not limited thereto, in particular. In short, the present invention can be applied to two kinds of interfaces having mutually different logical amplitudes, and can be applied, for example, to the TTL interface in place of the CMOS interface. In this case, $V_{REF2}$ is approximately +1.4V. The present invention may also be applied to the GTL interface in place of the CTT interface. In this case, $V_{REF1}$ is approximately +1.2V.

Figure 61:
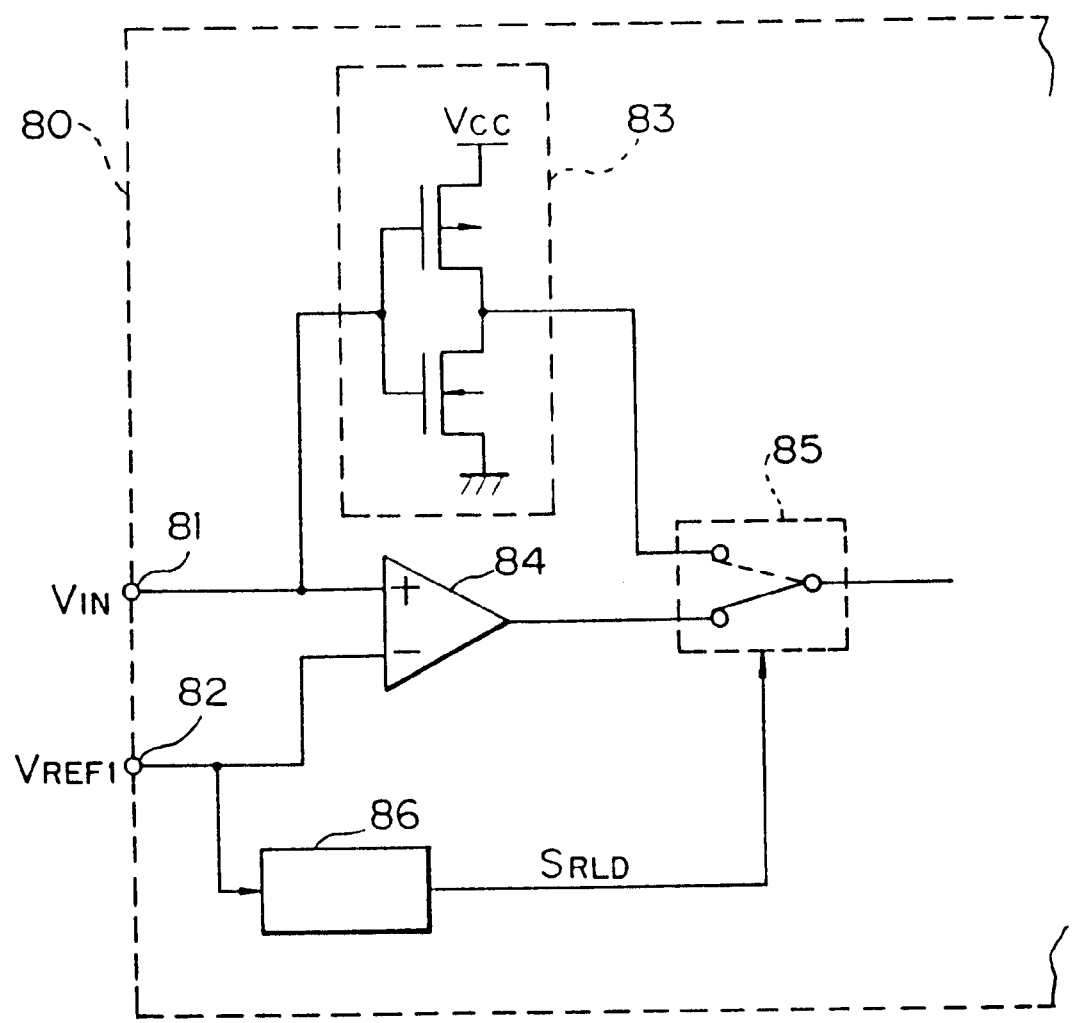
FIG. 61 is a diagram illustrating the constitution of major portions of another embodiment.

FIG. 61 shows the semiconductor integrated circuit according to another embodiment of the present invention.

In this circuit diagram, reference numeral 80 denotes an input terminal for receiving the input signal $V_{IN}$ outside the chip; 82 is a reference terminal for receiving the reference potential $V_{REF1}$ (e.g. +1.6V) from outside the chip; 83 is a CMOS inverter gate as a logic gate for discriminating the logic of the input signal $V_{IN}$ by comparing it with a predetermined input threshold value $V_{INV}$ (e.g. +2.5V); 84 is a differential gate (for the detailed structure, refer to the differential gate 30 shown in FIG. 57) as a logic gate for discriminating the logic of the input signal $V_{IN}$ by comparing it with a predetermined input threshold value $V_{INV}$ (e.g. +2.5V); 85 is a selection means (for the detailed structure, refer to the selection means 40 shown in FIG. 57); and 80 is instruction means for providing an instruction so as to select the output of the differential gate 84 when the reference potential $V_{REF1}$ is given, and to select the output of the CMOS inverter gate 83 when the reference potential $V_{REF1}$ is not given (for the detailed structure, refer to the instruction means 60 shown in FIG. 57).

In the circuit construction described above, when the reference potential $V_{REF1}$ is given from outside the chip, the selection means 85 selects the output of the differential gate 84 and when the reference potential $V_{REF1}$ is not given, the output of the CMOS inverter gate 83 is selected. Accordingly, this embodiment, too, can commonly use two interfaces by one chip in the same way as the foregoing embodiment.

Seventh Aspect of the Invention

For a better understanding of the preferred embodiments, the related prior art will be explained with reference to FIG. 62.

Figure 62:
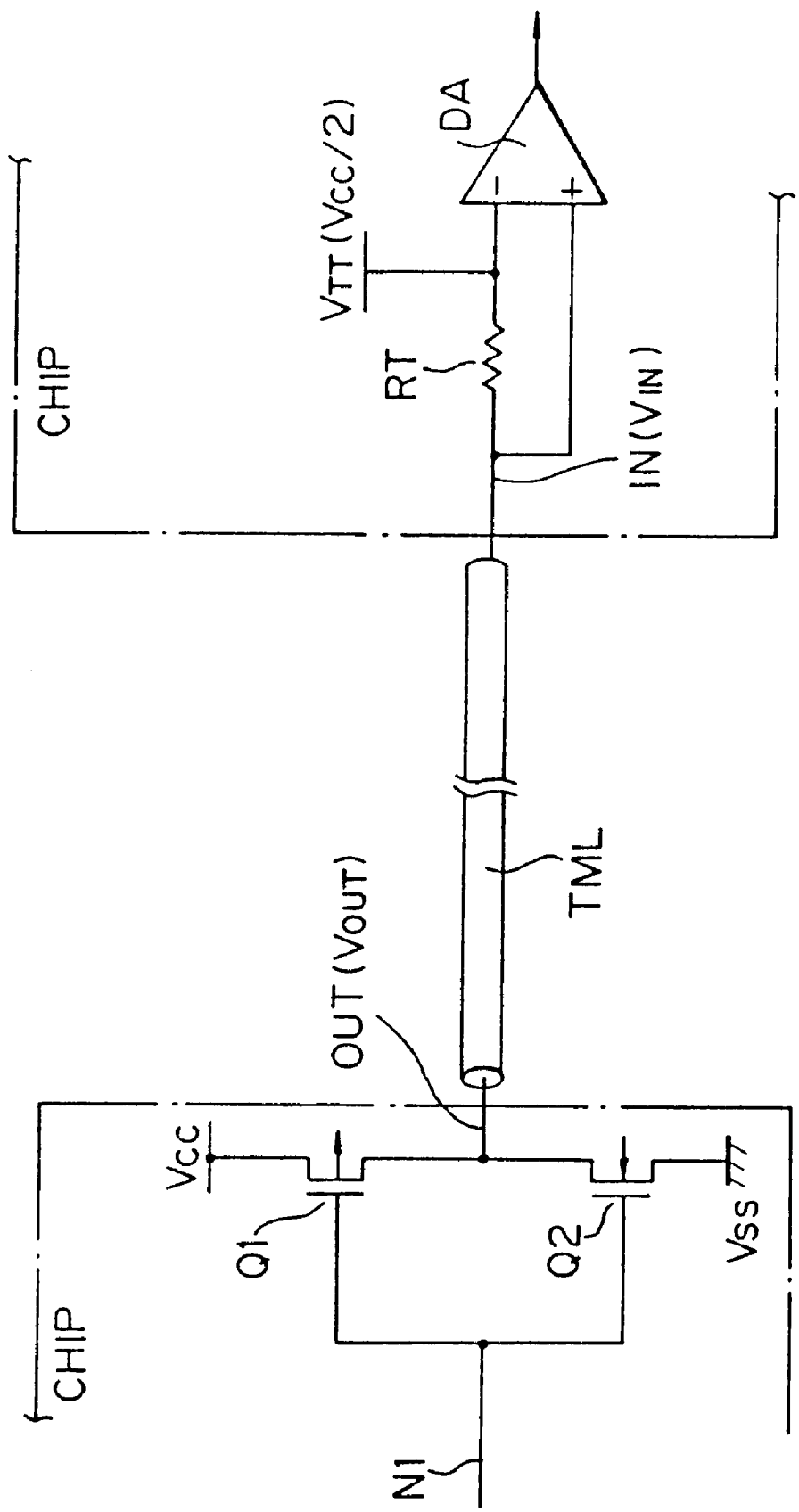
FIG. 62 is a diagram illustrating an example to which a conventional output circuit is adapted.

FIG. 62 shows an application example of the output circuit according to the prior art.

The example shown in the drawing represents the structure when the prior art circuit is applied to the input/output interface between LSI chips. The output circuit is disposed on one of the chips, and comprises CMOS transistors (P channel transistor $Q_1$ and N channel transistor $Q_2$) interposed between a high potential power source line $V_{cc}$ (5V) and a low potential power source line $V_{ss}$ (0V). A differential amplifier DA, a terminal resistor, etc, for processing a signal $V_{IN}$ inputted through a transmission line TML connecting the chips to one another (the signal $V_{IN}$ having the same potential as an output signal $V_{OUT}$ of the output circuit under a steady state) are disposed on the other chip. This terminal resistor RT is necessary for allowing the output circuit to operate at a high operational speed and to let it prevent the occurrence of a waveform distortion due to the reflection of the signal. This resistor is set to the same impedance as the intrinsic impedance of the transmission line TML. Whether the input signal $V_{IN}$ is higher or lower than the terminal voltage $V_{TT}$ (=$V_{cc}/2$) is detected by the differential amplifier DA on the reception side.

In the circuit construction described above, when the signal (the signal at a node N1) inputted to the output circuit ($Q_1$, $Q_2$) has the L level, the P channel transistor $Q_1$ is turned ON, and a current flows through the route of $V_{cc} \to RT \to V_{TT}$. The level of the input signal $V_{IN}$ in this case is higher than the terminal voltage $V_{TT}$. When the input signal of the output circuit has the H level, on the other hand, the N channel transistor $Q_2$ is turned ON and the current flows through the route of $V_{TT} \to RT \to Q_2 \to V_{ss}$, on the contrary, and the level of the input signal $V_{IN}$ becomes lower than the terminal voltage $V_{TT}$.

To effect the high speed operation in the circuit construction of the prior art described above, the voltages of the input and output signals $V_{IN}$, $V_{OUT}$ (the same potential under the steady state) must be limited to approximately $V_{TT} \pm 400$ mV. Here, the terminal resistor RT is determined by the impedance of the transmission line TML (generally 50Ω). Accordingly, the ON resistance of each transistor $Q_1$, $Q_2$ of the output circuit is naturally determined. In other words, since the size of each transistor $Q_1$, $Q_2$ is primarily determined, each transistor has a driving capacity corresponding to its size.

Accordingly, the driving capacity is limited even when a plurality of other chips are desired to be driven by one chip (output circuit), and in consequence, there occurs the problem that it becomes extremely difficult to drive at a high speed all the object chips as the driving object.

As described above, the output circuit according to the prior art is not free from the problem in that when one attempts to accomplish a small amplitude operation to attain a high speed operation, the output transistors cannot be made large as required, and the driving capacity of each transistor drops relatively.

Figure 63:
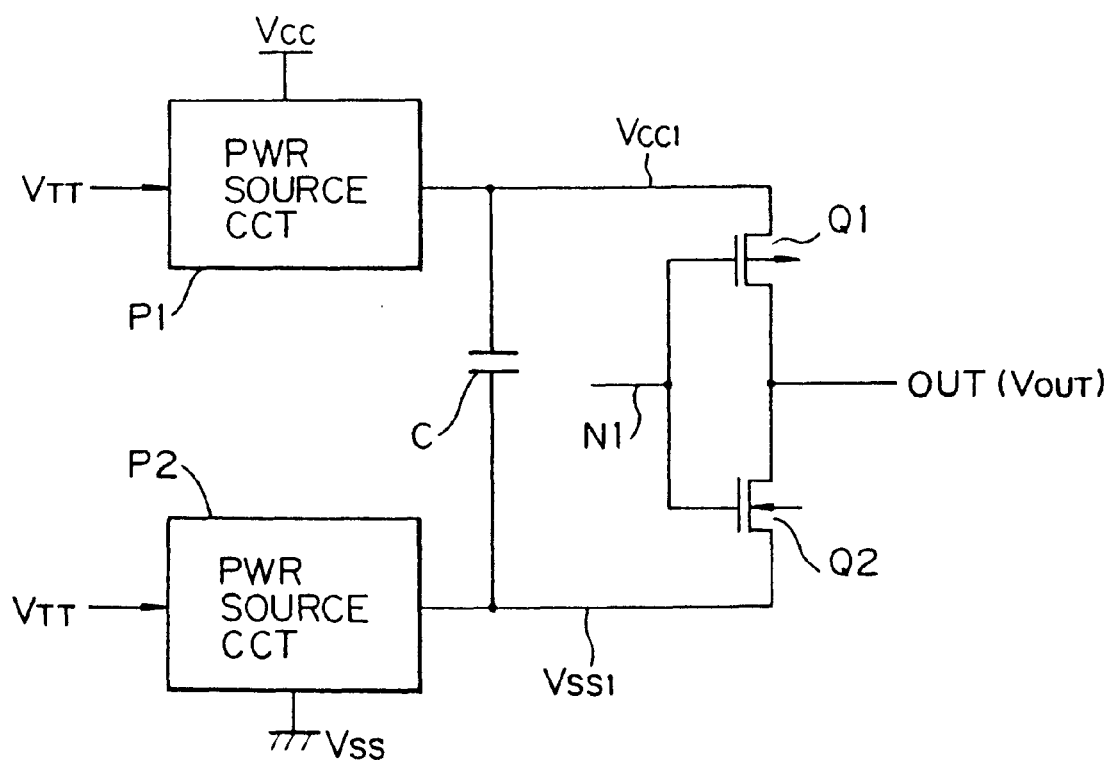
FIG. 63 is a circuit diagram illustrating the constitution of a first embodiment of a seventh aspect of the present invention.

FIG. 63 shows the principal portions of the semiconductor integrated circuit according to the first embodiment of the present invention, that is, the structure of the output circuit.

The circuit shown in the drawing includes a power source circuit P1 for receiving a high potential power source voltage $V_{cc}$ (5V) and a predetermined reference voltage $V_{TT}$ and generating a high potential internal power source voltage $V_{cc1}$ ($<V_{cc}$), a power source circuit P2 for receiving a low potential power source voltage $V_{ss}$ (0V) and the reference voltage $V_{TT}$ and generating a low potential internal power source voltage $V_{ss1}$ ($>V_{ss}$), CMOS transistors (P channel transistor $Q_1$ and N channel transistor $Q_2$) connected between the output lines of the power source circuits P1, P2 (the internal power source voltage $V_{cc1}$, $V_{ss1}$), and a capacitor C connected similarly between the power source lines $V_{cc1}$, $V_{ss1}$ and stabilizing these power source voltages $V_{cc1}$, $V_{ss1}$. The output transistors $Q_1$ and $Q_2$ function as a driving circuit and produce the output voltage $V_{OUT}$. By the way, the reference voltage $V_{TT}$ is generated inside the circuit and is set to $V_{cc}/2$.

When the circuit construction of this embodiment is applied to the structure shown in FIG. 62, the internal power source voltages $V_{cc1}$, $V_{ss1}$ that are to be supplied from the power source circuits P1, P2 are determined by the resistance value of a terminal resistor RT, the voltages of the input/output signals $V_{OUT}$, $V_{IN}$ and the driving capacity (ON resistance) of the output transistors $Q_1$, $Q_2$.

For example, when the internal power source voltage $V_{ss1}$ on the low potential side is set to the condition where the resistance value of the terminal resistor RT is 50Ω, the voltages of the input/output signals $V_{OUT}$, $V_{IN}$ are $V_{TT}$−400 mV and the ON resistance of the output transistors $Q_1$, $Q_2$ are 25Ω, then, $V_{ss1}$ is set to ($V_{TT}$−600 mV).

Figure 64:
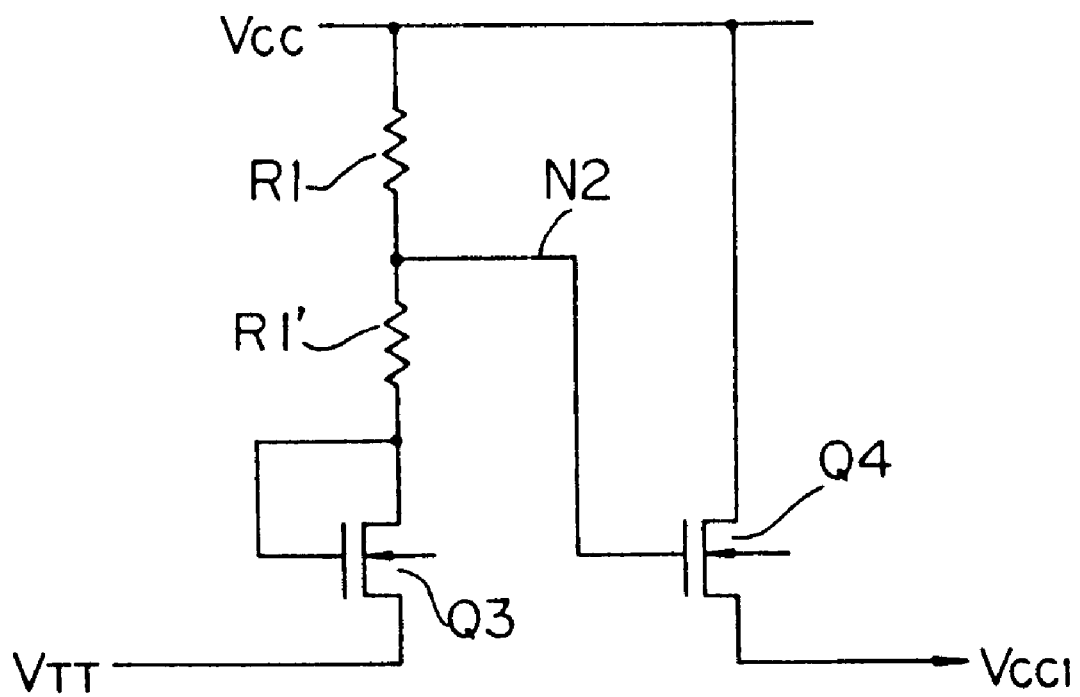
FIG. 64 is a circuit diagram illustrating a constitution of a power source circuit in FIG. 63.

FIG. 64 shows a structural example of the power source circuit.

The power source circuit shown in this circuit diagram includes resistors R1, R1' as well as an N channel transistor $Q_3$ (the gate of which is connected to the drain) that are interposed in series between the power source line $V_{cc}$ and the reference voltage line $V_{TT}$, and an N channel transistor $Q_4$ the gate of which is connected to the junction (node N2) between these resistors R1 and R1' and the drain of which is connected to the power source line $V_{cc}$. The high potential internal voltage $V_{cc1}$ is taken out from the source of this transistor $Q_4$.

Although the example shown in FIG. 64 represents the structure of the power source circuit P1 on the high potential side, it will be obvious to those skilled in the art that the same circuit construction can also be employed for the power source circuit P2 on the low potential side by replacing the power source lines $V_{cc}$, $V_{cc1}$ by the corresponding power source lines $V_{ss}$, $V_{ss1}$, respectively.

Figure 65:
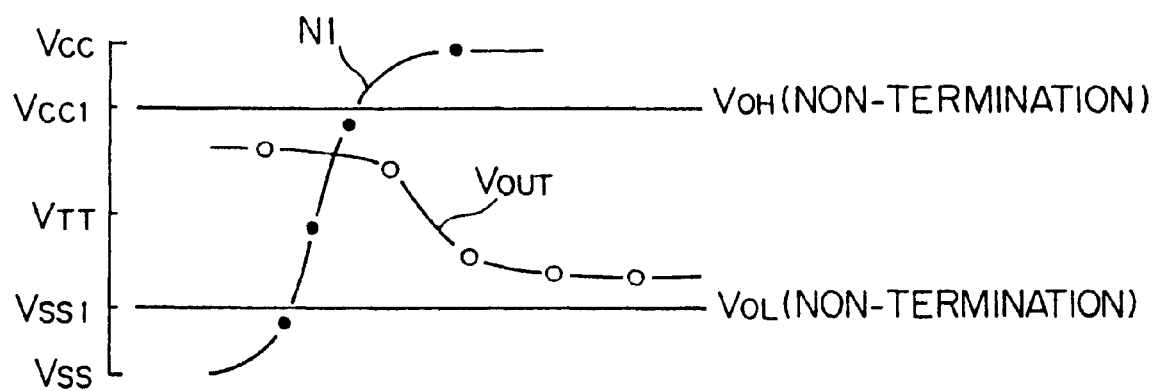
FIG. 65 is a diagram of operation waveforms of the circuit of FIG. 63.

For reference, FIG. 65 shows the operation waveform of the circuit shown in FIG. 63.

According to the circuit construction of the first embodiment (FIG. 63), the control is carried out in such a manner that the H level output voltage $V_{OH}$ becomes the voltage level $V_{cc1}$ lower than the power source voltage $V_{cc}$ and the L level output voltage $V_{O1}$ becomes higher than the power source voltage $V_{ss}$. Accordingly, the ON resistance of each output transistor, that is, the driving capacity of each output transistor, can be freely selected by suitably selecting the source potential of each output transistor $Q_1$, $Q_2$, that is, the internal power source voltage $V_{cc1}$, $V_{ss1}$.

In this way, the driving capacity of the output transistors $Q_1$, $Q_2$ can be improved without deteriorating the low amplitude operation for the high speed operation.

Figure 66:
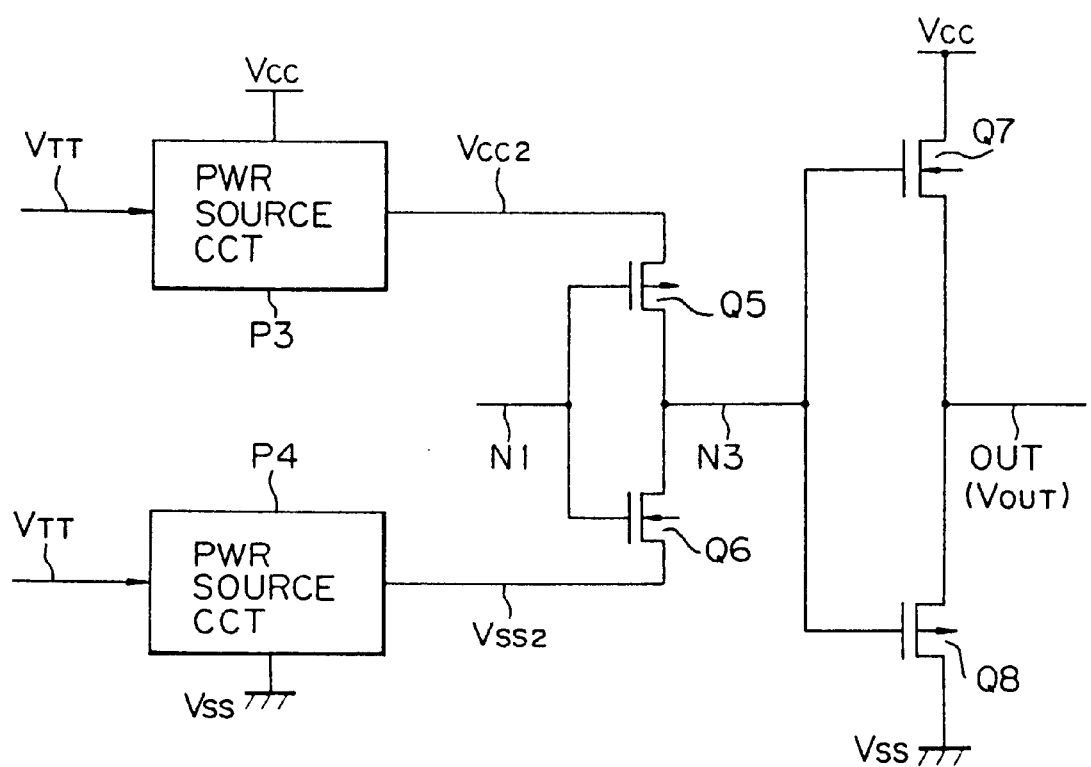
FIG. 66 is a circuit diagram illustrating the constitution of a second embodiment.

FIG. 66 shows the principal portions of the semiconductor integrated circuit according to the second embodiment of the present invention, that is, the structure of the output circuit.

In the first embodiment described above (FIG. 63), a relatively large current flows through the output transistors $Q_1$, $Q_2$ during the operation. To suppress the level fluctuation of the internal power source voltages $V_{cc1}$, $V_{ss1}$, therefore, the capacity of the power source circuits P1, P2 must be made great. This second embodiment provides an improvement for reducing the capacity of the power source circuits used.

In other words, the output circuit according to this embodiment includes, as shown in FIG. 66, a power source circuit P3 for receiving the supply of the power source voltage $V_{cc}$ and the reference voltage $V_{TT}$ and generating the high potential internal power source voltage $V_{cc2}$ ($<V_{cc}$) a power source circuit P4 for receiving the supply of the power source voltage $V_{ss}$ and the reference voltage $V_{TT}$ and generating the low potential internal power source voltage $V_{ss2}$ ($>V_{ss}$), CMOS transistors (P channel transistor $Q_5$ and N channel transistor $Q_6$) interposed between the output lines of the power source circuits P3, P4 (between the internal power source voltages $V_{cc2}$, $V_{ss2}$), and CMOS transistors (N channel transistor $Q_7$ and P channel transistor $Q_8$) responsive to the output of the transistors (the signal at a node N3) and connected between the power source lines $V_{cc}$, $V_{ss}$. The output voltage $V_{OUT}$ is taken out from the CMOS gate ($Q_7$, $Q_8$) of the final stage.

The characterizing feature of this embodiment resides in the opposite connection state of the CMOS gate of the final stage, which is opposite to the normal connection state. In other words, the N channel transistor $Q_7$ is connected to the high potential ($V_{cc}$) side and the P channel transistor $Q_8$ is connected to the low potential ($V_{ss}$) side.

According to this circuit construction, the source potential of the transistor $Q_7$, that is, the output voltage $V_{OUT}$, is determined by a voltage value which is lower by the threshold voltage of the transistor $Q_7$ than the output voltage (the signal of the node N3) of the pre-stage CMOS gate ($Q_5$, $Q_6$). Accordingly, since the current for driving the output flows through the route of $V_{cc} \rightarrow Q_7 \rightarrow$ OUT, the problem with the first embodiment (FIG. 63) described above can be avoided.

Figure 67:
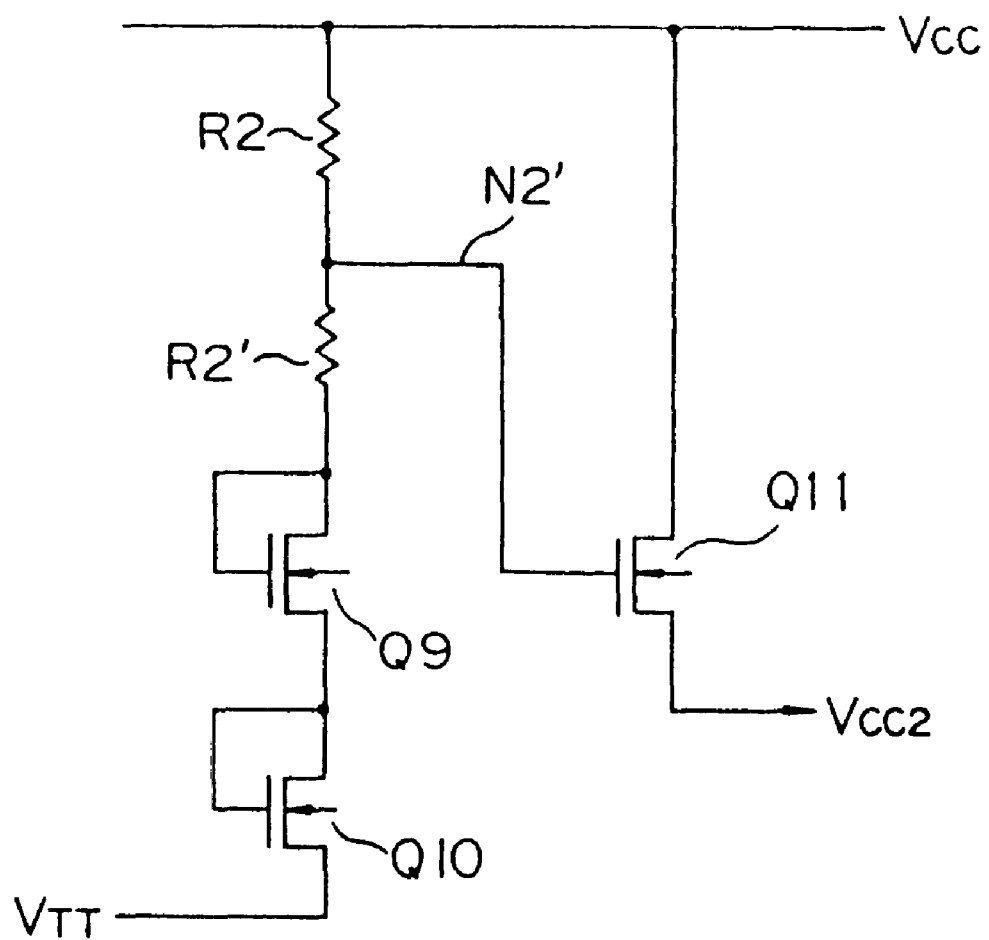
FIG. 67 is a circuit diagram illustrating the constitution of a power source circuit in FIG. 66.

FIG. 67 shows a structural example of the power source circuit.

The power source circuit shown in this circuit diagram includes resistors R2, R2' as well as N channel transistors $Q_9$, $Q_{10}$ (the gates of which are connected to the corresponding drains, respectively) that are interposed in series between the power source line $V_{cc}$ and the reference voltage line $V_{TT}$, and an N channel transistor $Q_{11}$ the gate of which is connected to the junction (node N2') between the resistors R2 and R2'. The high potential internal power source voltage $V_{cc2}$ is taken out from the source of this transistor $Q_{11}$.

The example shown in FIG. 67 represents the structure of the power source circuit P3 on the high potential side in the same way as in the case of FIG. 64, but it will be obvious to those skilled in the art that the circuit can also be applied to the power source circuit P4 on the low potential side by replacing the corresponding power source lines $V_{cc}$, $V_{cc2}$ by $V_{ss}$ and $V_{ss2}$, respectively.

Figure 68:
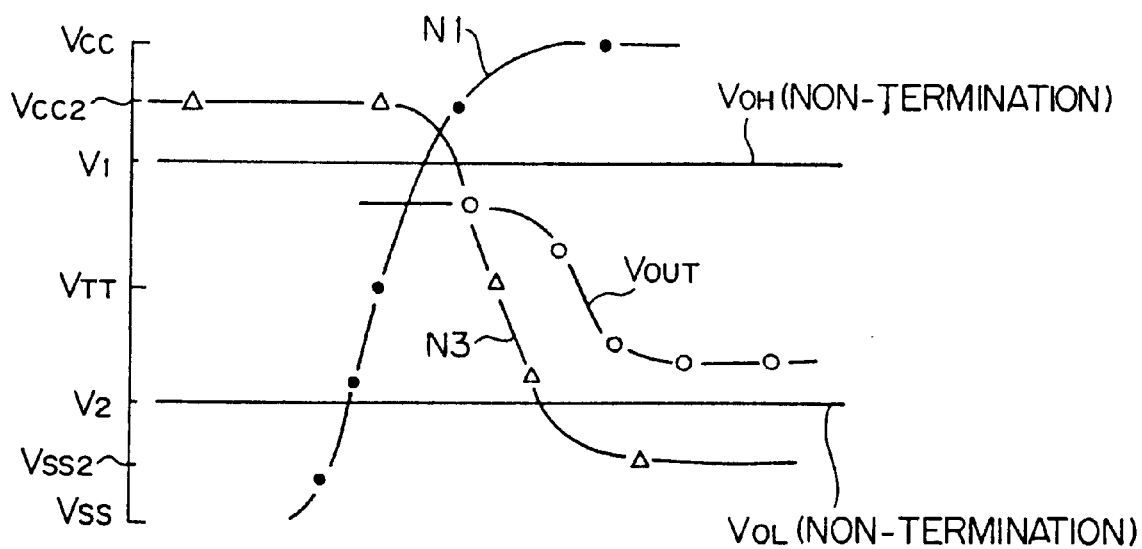
FIG. 68 is a diagram of operation waveforms of the circuit of FIG. 66.

For reference, FIG. 68 shows the operation waveform of the circuit shown in FIG. 66.

Figure 69:
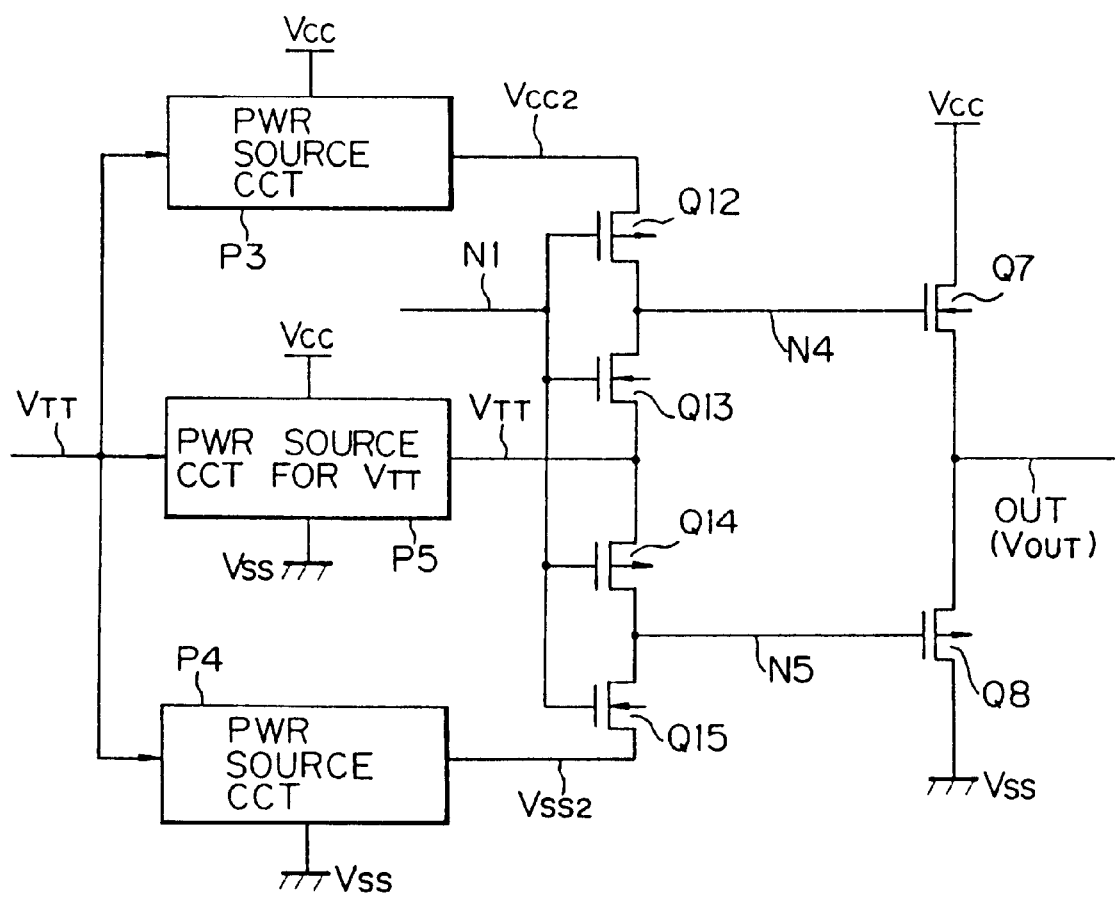
FIG. 69 is a circuit diagram illustrating the constitution of a third embodiment.

FIG. 69 shows the principal portions of the semiconductor integrated circuit according to the third embodiment of the present invention, that is, the structure of the output circuit.

In the second embodiment described above (FIG. 66), the output (the signal at the node N3) of the CMOS gate ($Q_5$, $Q_6$) has its amplitude between the voltage levels $V_{cc2}$ and $V_{ss2}$ (refer to FIG. 68). However, when the operation of the CMOS gate (transistors $Q_7$, $Q_8$) of the final stage is taken into consideration, the N channel transistor $Q_7$ can be sufficiently cut off even when the potential at the node N3 is not lowered to the level of $V_{ss2}$, and the P channel transistor $Q_8$ can be sufficiently cut off even when the potential at the node N3 is not increased to the level of $V_{cc2}$. Accordingly, in order to obtain a higher operation speed, the amplitude of the gate potentials of the output transistors $Q_7$, $Q_8$ is preferably as small as possible. Therefore, this third embodiment solves this problem.

In other words, the characterizing feature of this embodiment resides in that the gate voltages of the output transistors $Q_7$, $Q_8$ are separately supplied. As to the CMOS circuit portion of the pre-stage, therefore, two sets of CMOS gates (P channel transistor $Q_{12}$ and N channel transistor $Q_{13}$, and P channel transistor $Q_{14}$ and N channel transistor $Q_{15}$) are disposed, and further, a reference voltage power source circuit P5 is disposed so as to supply the reference voltage $V_{TT}$ to the sources of the transistors $Q_{13}$ and $Q_{14}$.

Figure 70:
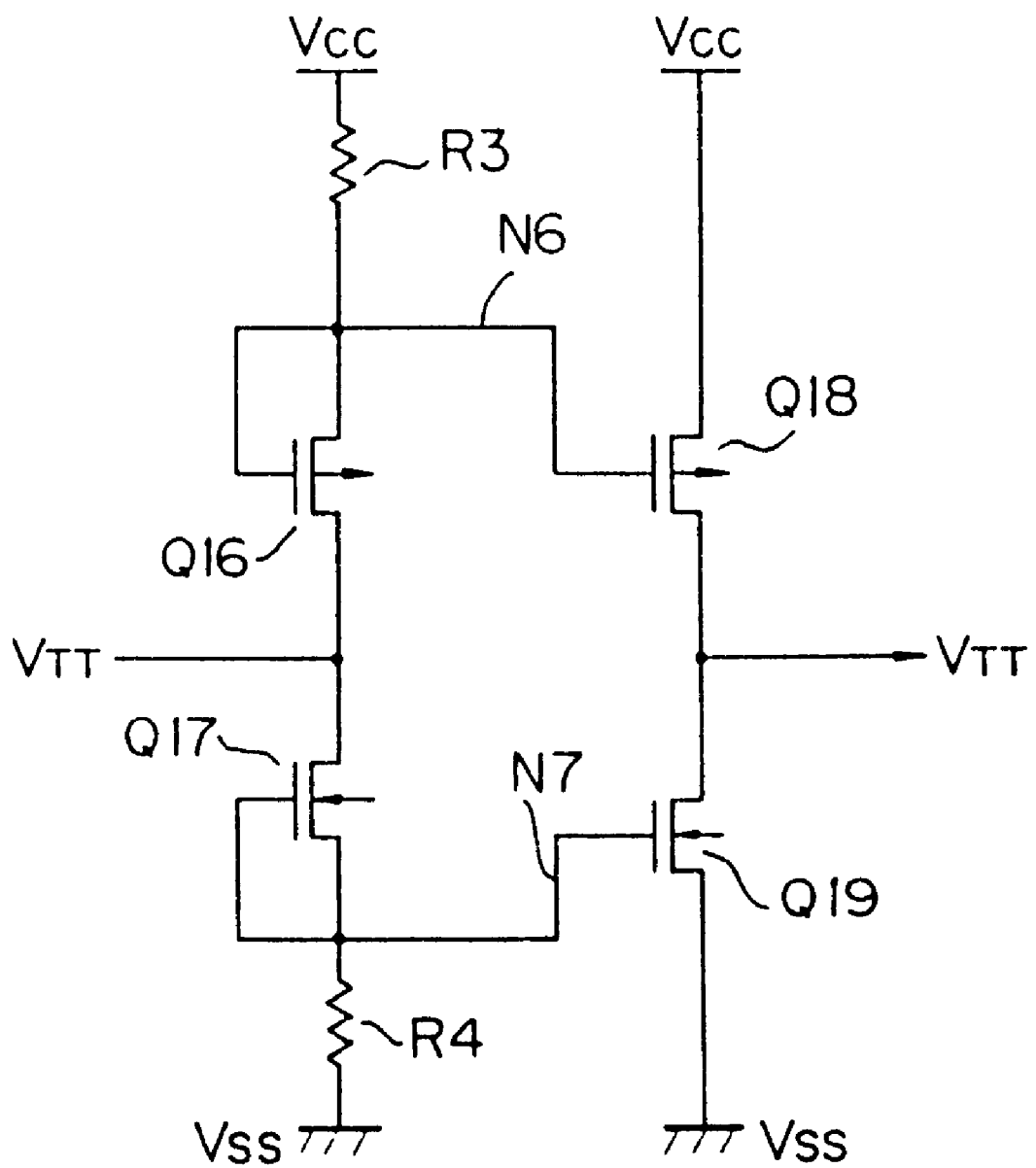
FIG. 70 is a circuit diagram illustrating the constitution of a power source circuit for a reference voltage in FIG. 69.

FIG. 70 shows a structural example of the reference voltage power source circuit P5.

The reference voltage power source circuit shown in this circuit diagram includes a resistor R3, a P channel transistor $Q_{16}$ (the gate of which is connected to the source), an N channel transistor $Q_{17}$ (the gage of which is connected to the source) and a resistor R4, which are connected in series between the power source lines $V_{cc}$ and $V_{ss}$, a P channel transistor $Q_{18}$ the gate of which is connected to the source of the transistor $Q_{16}$ (to the node N6) and the source of which is connected to the power source line $V_{cc}$, and an N channel transistor $Q_{19}$ the gate of which is connected to the source of the transistor $Q_{17}$ (to the node N7) and the source of which is connected to the power source line $V_{ss}$. The reference voltage $V_{TT}$ is applied to the drain of each of the transistors $Q_{16}$ and $Q_{17}$, and the reference voltage $V_{TT}$ is taken out from the drain of each of the transistors $Q_{18}$ and $Q_{19}$.

Figure 71:
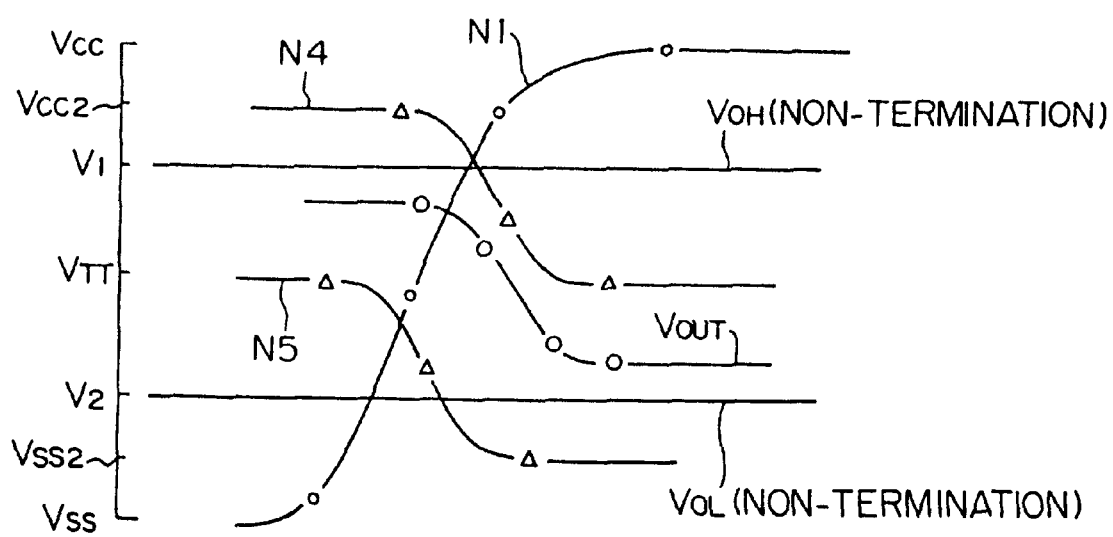
FIG. 71 is a diagram of operation waveforms of the circuit of FIG. 69.

For reference, FIG. 71 shows the operation waveform of the circuit shown in FIG. 69.

Figure 72:
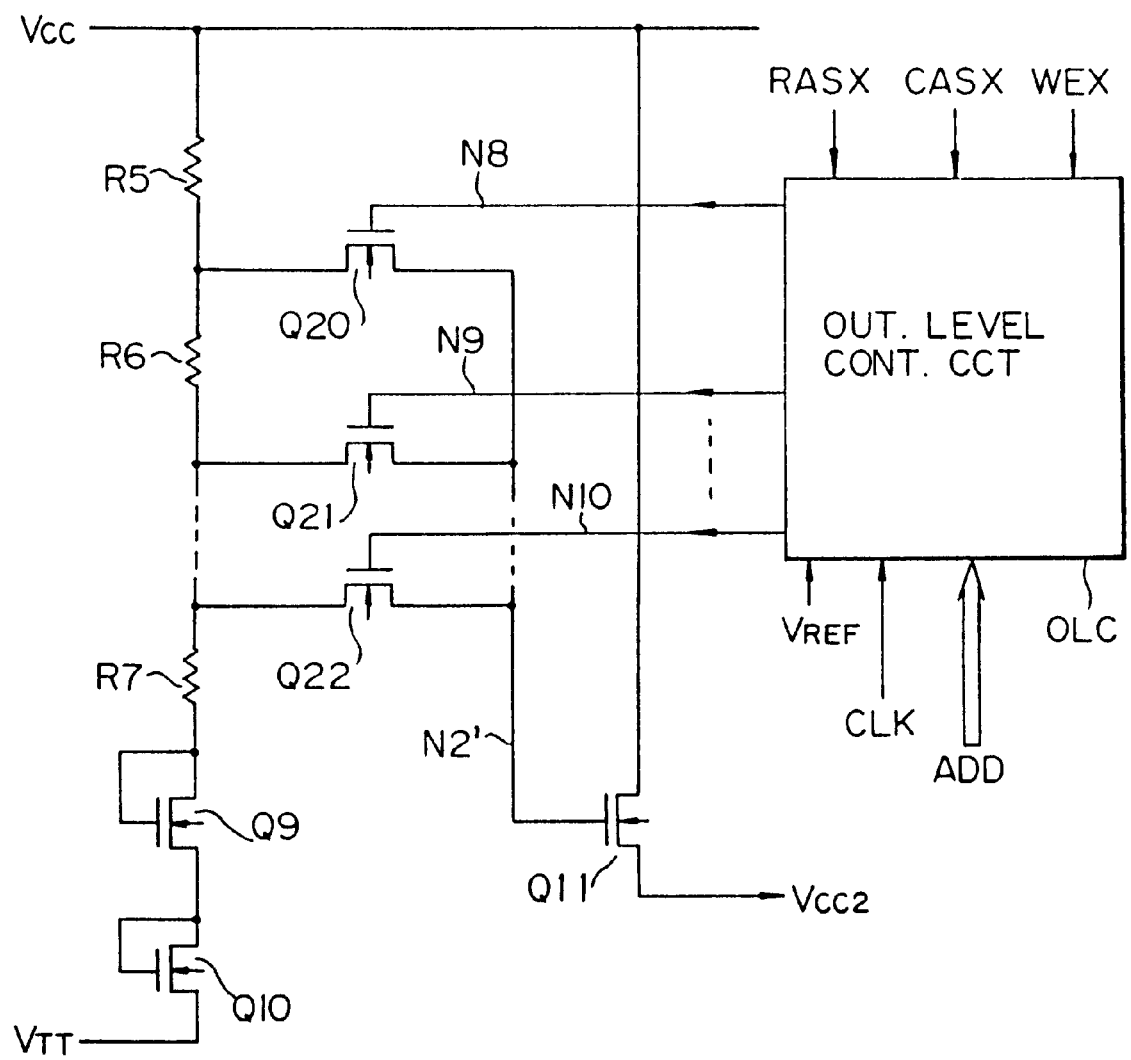
FIG. 72 is a circuit diagram illustrating the constitution of a fourth embodiment.

FIG. 72 shows the principal portions of the semiconductor integrated circuit according to the fourth embodiment of the present invention, that is, the structure of the power source circuit.

In each of the foregoing embodiments, the explanation has been made on the assumption that the terminal resistance is always constant (for example, 50Ω), but the terminal voltage is not always constant. When it is desired to eliminate a D.C. current, there is the case where the terminal resistor does not exist. In such a case, the potentials of the internal power source voltages $V_{cc2}$, $V_{ss2}$ in the second embodiment, for example, fluctuate irrespective of the existence of the terminal resistor. This fourth embodiment improves this problem.

In other words, as shown in FIG. 72, the characterizing feature of this embodiment resides in that the voltage level of the internal power source voltage $V_{cc2}$ can be controlled on the basis of information that can be set arbitrarily from outside. A plurality of resistors (only three resistors R5 to R7 are shown for simplification in the drawing) are disposed in place of the resistors R2 and R2' in FIG. 67, and a plurality of N channel transistors $Q_{20}$ to $Q_{22}$ are connected between the junctions of the resistors and the gate of the transistor $Q_{11}$, respectively. Furthermore, there is disposed an output level control circuit OLC which selectively turns ON and OFF each of the transistors $Q_{20}$ to $Q_{22}$ on the basis of control information from outside (such as a row address strode signal RASX, a column address strobe signal CASX, a write enable signal WEX, a reference voltage $V_{REF}$ (which may be generated inside the circuit), a clock signal CLK, an address signal ADD, ETC).

Figure 73:
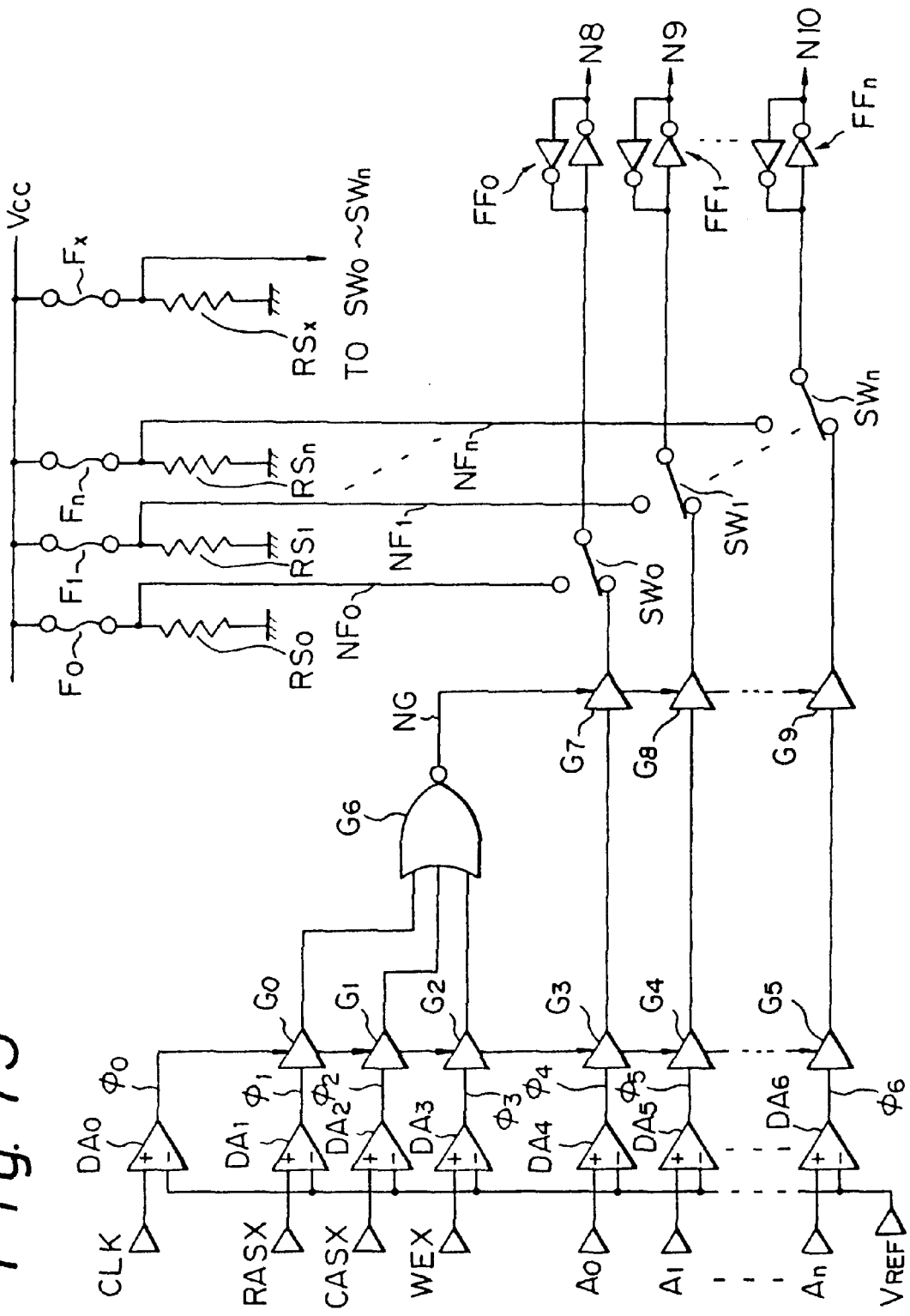
FIG. 73 is a circuit diagram illustrating the constitution of an output level control circuit in FIG. 72.

FIG. 73 shows a structural example of this output level control circuit OLC and FIG. 74 shows its operation waveform.

The example shown in FIG. 74 represents the operation waveform when data (D) is written from outside, and assumes the case of a synchronous DRAM.

The synchronous DRAM operates in synchronism with the rise edge of the clock signal CLK. When all of the row address strobe signal RASX, the column address strobe signal CASX and the write enable signal WEX are set to the L level at the point of the clock 0 immediately after making of the power source, the operation mode is a mode of setting the output condition, and setting is made at this time by applying the address signal ADD to each address input terminal. When the output condition is set, this DRAM basically operates in the same way as ordinary DRAMs with the exception that it is in synchronism with the clock signal, and column selection and write/readout are executed.

The circuit shown in FIG. 73 accomplishes this circuit operation. In the drawing, symbols $DA_0$ to $DA_6$ denote differential amplifiers, which detect whether or not each input signal CLK, RASX, CASX, WEX, $A_0$ to $A_n$ is higher or lower than the reference voltage $V_{REF}$ (=1.5V). The output of the differential amplifier $DA_0$ is inputted to each gate $G_0$ to $G_6$ and latches each output $\phi_1$ to $\phi_6$ of each differential amplifier $DA_1$ to $DA_6$. Next, whether or not the signals $\phi_1$, $\phi_2$ and $\phi_3$ corresponding to RASX, CASX and WEX are all at the L level is detected at the gate $G_6$, and its output NG opens the gates $G_7$ to $G_9$. Accordingly, the data $A_0$ to $A_n$ at the address input terminals are latched by the corresponding flip-flops $FF_0$ to $FF_7$ through switches $SW_0$ to $SW_n$, respectively. The data thus latched are outputted to the nodes N8 to N10, and are supplied to the gates of the transistors $Q_{20}$ to $Q_{22}$ (see FIG. 72).

On the other hand, the synchronous DRAM prepares the function of fixed storage by fuses, separately from the circuit operation described above. For this purpose, there are disposed fuses $F_0$ to $F_n$, and data to be sent to the nodes N8 to N10 are stored in these fuses $F_0$ to $F_n$. The data for switching each switch $SW_0$ to $SW_n$ to the fuse side is stored in the fuse $F_x$. By the way, each of the fuses $F_0$ to $F_n$ and $F_x$ can be cut off arbitrarily by irradiating thereto ultraviolet rays from outside.

As described above, according to the circuit construction shown in FIG. 73, it is possible to arbitrarily set the output condition from outside and to store it fixedly by the use of the fuses.

Accordingly, this fourth embodiment (see FIGS. 72 to 74) can select an optimum value for the internal power source voltage $V_{cc2}$, $V_{ss2}$ in accordance with the existence of the terminal resistor or the fluctuation of the terminal resistor.

In the fourth embodiment given above, the construction of the power source circuit has been explained in such a manner as to correspond to the second embodiment (see FIGS. 66 and 67). However, it will be obvious to those skilled in the art that the power source circuit used in the fourth embodiment can similarly be applied to the first embodiment (see FIGS. 63 and 64).

Although the present invention has been disclosed and described by way of several embodiments, it is apparent to those skilled in the art that other embodiments and modifications of the present invention are possible without departing from the spirit or essential features thereof.

What is claimed is:

1. An output circuit comprising:

a first PMOS transistor and a first NMOS transistor connected in series between a high potential side power source and a low potential side power source;

a second PMOS transistor and a second NMOS transistor connected in series between said high-potential side power source and said low potential side power source;

an output terminal connected to a junction between said first PMOS and first NMOS transistors, and to a junction between said second PMOS and second NMOS transistors, for outputting an output signal;

a first logic circuit for switching ON both of said first PMOS and second PMOS transistors, or both of said first NMOS and second NMOS transistors in response to a logic level of said output signal;

a second logic circuit for switching OFF said first PMOS and second PMOS transistors in response to a mode control signal; and a third logic circuit for detecting a logic state of said output signal and outputting a feedback signal, wherein said first logic circuit switches OFF one of said first PMOS and second PMOS transistors, or one of said first NMOS and second NMOS transistors in response to the feedback signal.

2. An output circuit according to claim 1, wherein:

said first NMOS and second NMOS transistors are switched ON when the output signal is at a low level and when the mode control signal is active, and one of said first PMOS and second PMOS transistors is belatedly switched OFF when the output signal is at a high level and when the mode control signal is active; and said output circuit includes a fourth logic circuit for switching OFF the other of said first PMOS and second PMOS transistors in response to the mode control signal.

3. An output circuit according to claim 1, wherein the ON resistance of the transistor among said first PMOS and second PMOS transistors which does not respond to the feedback signal, is higher than the ON resistance of the transistor which responds to the feedback signal.

4. An output circuit according to claim 1, further comprising:

a fifth logic circuit for controlling a turn-off time of the transistor among said first NMOS and second NMOS transistors, which does not respond to the feedback signal, to be longer than the turn-off time of the transistor which does respond.

* * * * *

UNITED STATES PATENT AND TRADEMARK OFFICE
CERTIFICATE OF CORRECTION

| | | |
|---|---|---|
| PATENT NO. | : 6,707,325 B2 | Page 1 of 1 |
| APPLICATION NO. | : 10/278080 | |
| DATED | : March 16, 2004 | |
| INVENTOR(S) | : Taguchi | |

It is certified that error appears in the above-identified patent and that said Letters Patent is hereby corrected as shown below:

Title Page,

Item (57), Inventors, delete the following inventors:

--Satoshi Eto, Kawasaki (JP); Yoshihiro Takemae, Kawasaki (JP); Hiroshi Yoshioka, Kawasaki (JP); Makoto Koga, Kawasaki (JP)--.

Item (56), References Cited, add the following reference to the listing under U.S. PATENT DOCUMENTS:

--4,625,129    11/1986    Ueno--.

Add the following references to the listing under FOREIGN PATENT DOCUMENTS:

--Patent Abstracts of Japan, vol. 015, No. 343; JP 04223617
Patent Abstracts of Japan, vol. 015, No. 343; JP 03132112--.

Signed and Sealed this

Eighteenth Day of September, 2007

JON W. DUDAS
*Director of the United States Patent and Trademark Office*